US012628332B2

(12) United States Patent
Okajima et al.

(10) Patent No.: US 12,628,332 B2
(45) Date of Patent: May 12, 2026

(54) MEMORY DEVICE AND METHOD OF MANUFACTURING MEMORY DEVICE

(71) Applicant: Kioxia Corporation, Tokyo (JP)

(72) Inventors: Mutsumi Okajima, Yokkaichi Mie (JP); Tsuneo Inaba, Kamakura Kanagawa (JP); Hiromitsu Mashita, Tokyo (JP)

(73) Assignee: Kioxia Corporation, Tokyo (JP)

( * ) Notice: Subject to any disclaimer, the term of this patent is extended or adjusted under 35 U.S.C. 154(b) by 957 days.

(21) Appl. No.: 17/824,780

(22) Filed: May 25, 2022

(65) Prior Publication Data

US 2022/0285350 A1 Sep. 8, 2022

Related U.S. Application Data

(63) Continuation of application No. PCT/JP2020/007831, filed on Feb. 26, 2020.

(30) Foreign Application Priority Data

Nov. 26, 2019 (WO) .................. PCT/JP2019/046242

(51) Int. Cl.
*H10B 12/00* (2023.01)
*H10D 30/67* (2025.01)
*H10D 99/00* (2025.01)

(52) U.S. Cl.
CPC ........... *H10B 12/33* (2023.02); *H10B 12/036* (2023.02); *H10B 12/05* (2023.02);
(Continued)

(58) Field of Classification Search
CPC ..................................................... H10B 12/33
See application file for complete search history.

(56) References Cited

U.S. PATENT DOCUMENTS 9,698,272 B1 7/2017 Ikeda et al.
10,014,345 B1 * 7/2018 Sugioka ................. H10N 50/80
(Continued)

FOREIGN PATENT DOCUMENTS

JP 2015-111663 A 6/2015
JP 2017-168623 A 9/2017
(Continued)

OTHER PUBLICATIONS

A. Veloso et al., "Vertical Nanowire FET Integration and Device Aspects", ECS Transactions 72 (4) 31-42, 2016 (11 pages).
(Continued)

*Primary Examiner* — Ajay Ojha
*Assistant Examiner* — Hajar Kolahdouzan
(74) *Attorney, Agent, or Firm* — Foley & Lardner LLP

(57) ABSTRACT

According to one embodiment, a memory includes: a first transistor including: a first semiconductor between the substrate and the bit line; and a first gate facing a side of the first semiconductor; a first memory element between the first transistor and the substrate; a first word line including a first conductor coupled to the first gate; a second transistor including: a second semiconductor between the substrate and the bit line; and a second gate facing a side of the second semiconductor; a second memory element between the second transistor and the substrate; and a second word line being adjacent to the first word line in a first direction and including a second conductor coupled to the second gate. The second semiconductor is adjacent to the first semiconductor in a second direction intersecting the first direction.

11 Claims, 78 Drawing Sheets

(52) U.S. Cl.
   CPC ..... *H10D 30/6728* (2025.01); *H10D 30/6755*
                (2025.01); *H10D 99/00* (2025.01)

(56) References Cited

U.S. PATENT DOCUMENTS

| | | | | |
|---|---|---|---|---|
| 2015/0287706 A1 | 10/2015 | Sukekawa | | |
| 2017/0103993 A1* | 4/2017 | Lee | ........................ | H10B 43/35 |
| 2019/0296155 A1* | 9/2019 | Sawabe | .................. | H10B 12/31 |
| 2020/0388619 A1* | 12/2020 | Sukekawa | .......... | H01L 21/0217 |

FOREIGN PATENT DOCUMENTS

| | | | |
|---|---|---|---|
| WO | WO-2014/065038 A1 | 5/2014 | |
| WO | WO-2014/084006 A1 | 6/2014 | |

OTHER PUBLICATIONS

Hyunwoo Chung et al., "Novel 4F$^2$ DRAM Cell with Vertical Pillar Transistor (VPT)", Proc. IEEE Eur. Sol. Dev. Res. Conf. (ESSDERC 2011), p. 211-214 (4 pages).
Jae-Man Yoon et al., "A Novel Low Leakage Current VPT (Vertical Pillar Transistor) Integration for 4F2 DRAM Cell Array with sub 40 nm Technology", DRC Tech. Dig., 2006, p. 259 and 260 (2 pages).

* cited by examiner

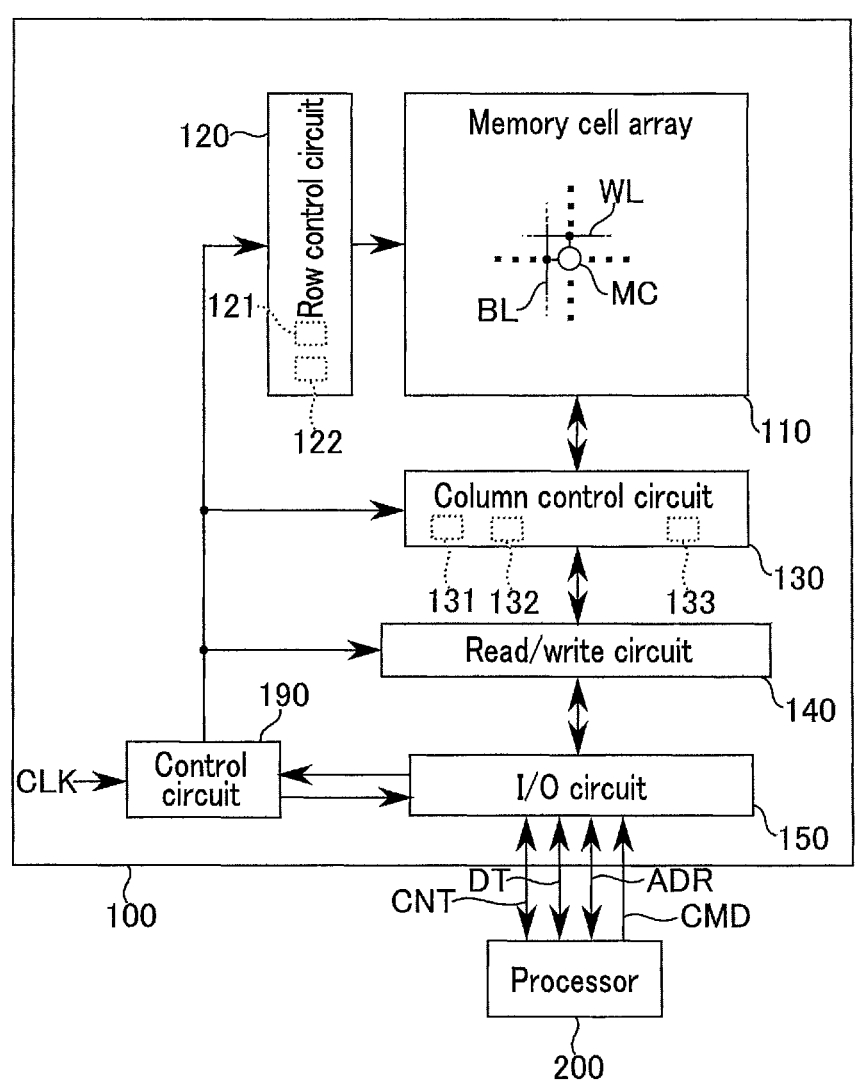
F I G. 1

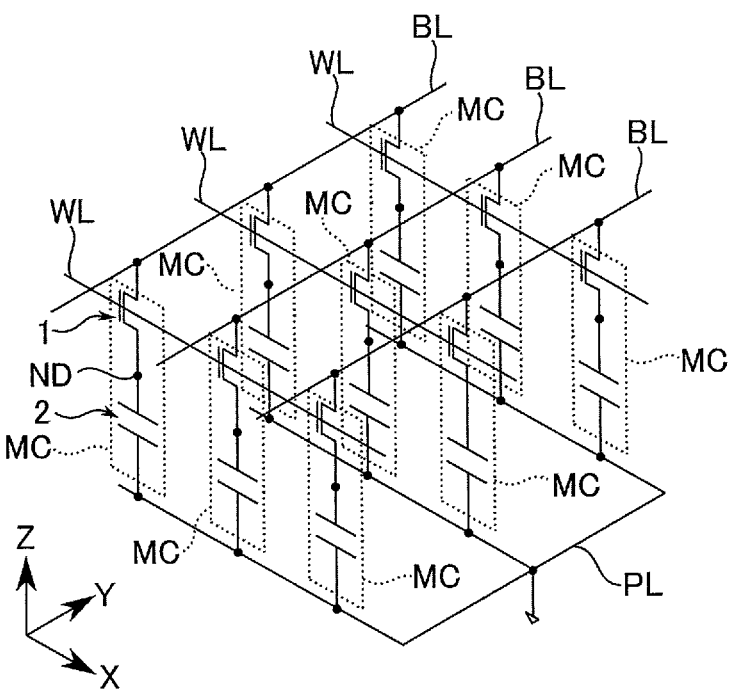
F I G. 2

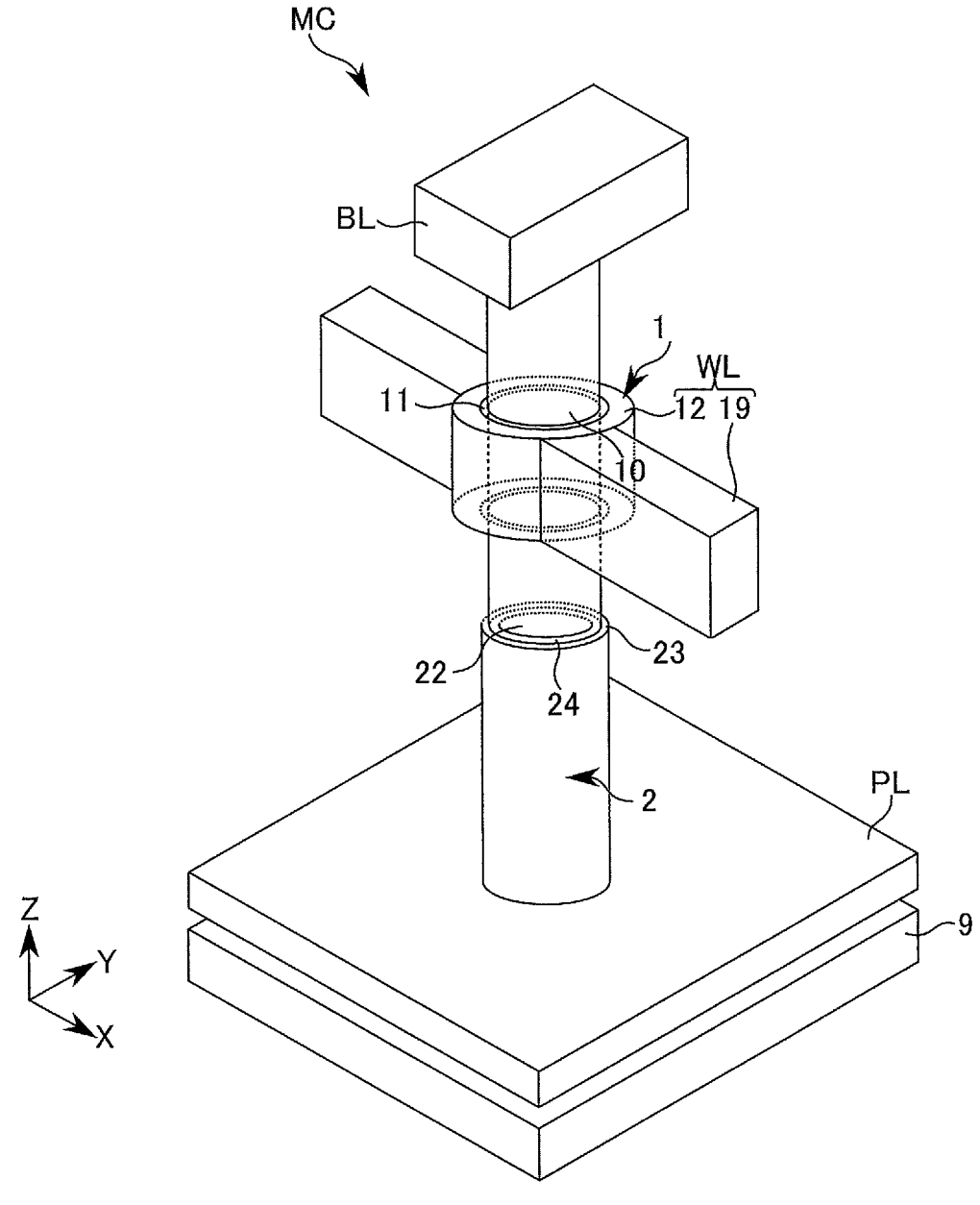
F I G. 3

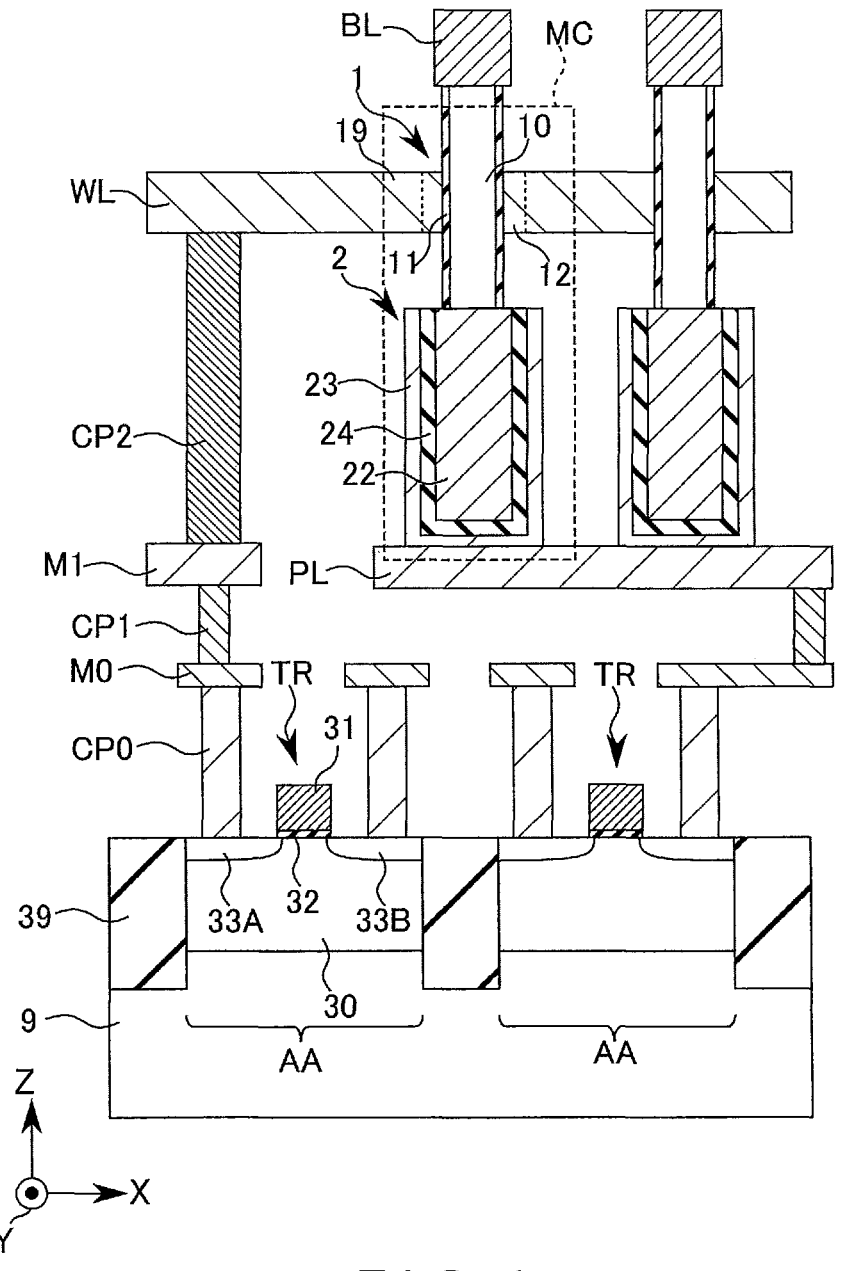
F I G. 4

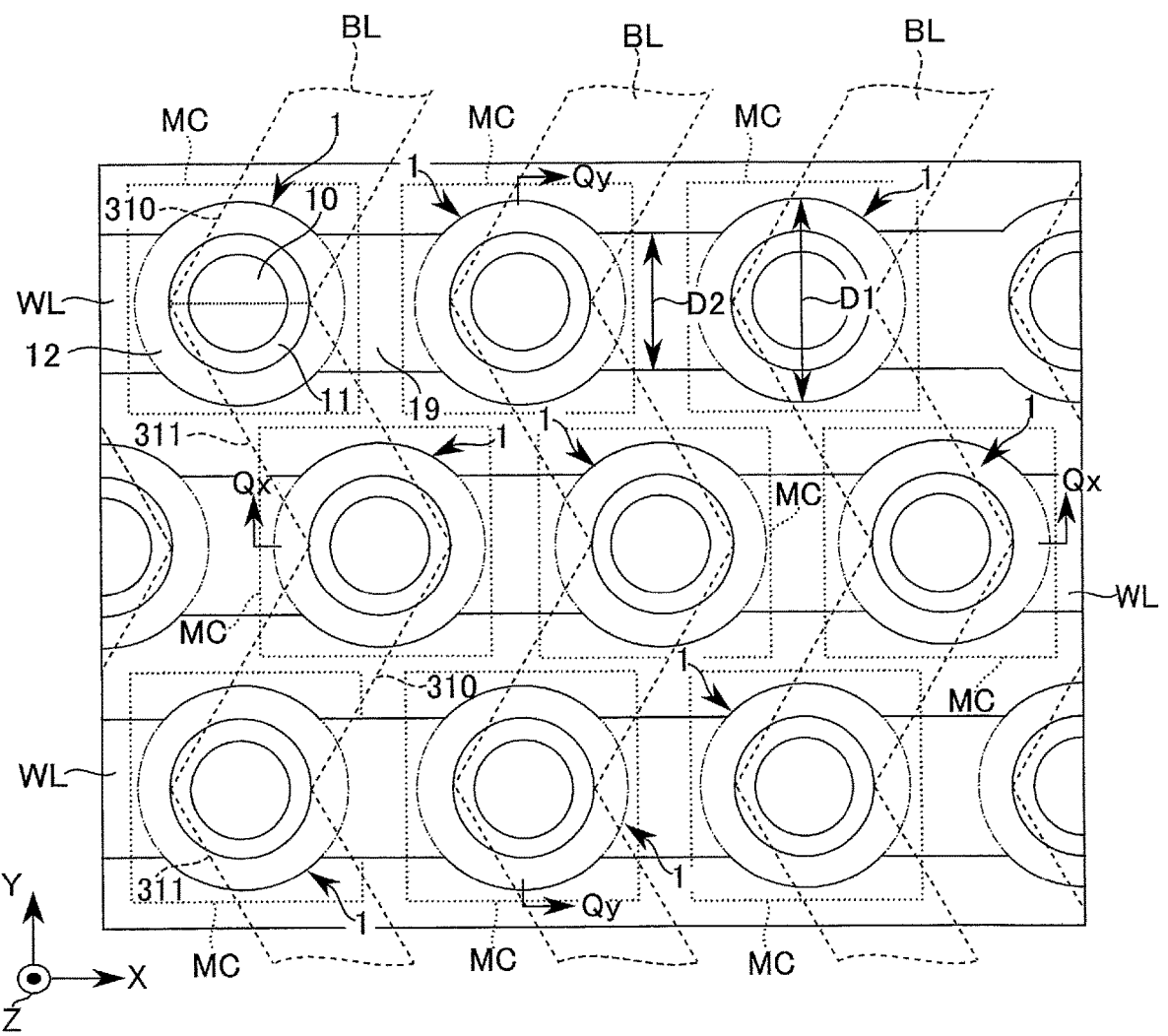
F I G. 5

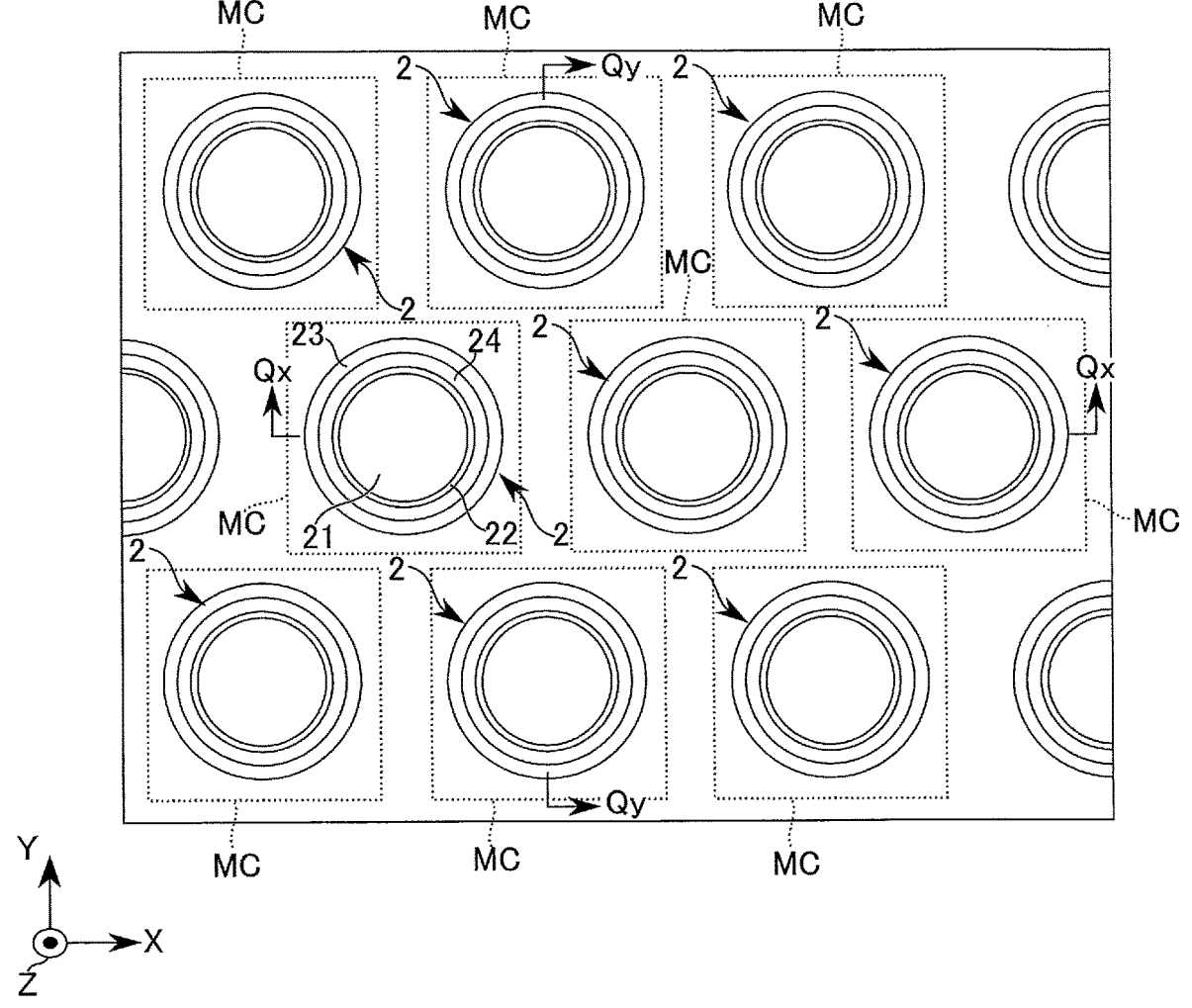
F I G. 6

110
31
(BL)
31
(BL)
31
(BL)
1
19
19
16  16  16
SDb
83
1
11
WL { 12
19
CNL
10
SDa
15
1
82
2
23
24
22
21
81
2
MC
MC
29
80
2  MC
9
Z
X
Y
F I G. 7

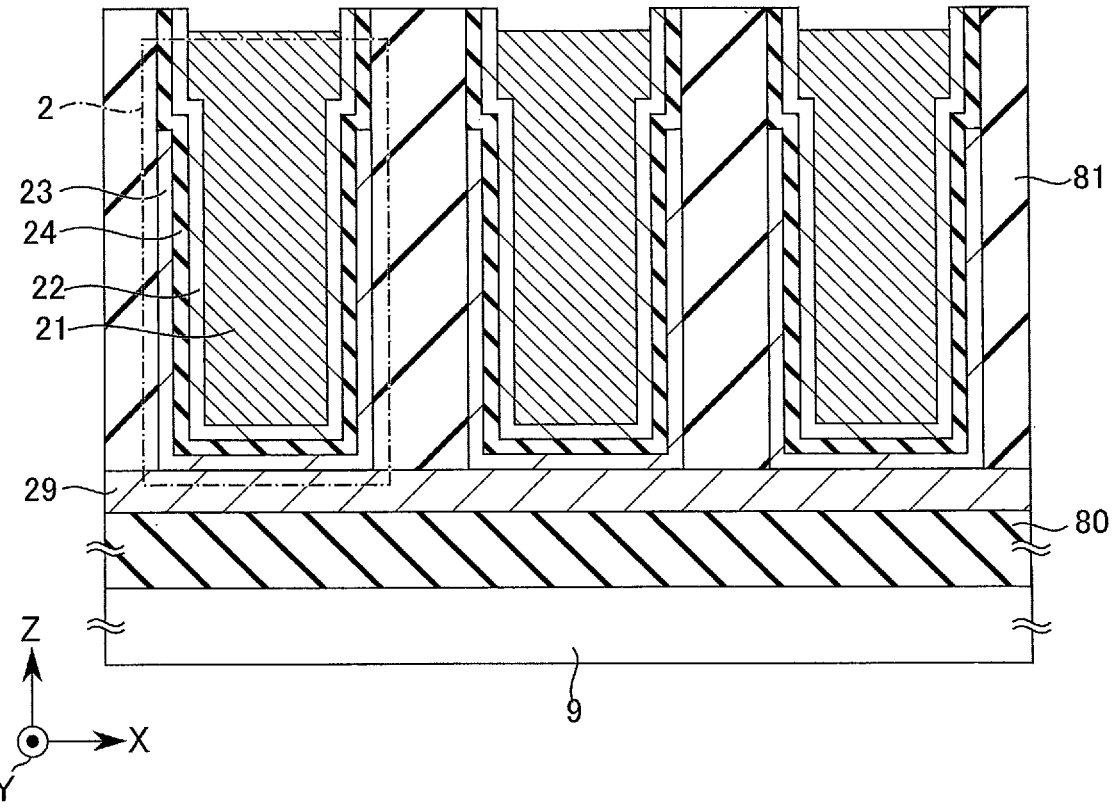
F I G. 9

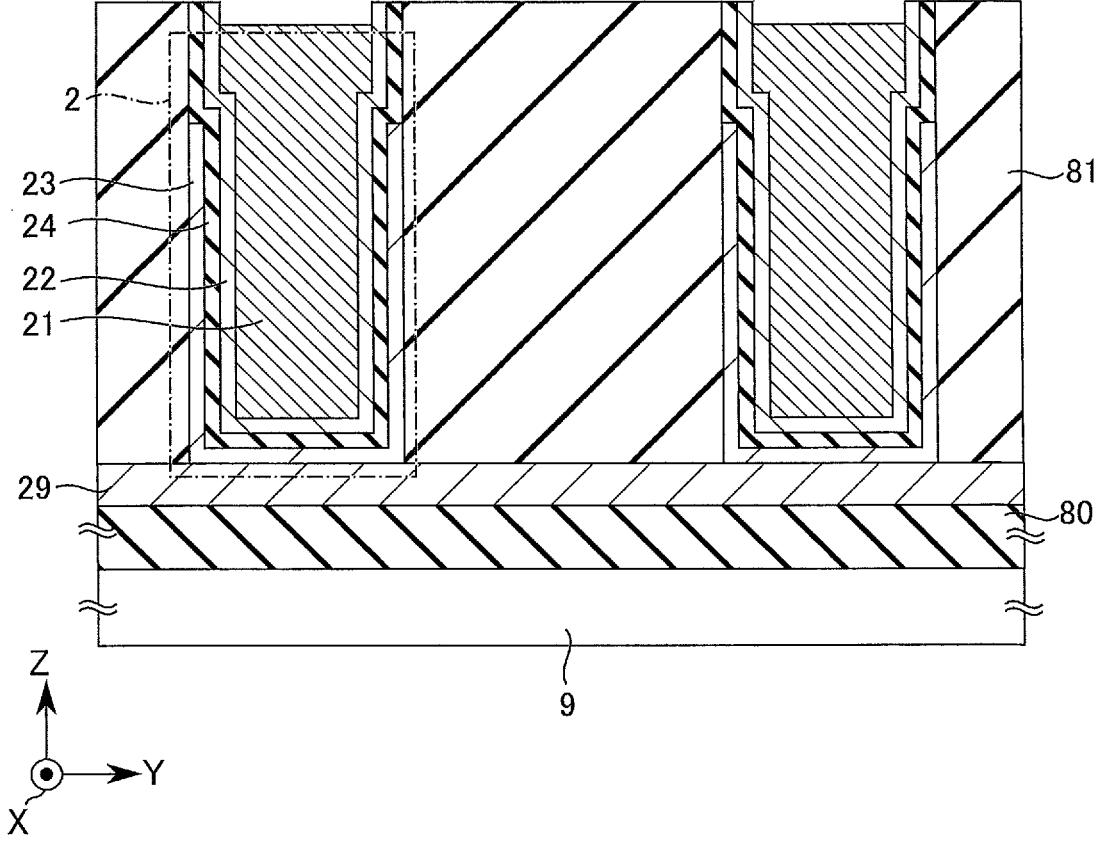
F I G. 10

110
F I G. 11

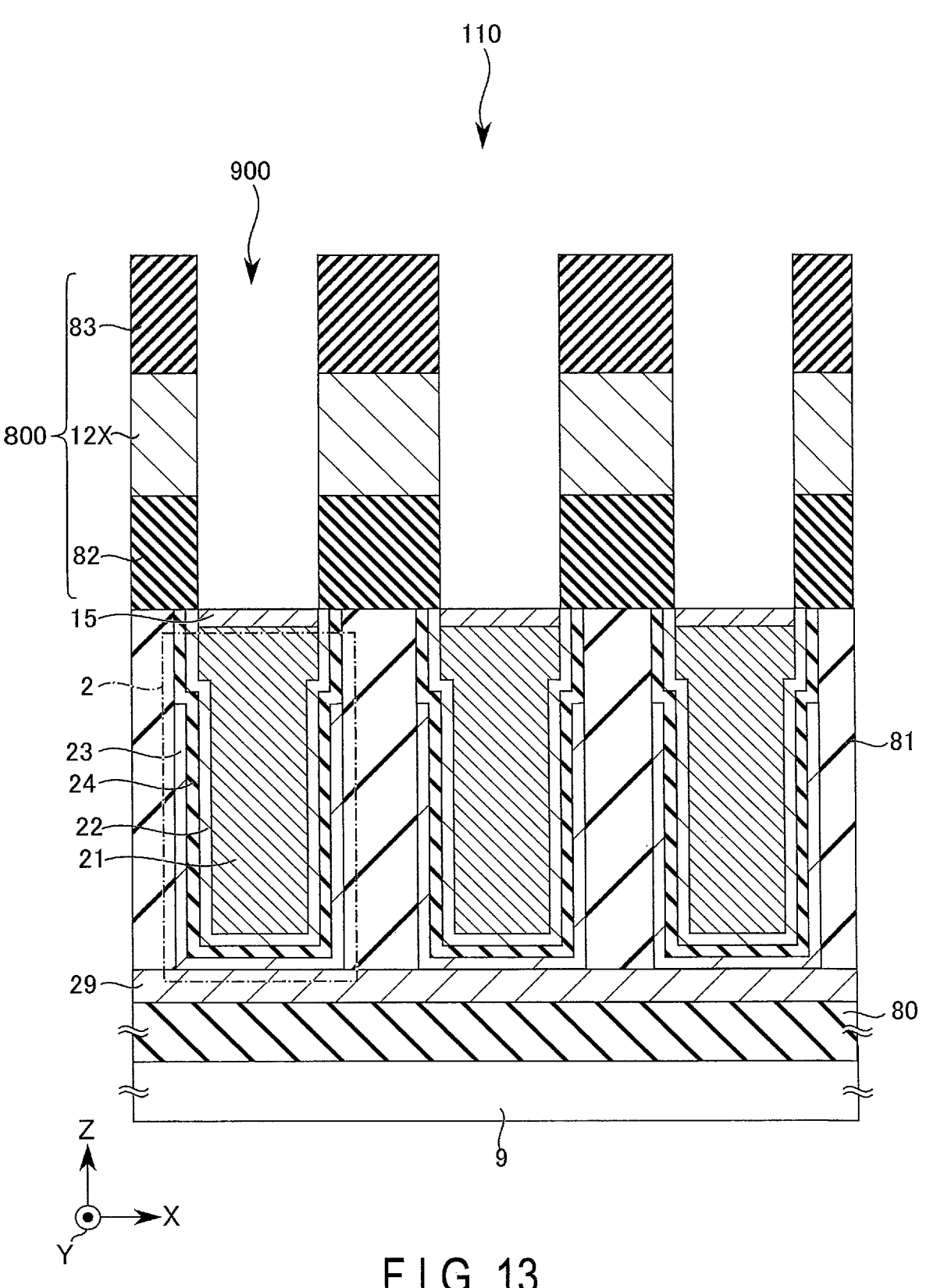
F I G. 13

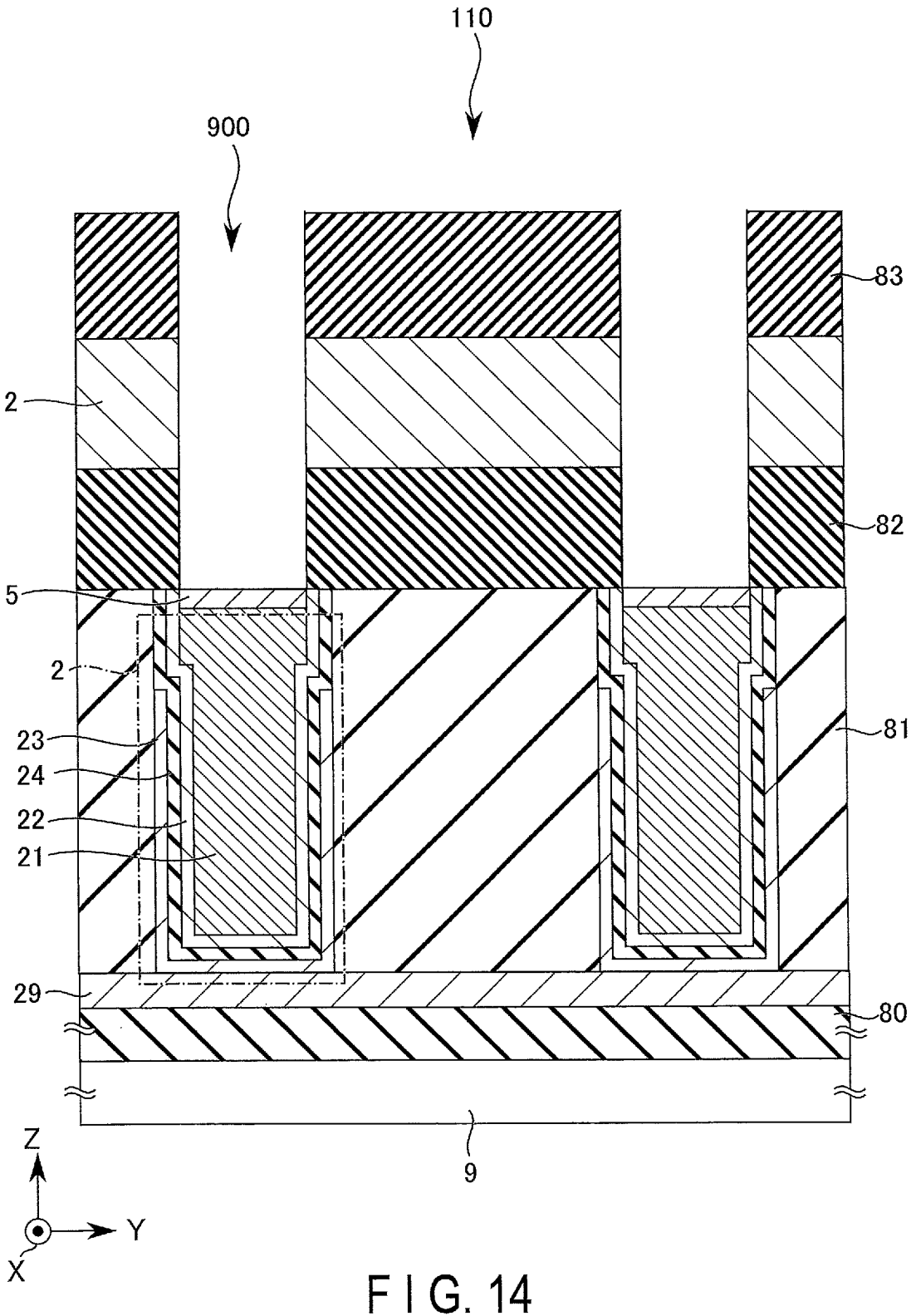
F I G. 14

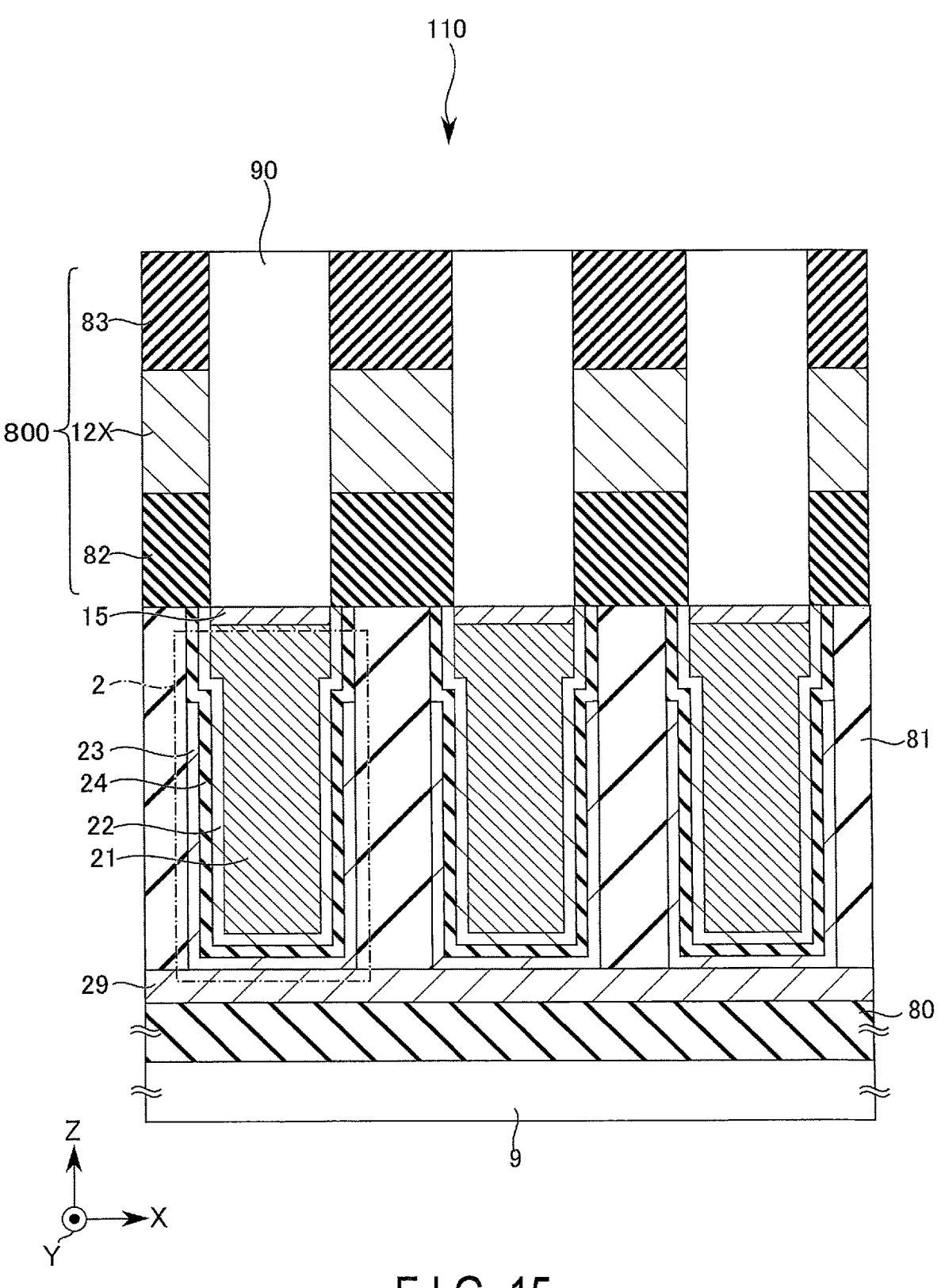
F I G. 15

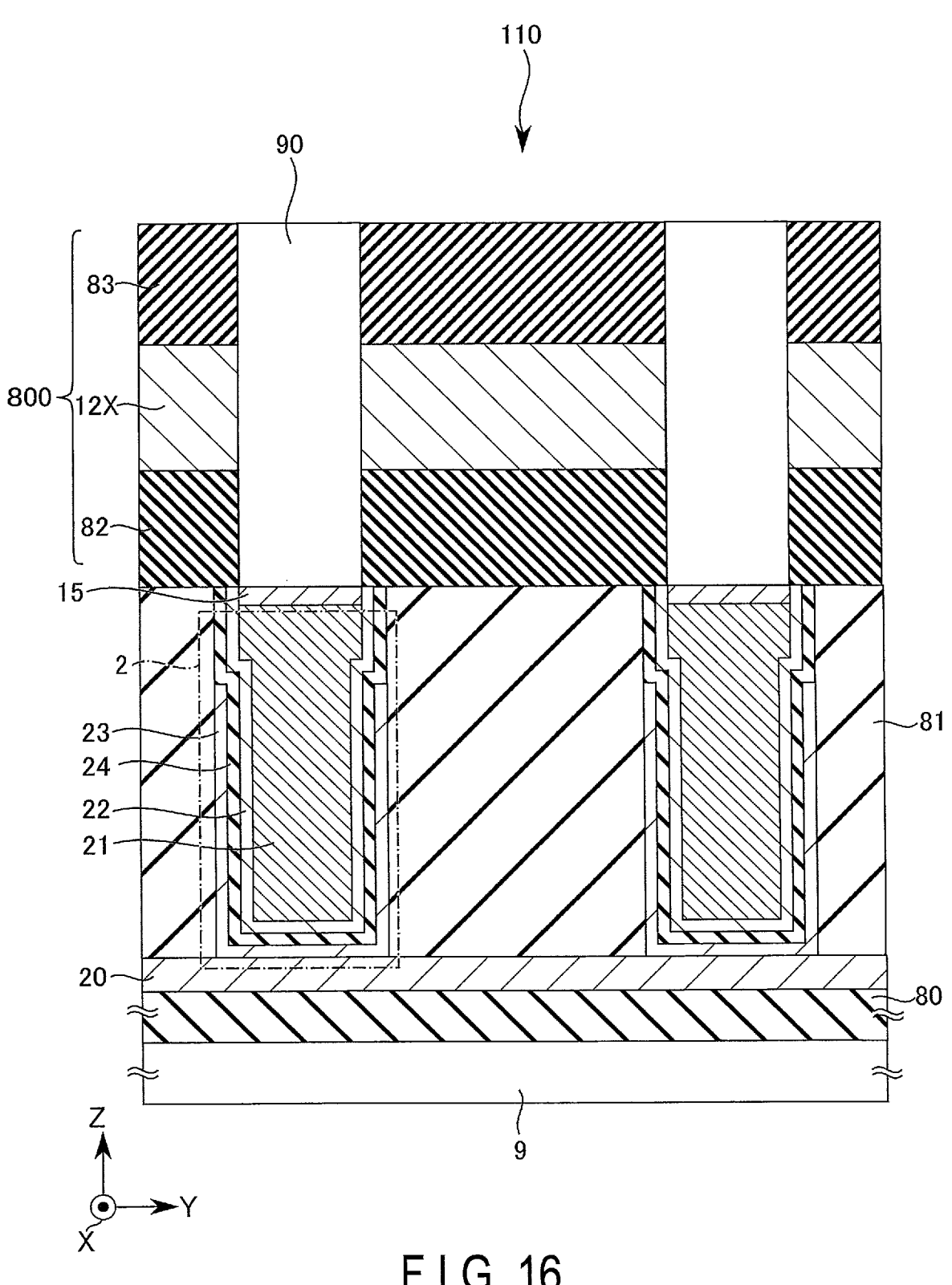
F I G. 16

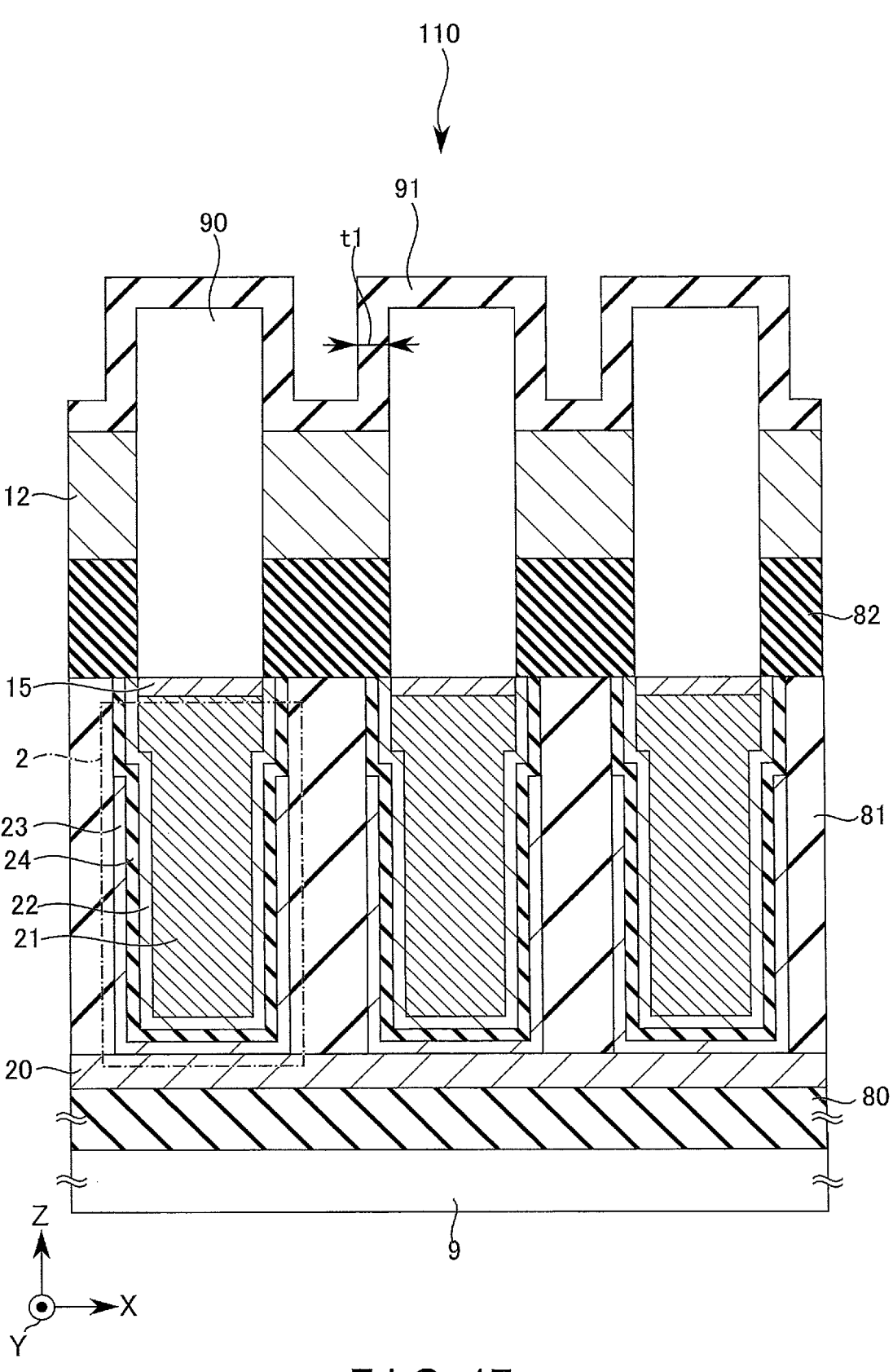
F I G. 17

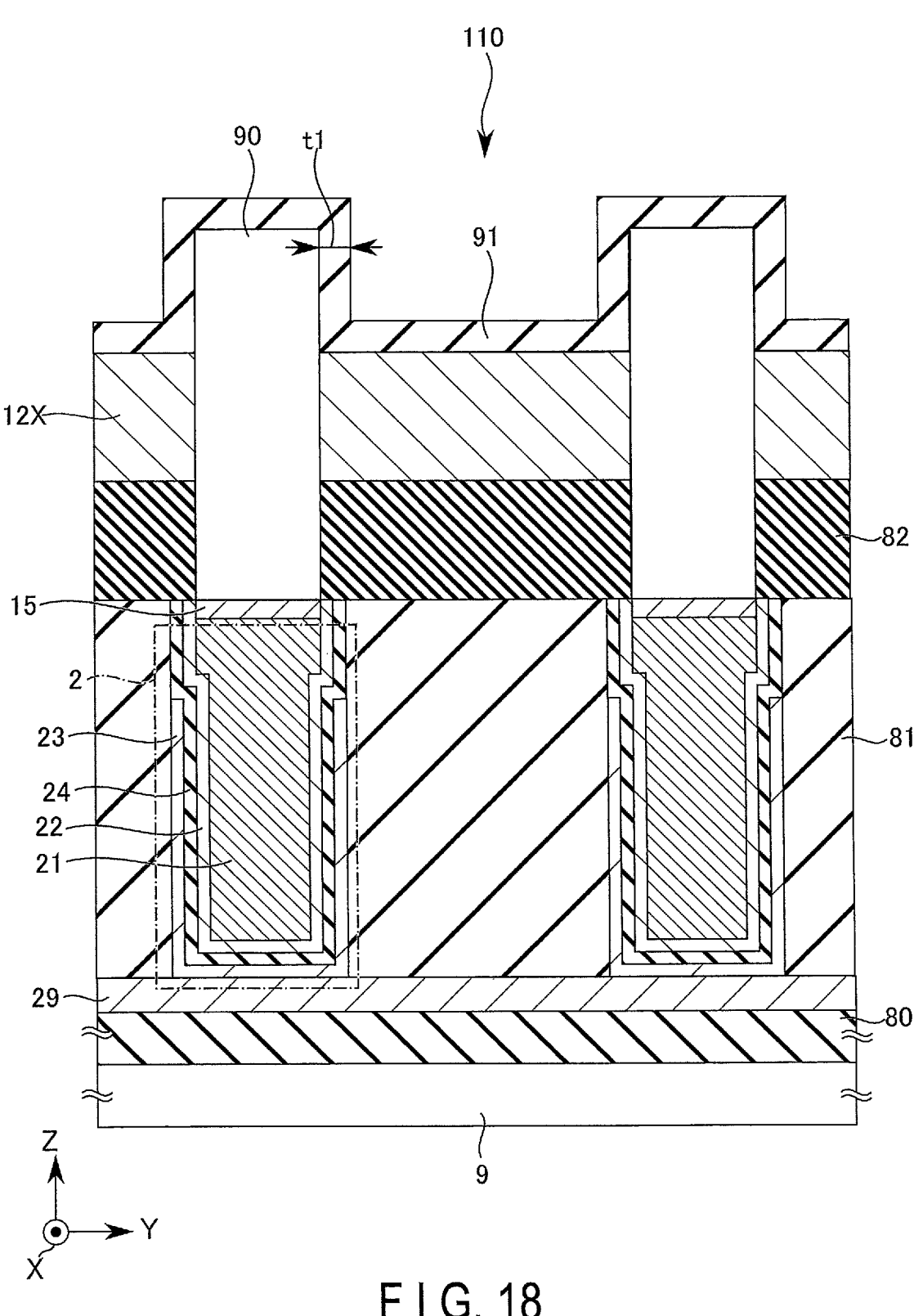
F I G. 18

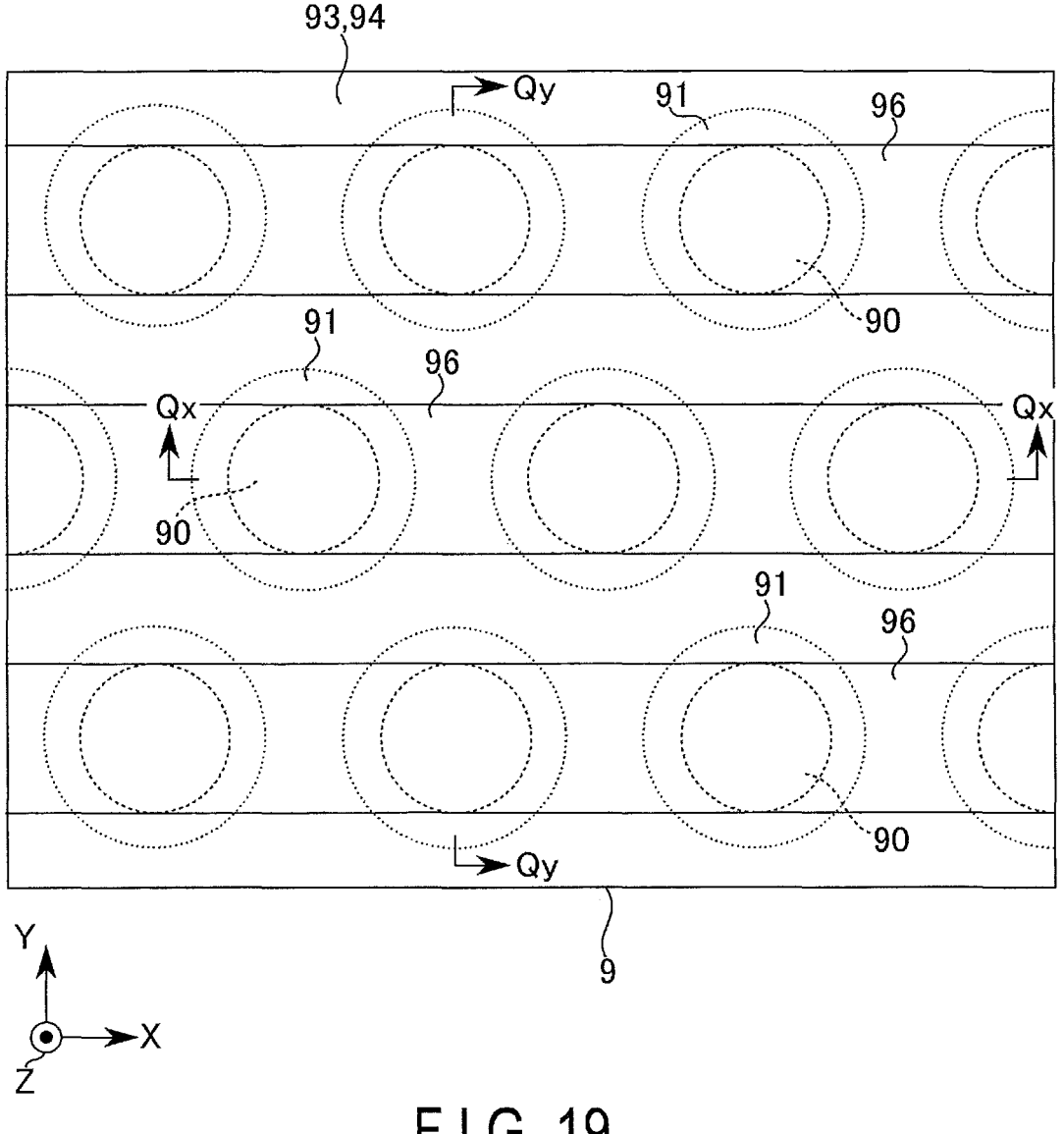
F I G. 19

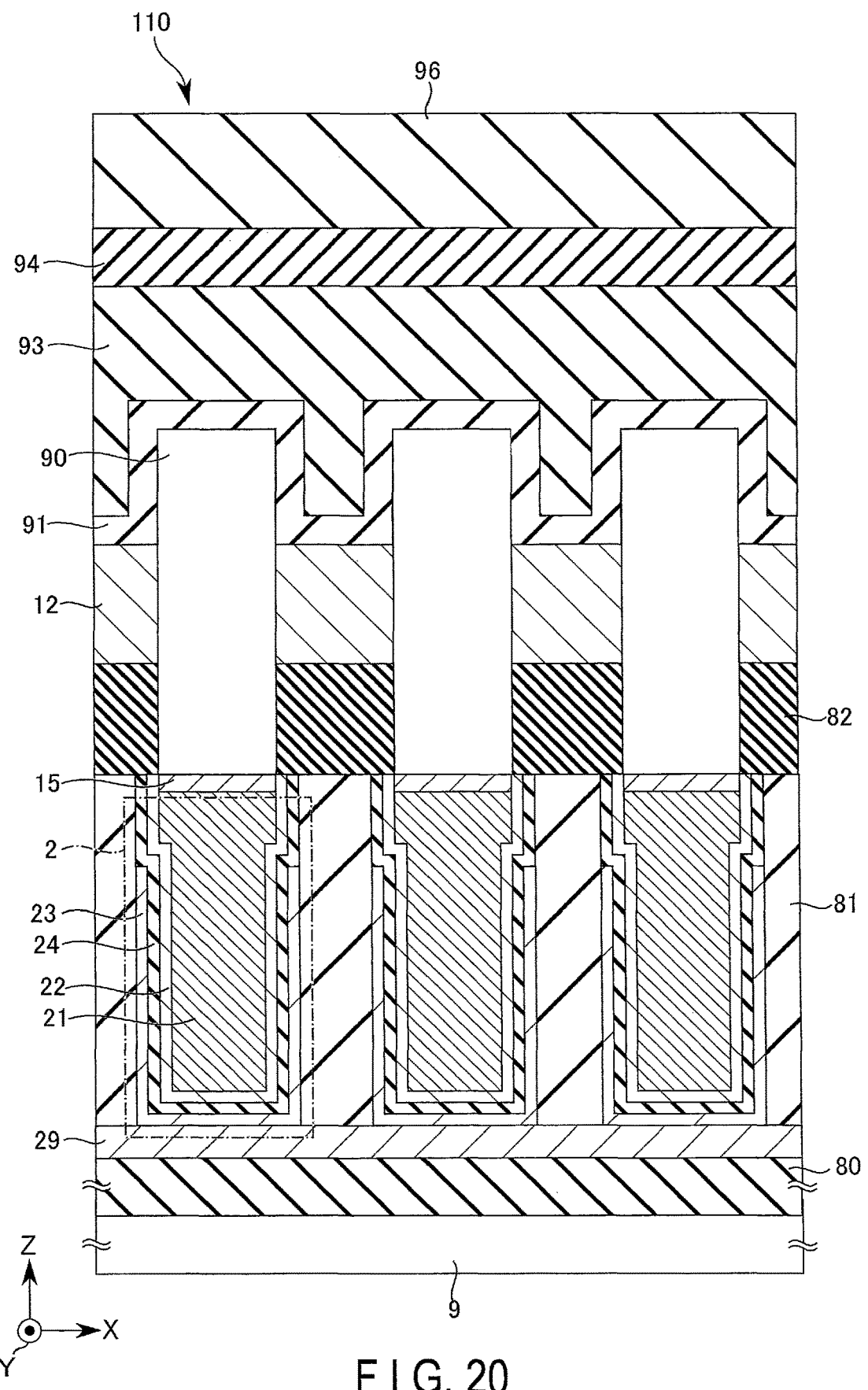
F I G. 20

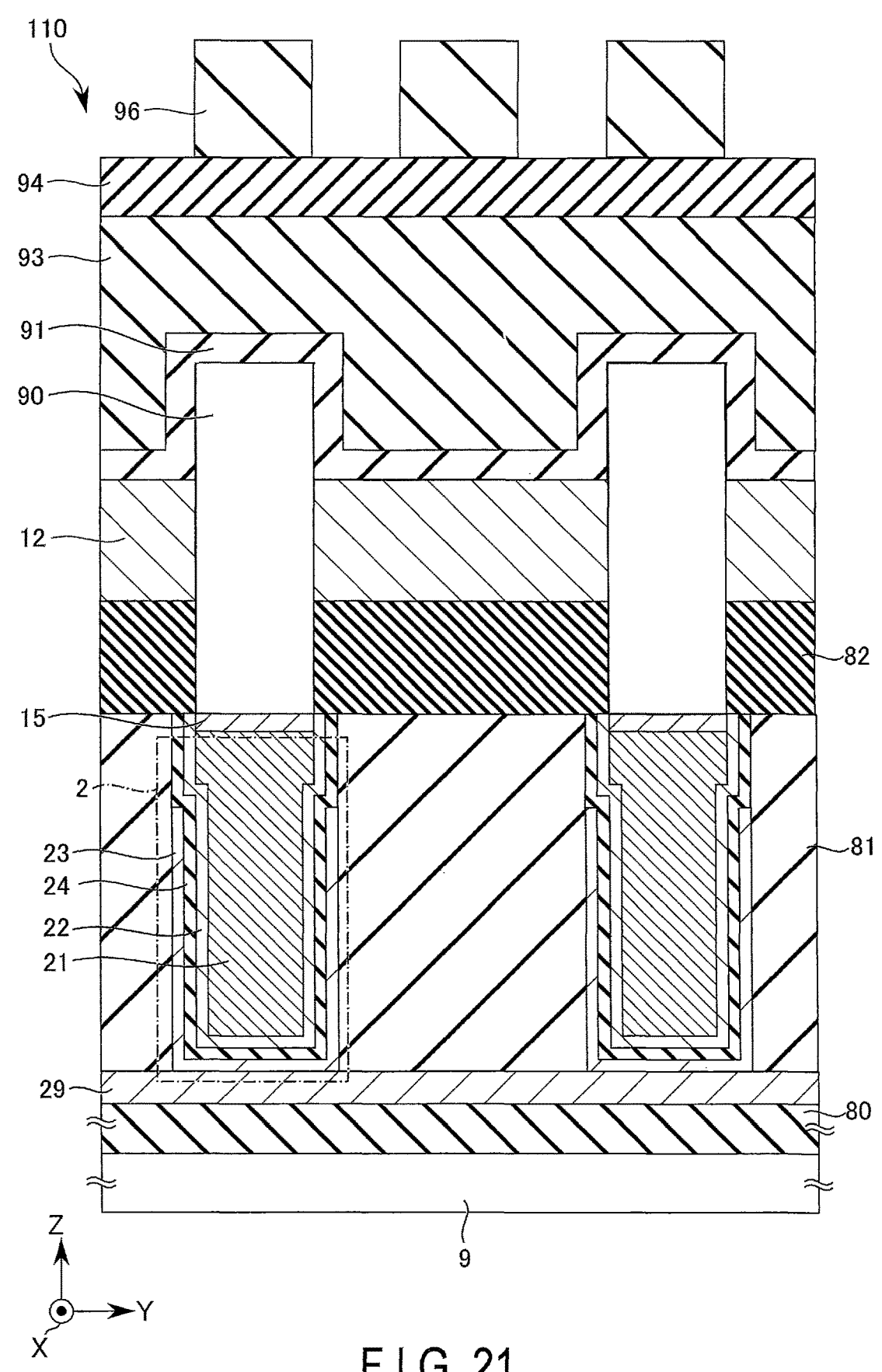
F I G. 21

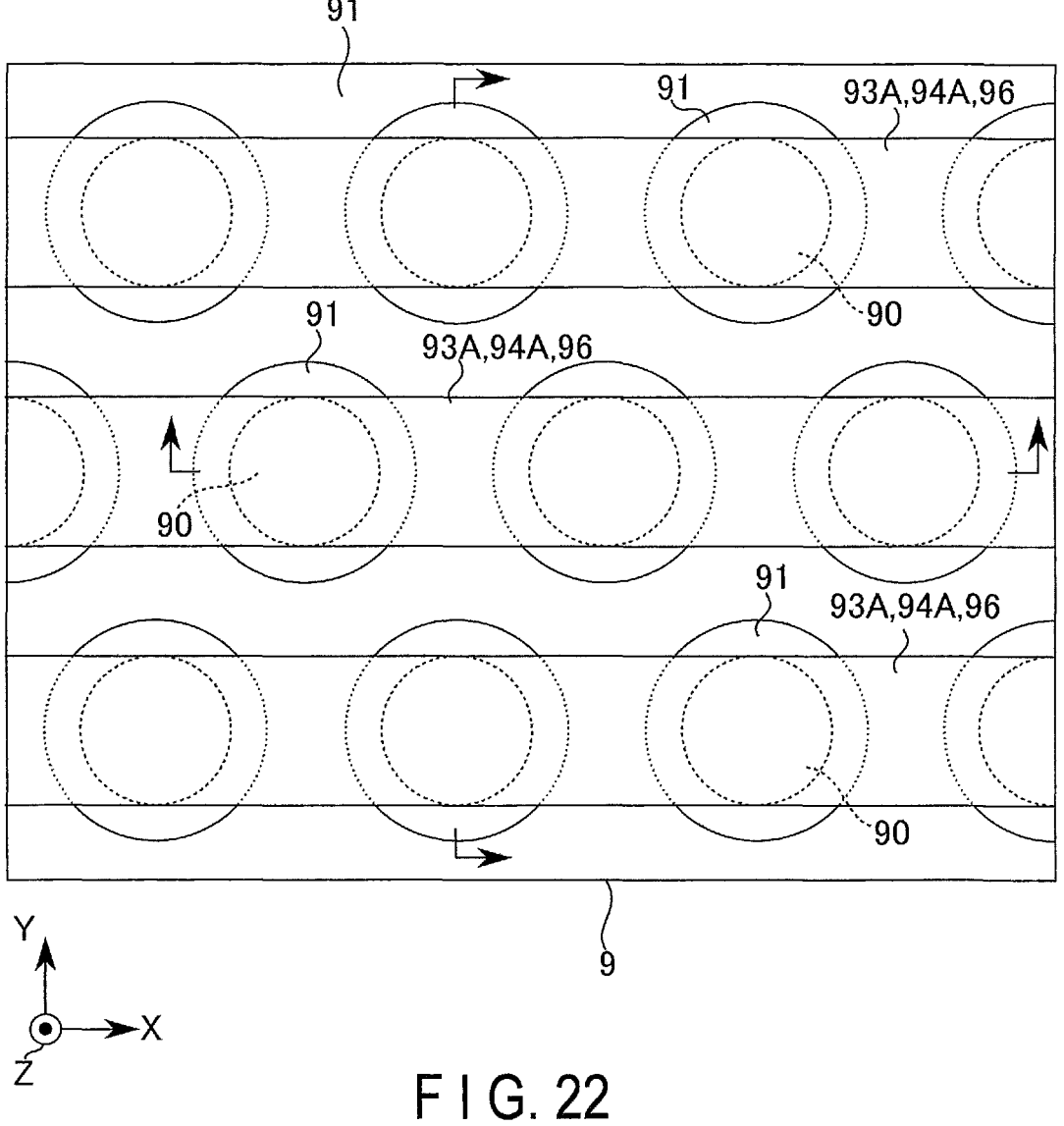
F I G. 22

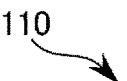
110
94A
93A
91
90
12X
15
2
23
24
22
21
29
82
81
80
9
Z
X
Y
F I G. 23

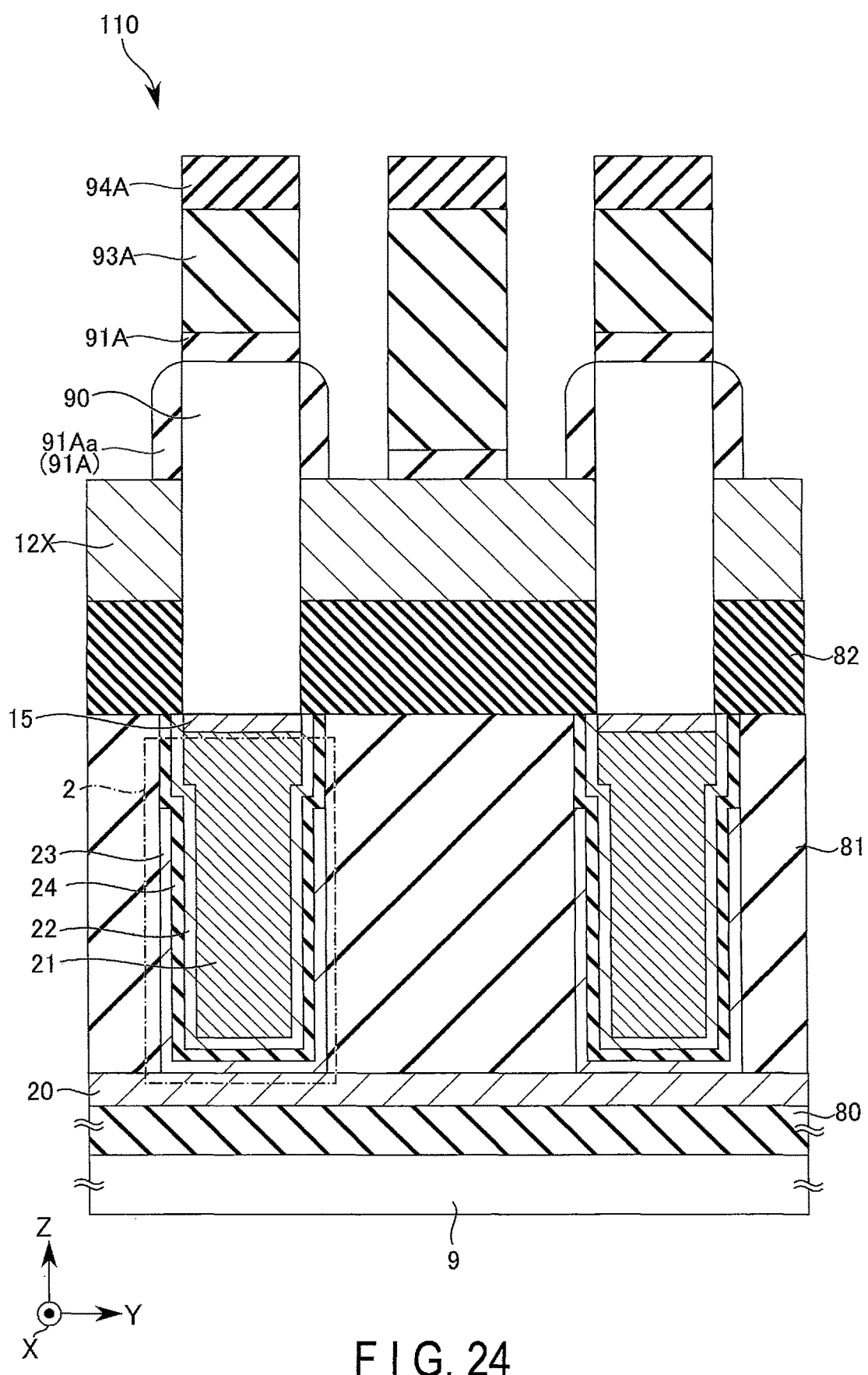
F I G. 24

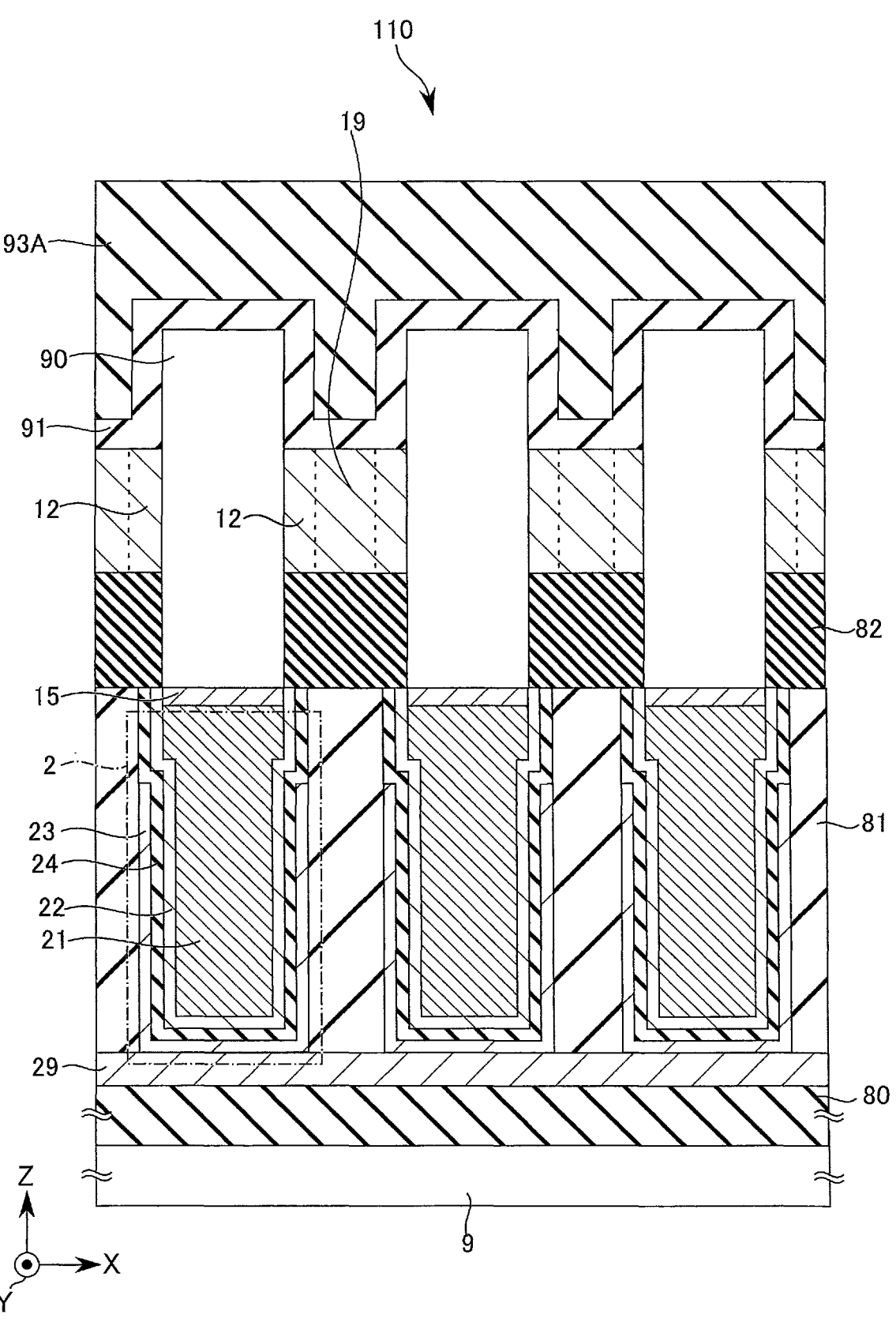
F I G. 25

110
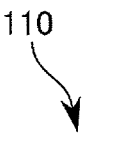
93A
91A
91Aa
(91A)
90
12
19
82
15
2
23
24
22
21
81
29
80
9
Z
Y
X
F I G. 26

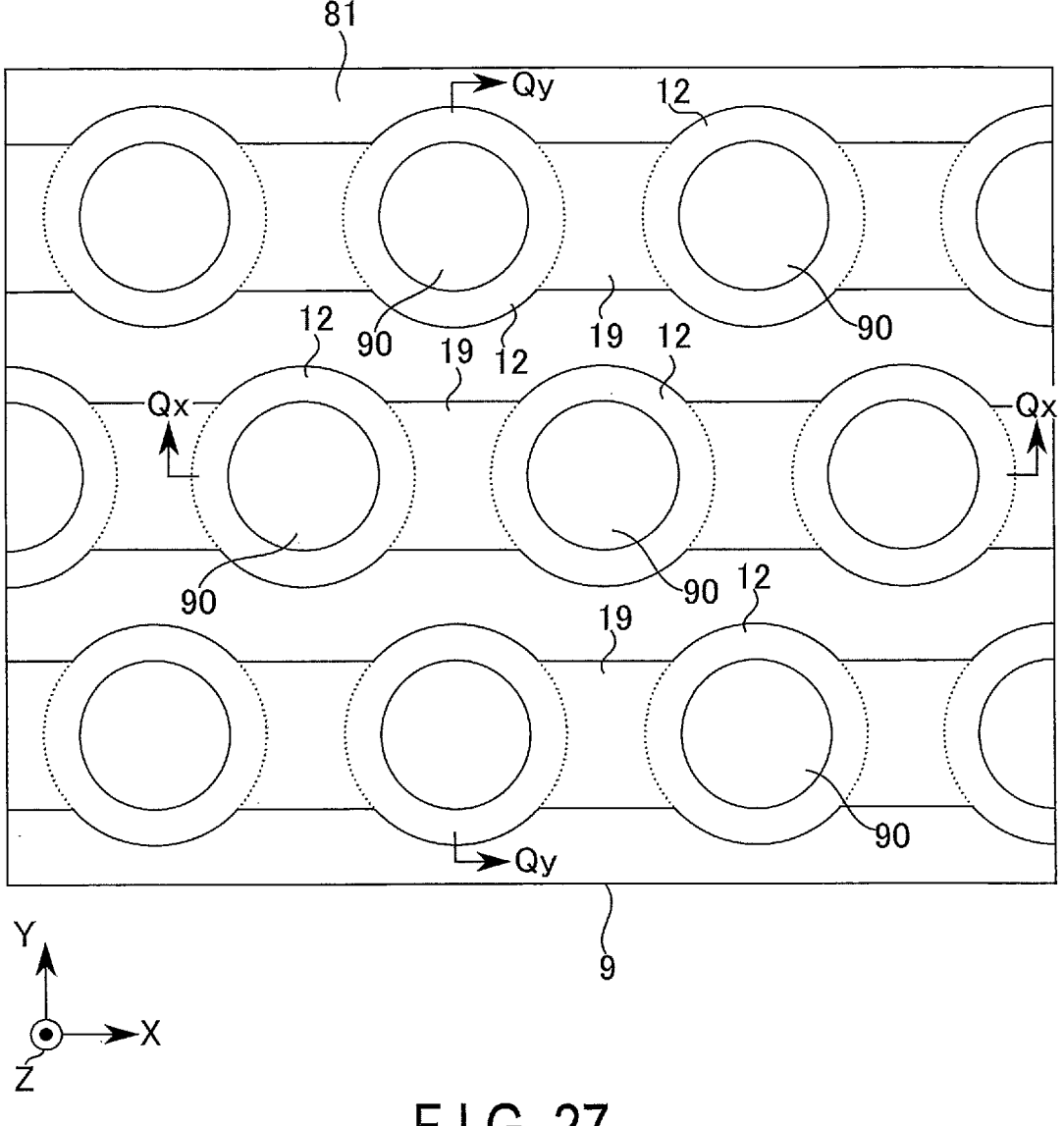
F I G. 27

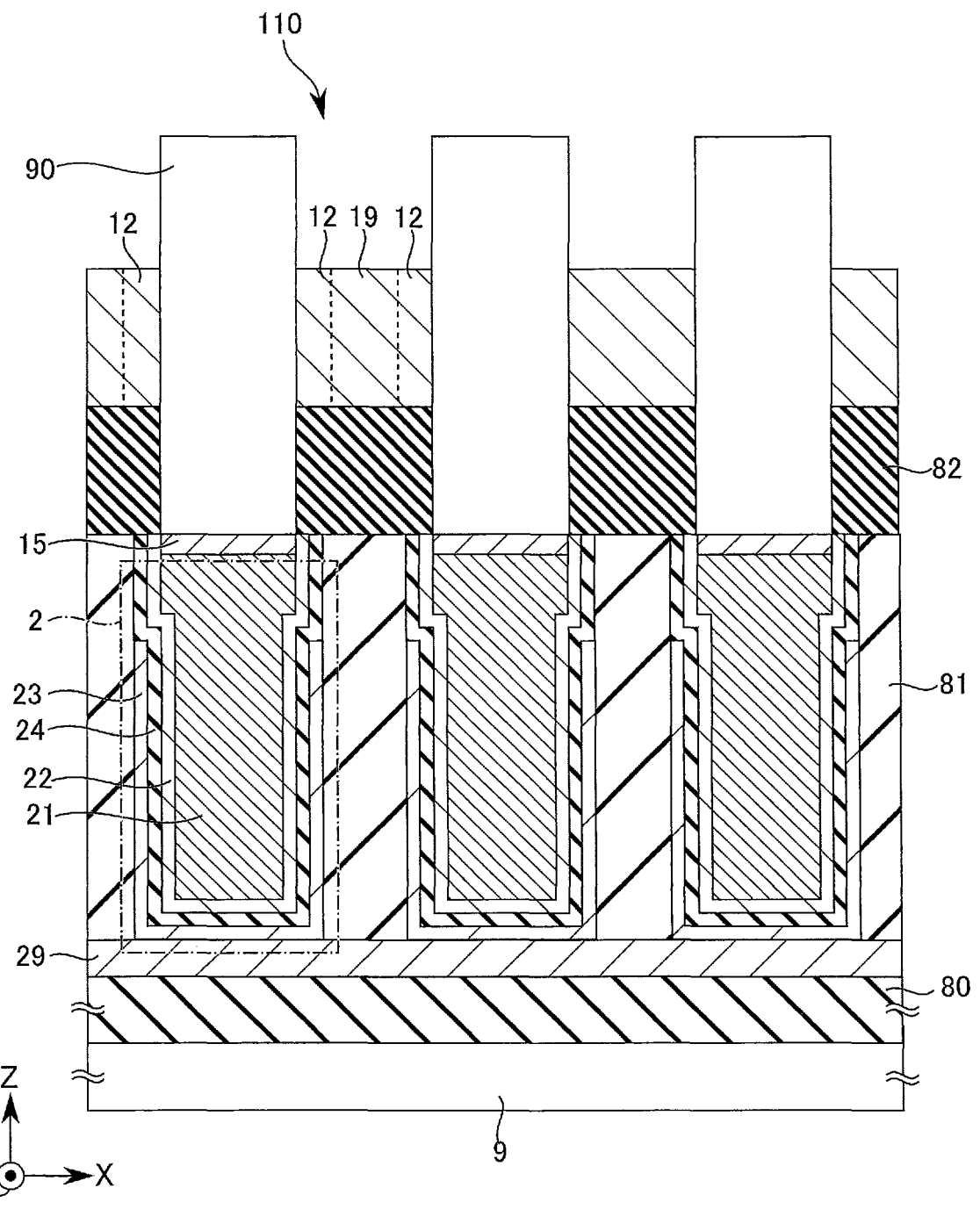
F I G. 28

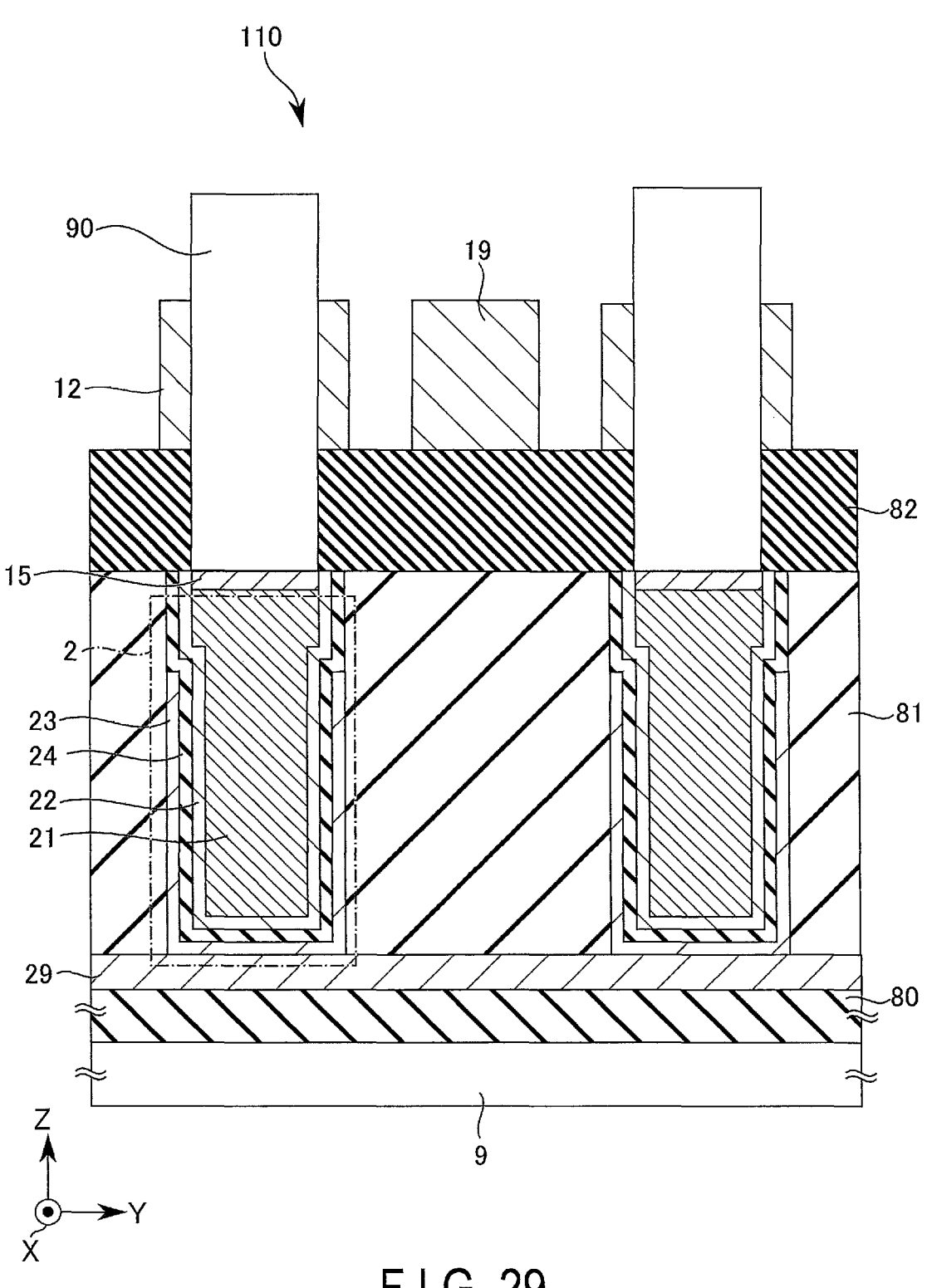
F I G. 29

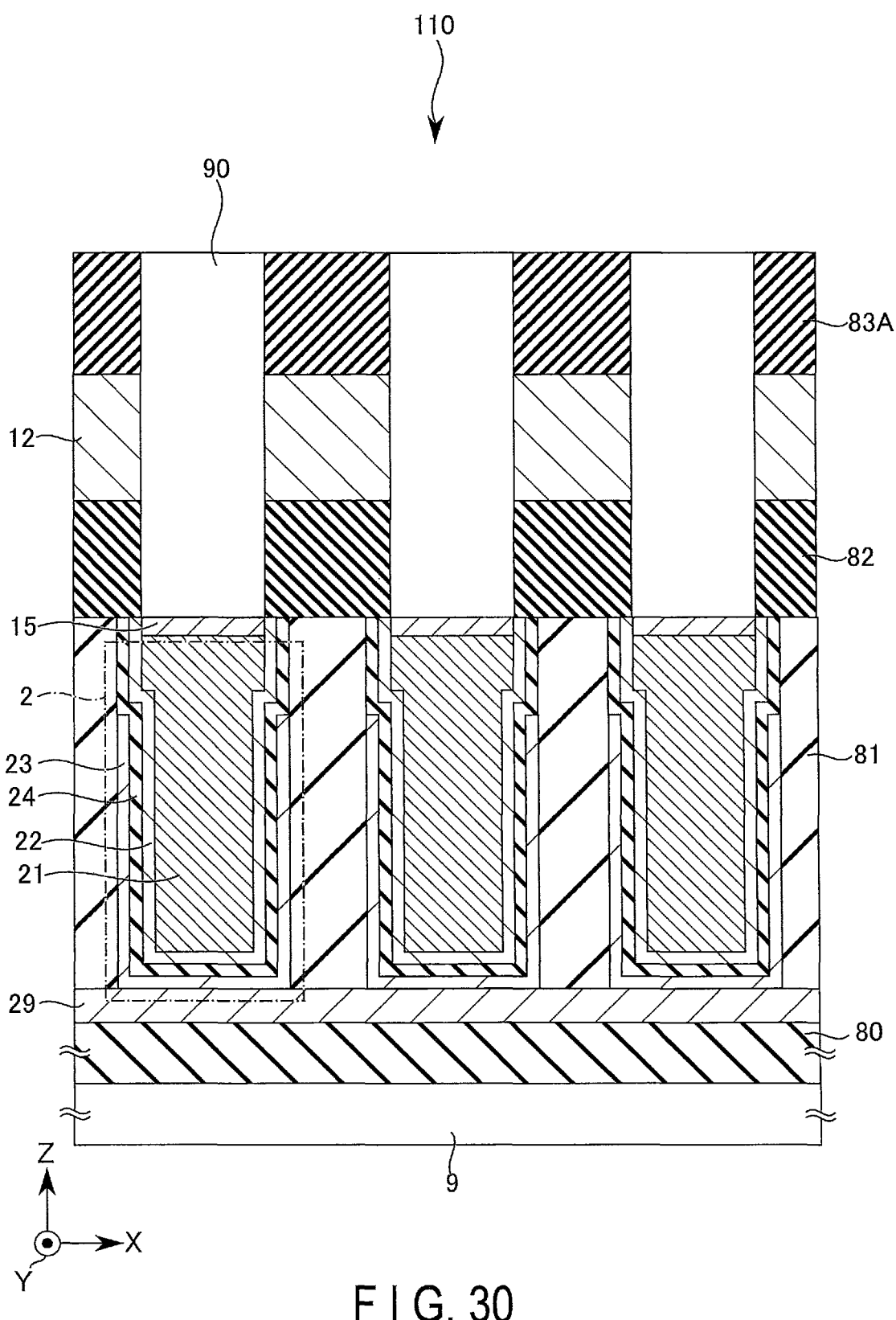
F I G. 30

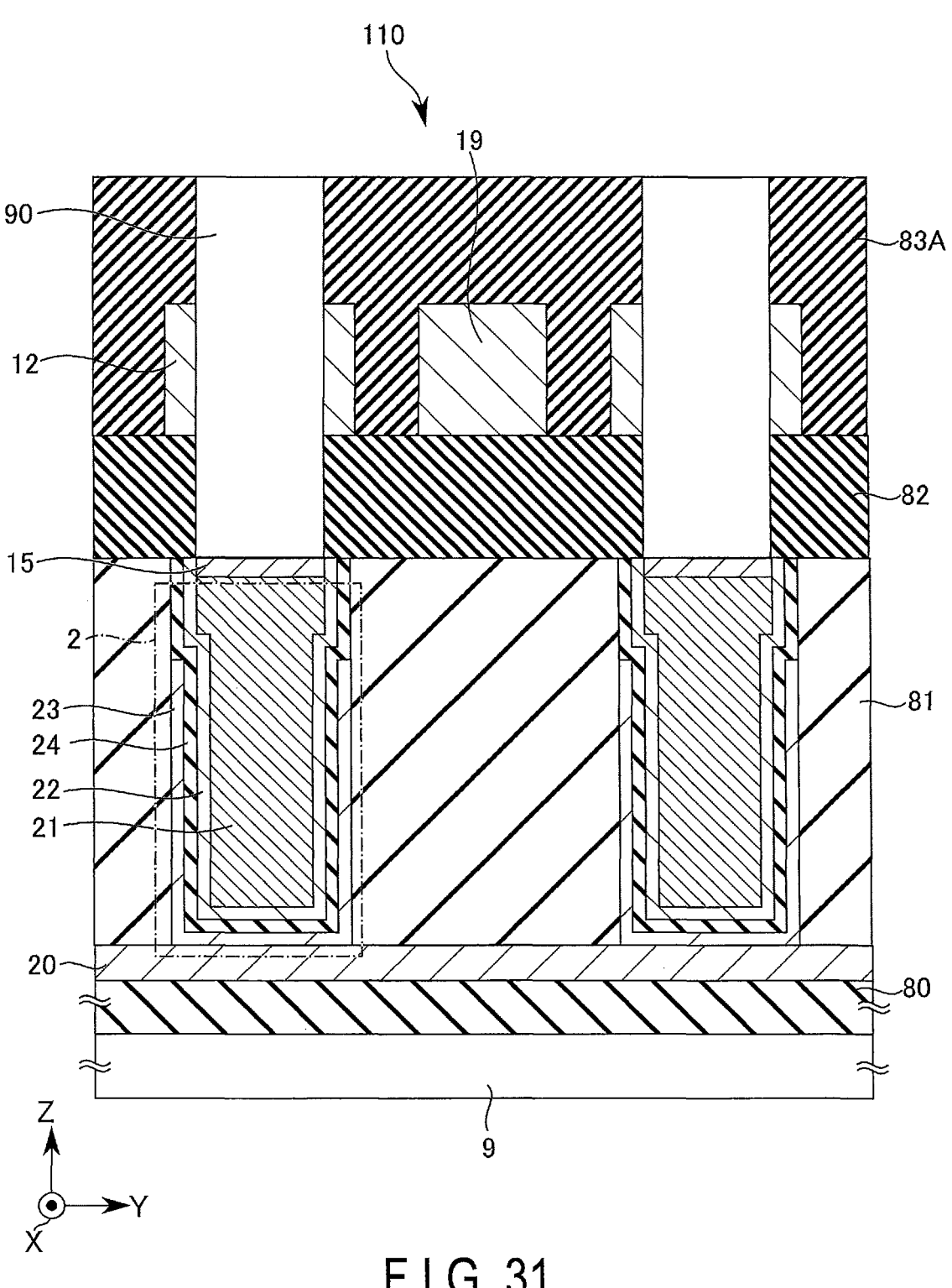
F I G. 31

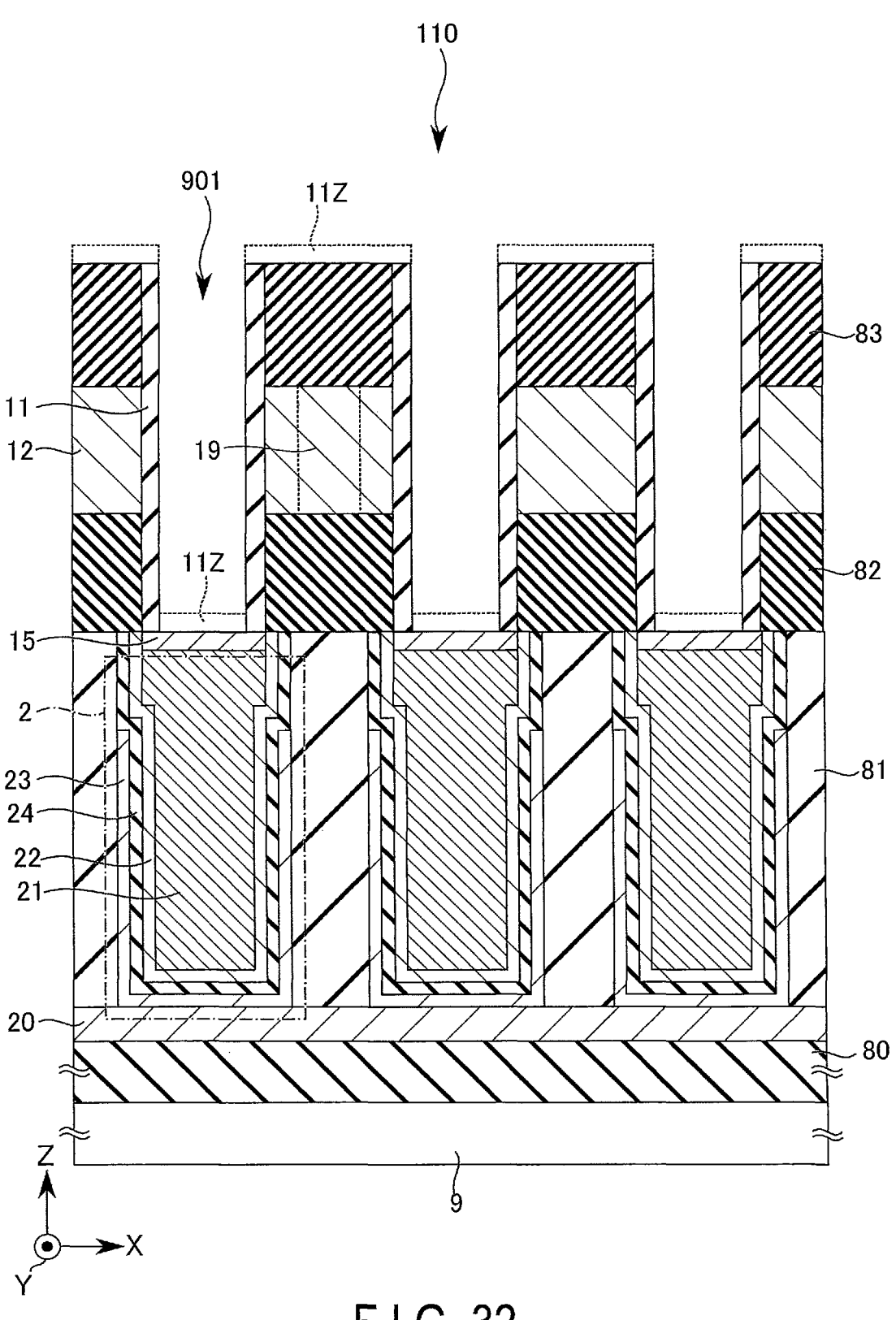
F I G. 32

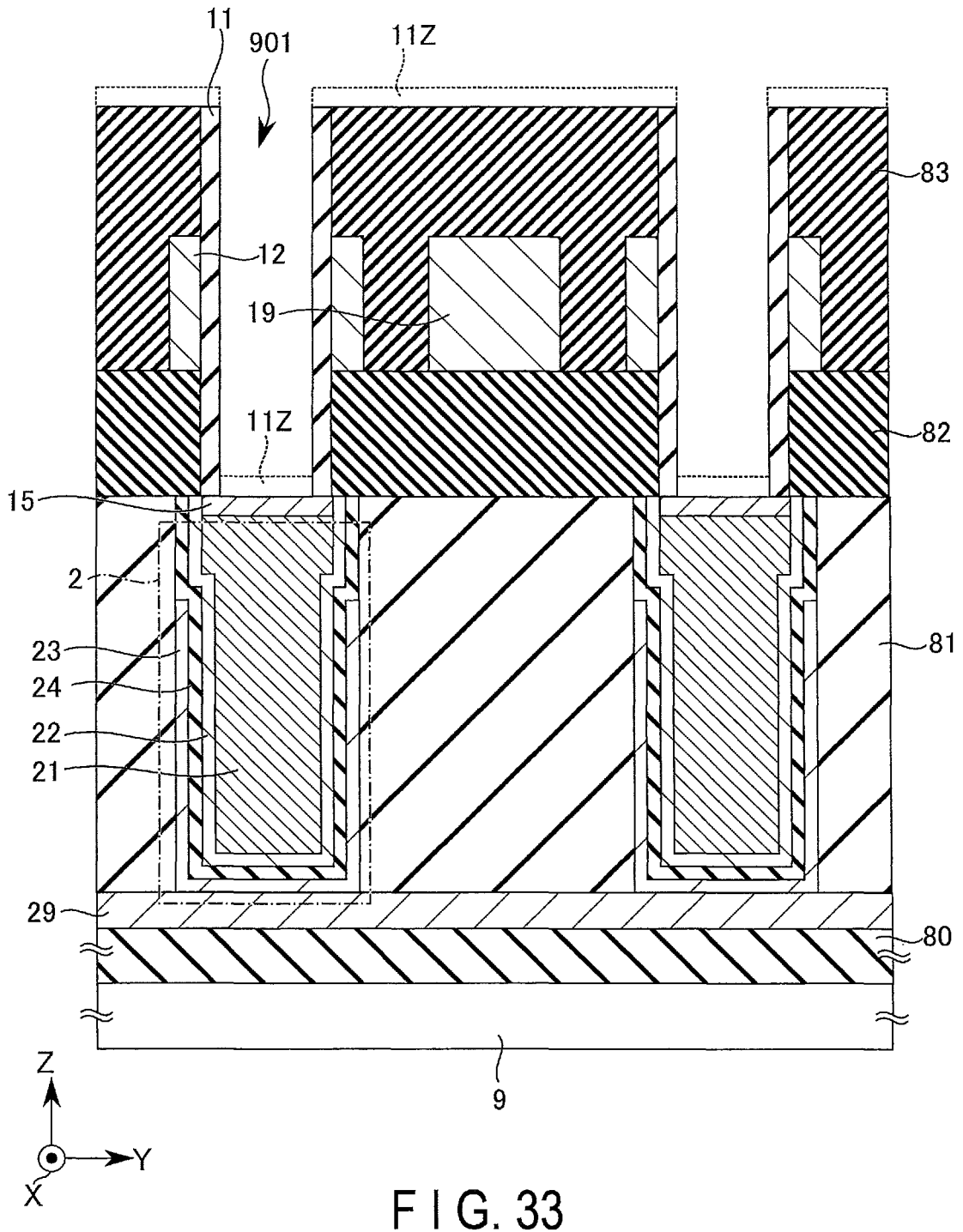
F I G. 33

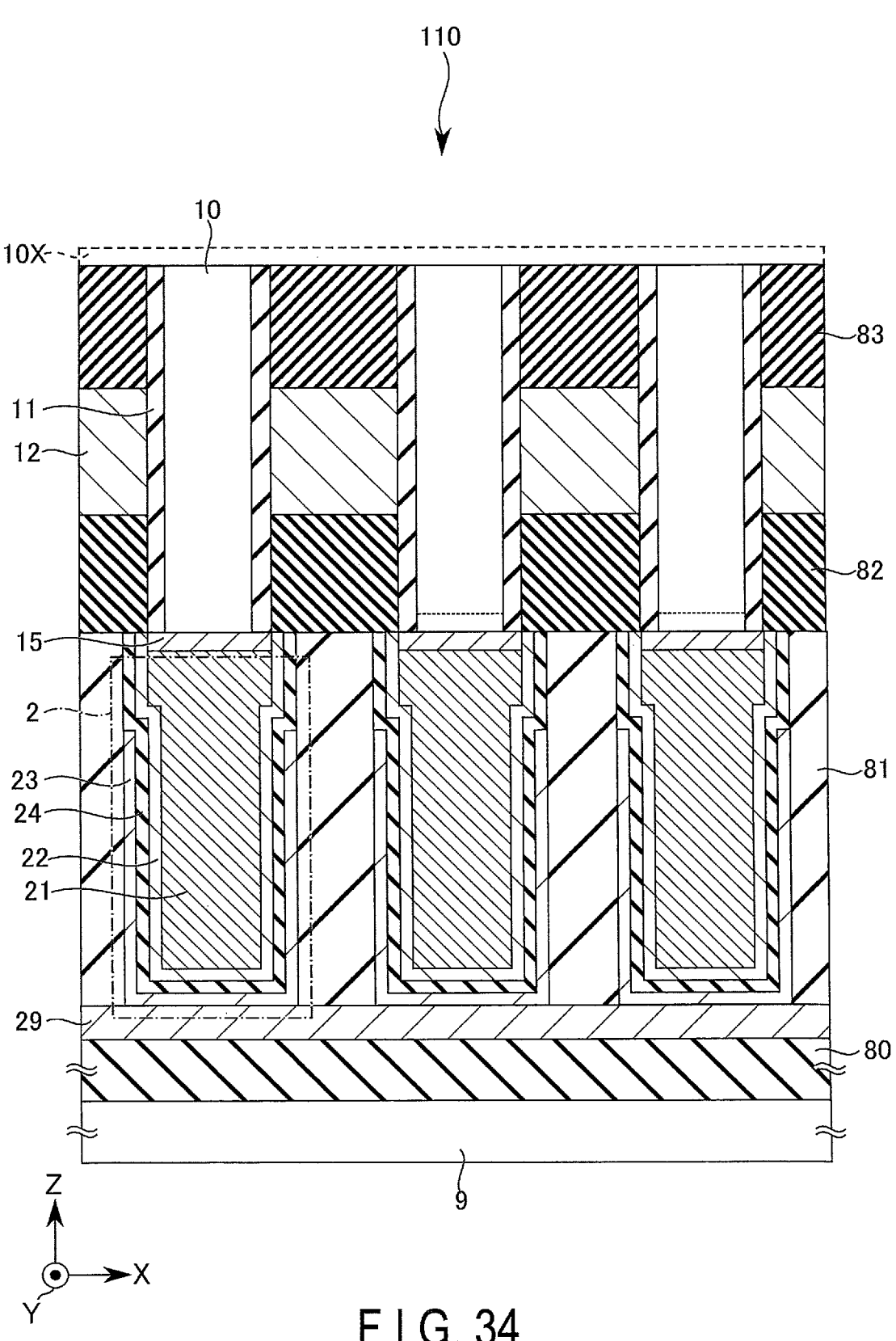
F I G. 34

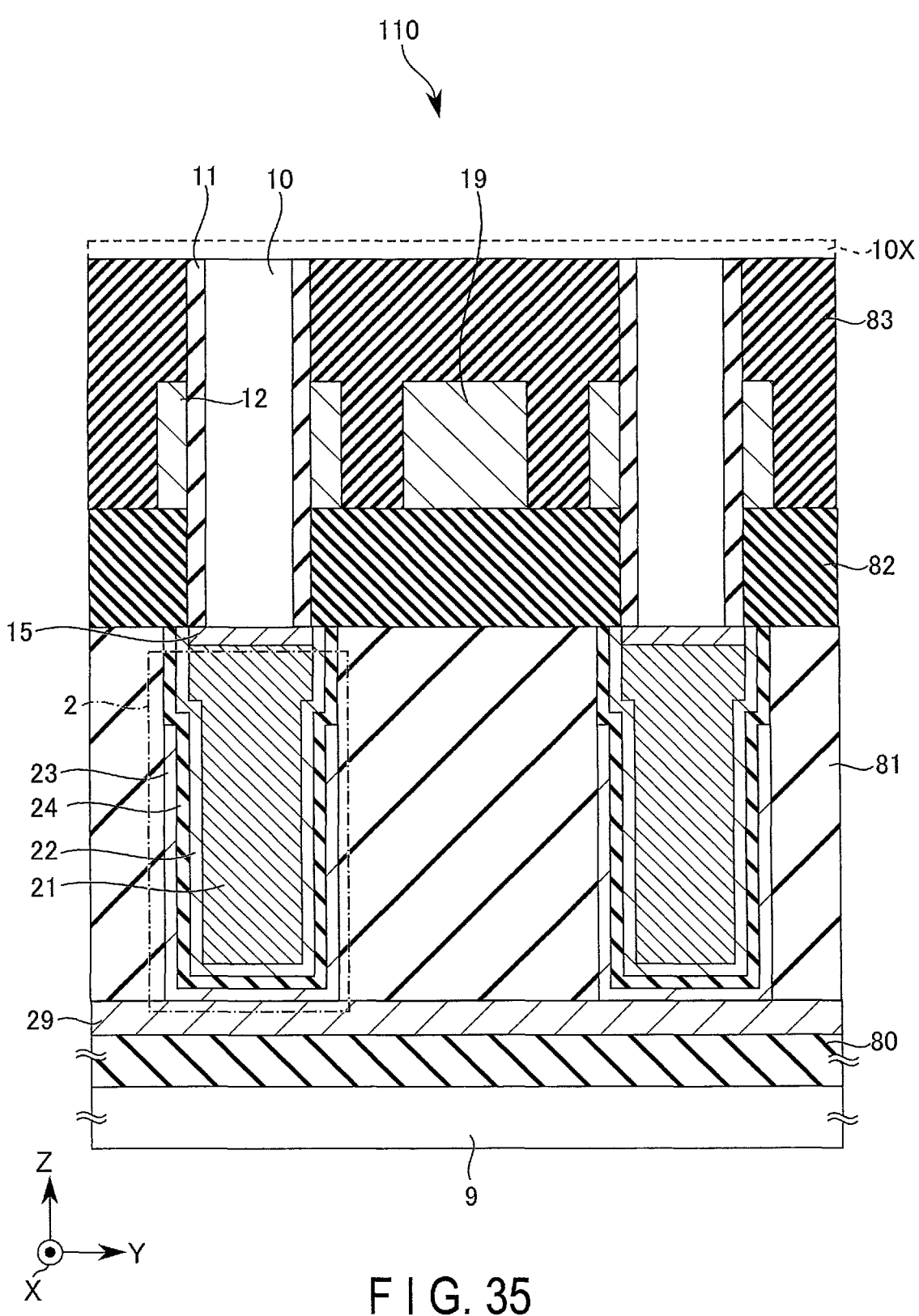
F I G. 35

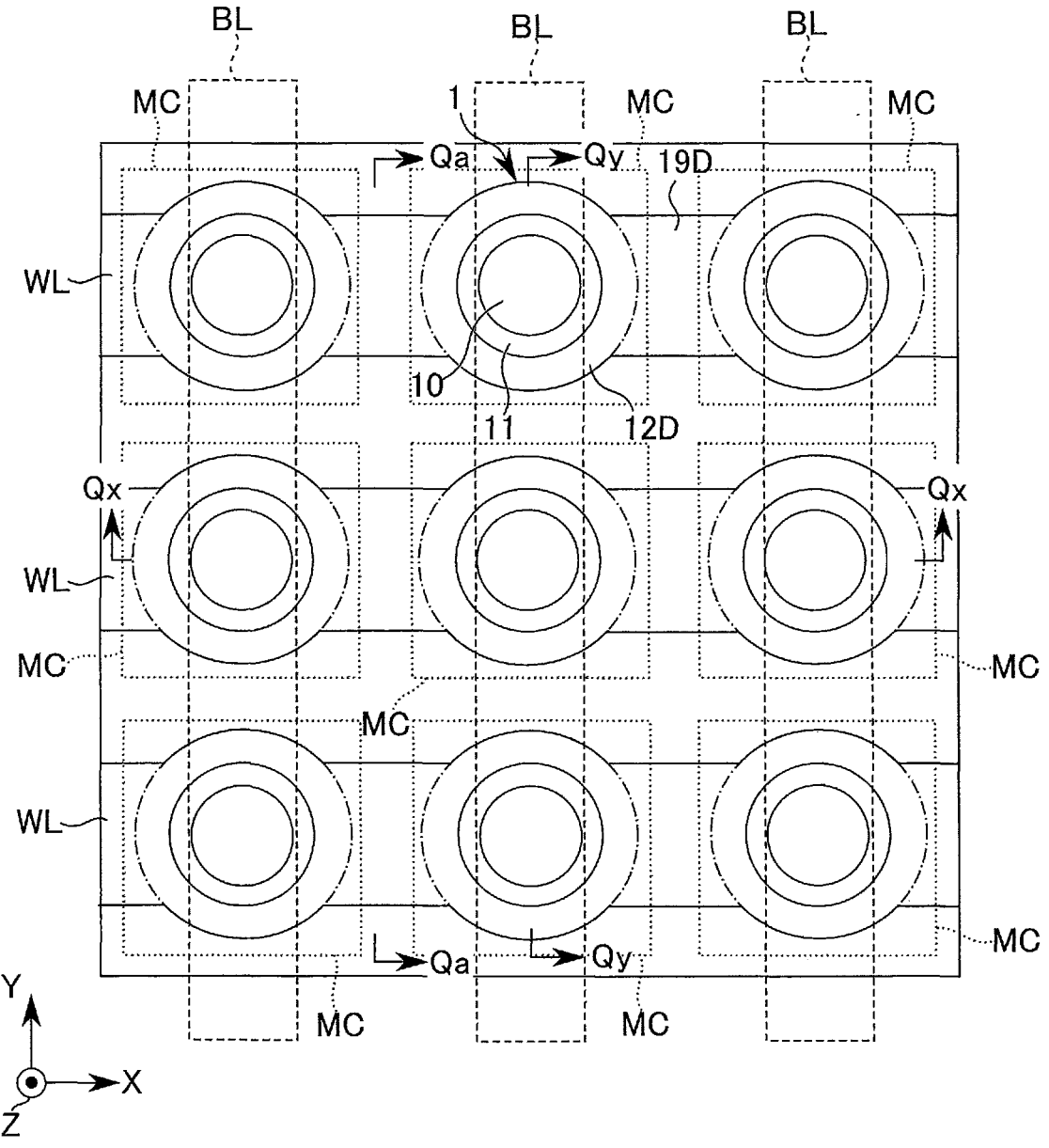
F I G. 36

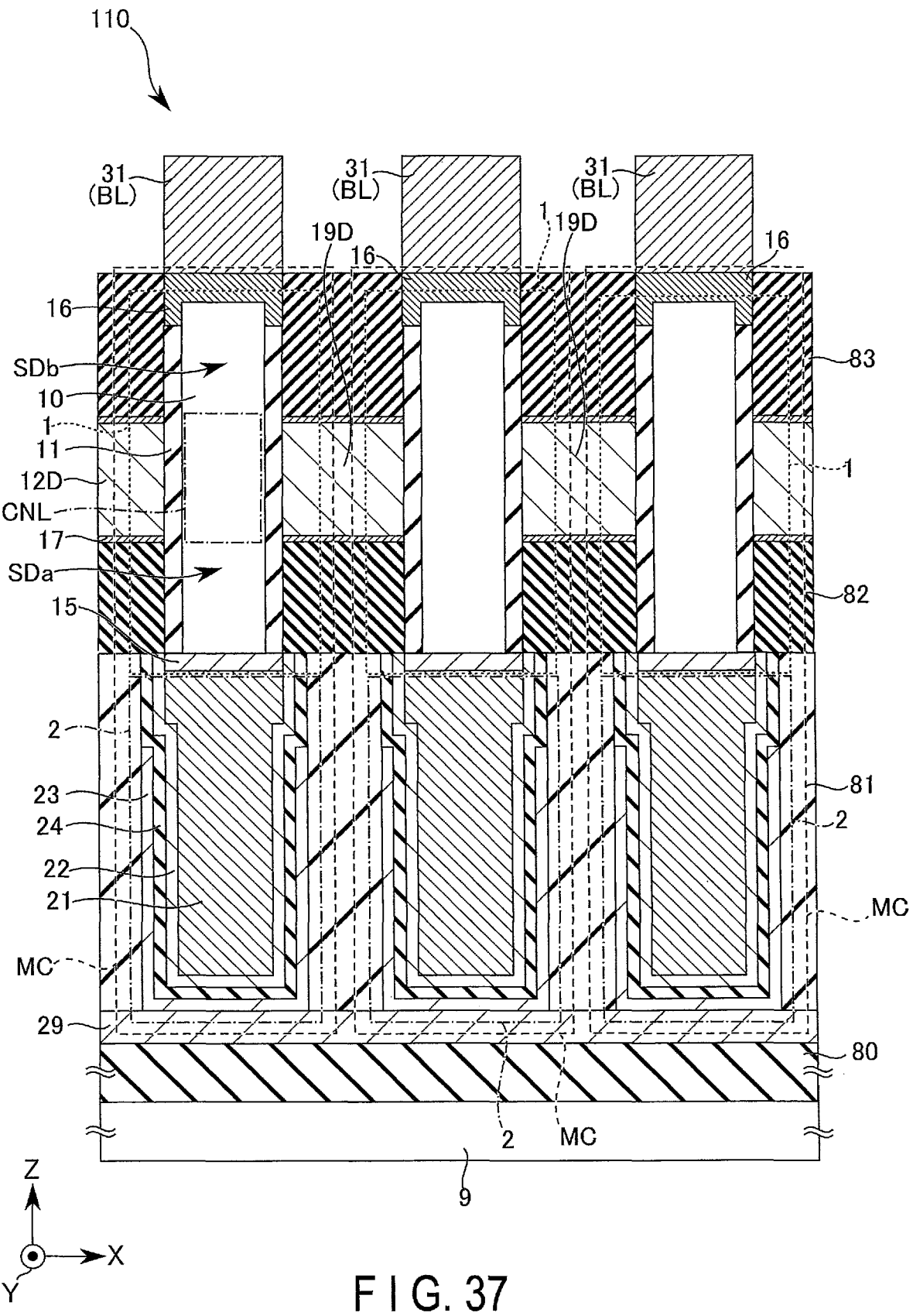
F I G. 37

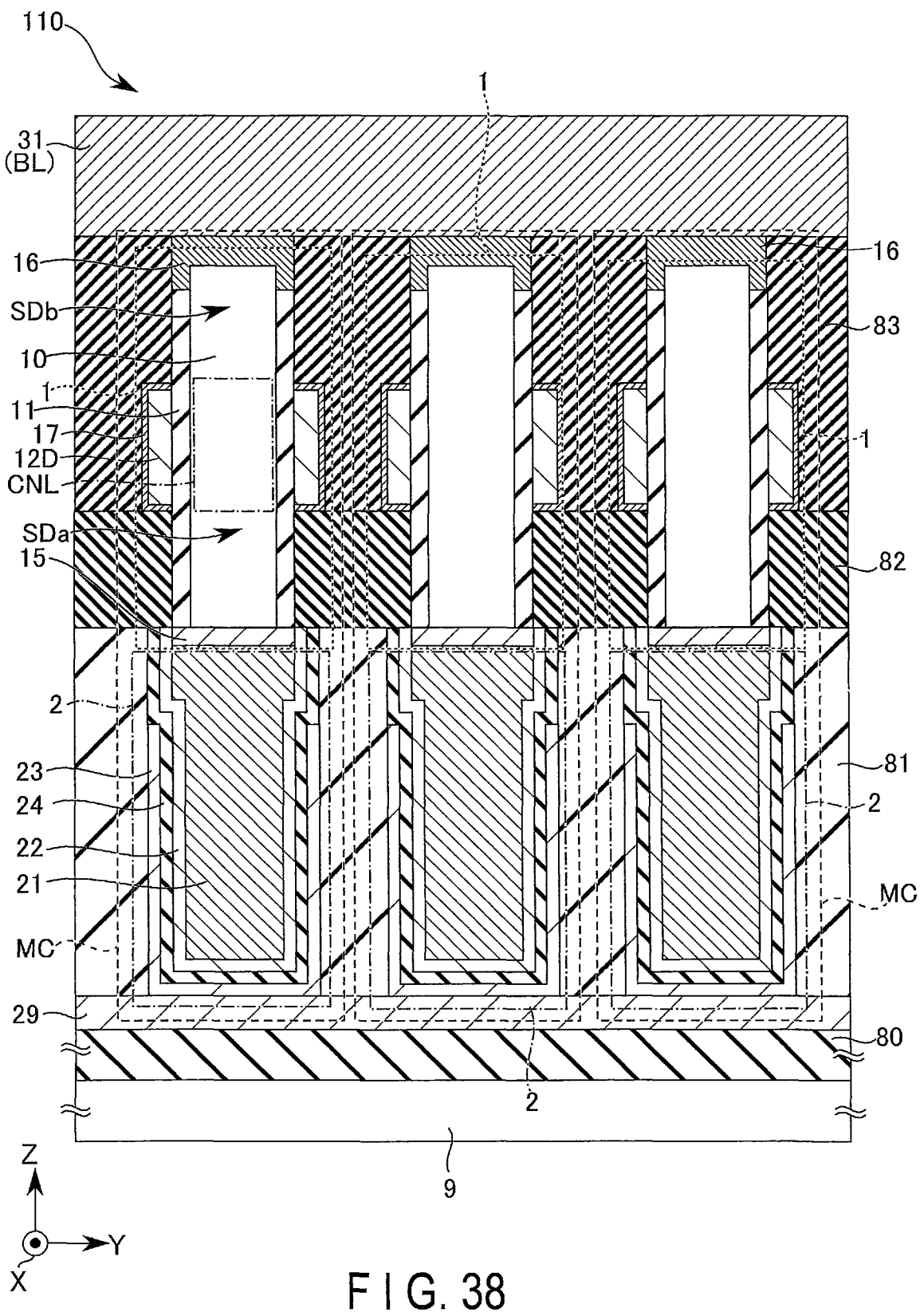
F I G. 38

110
83
75
17
18
19D
82
81
29
80
9
Z
Y
X
F I G. 39

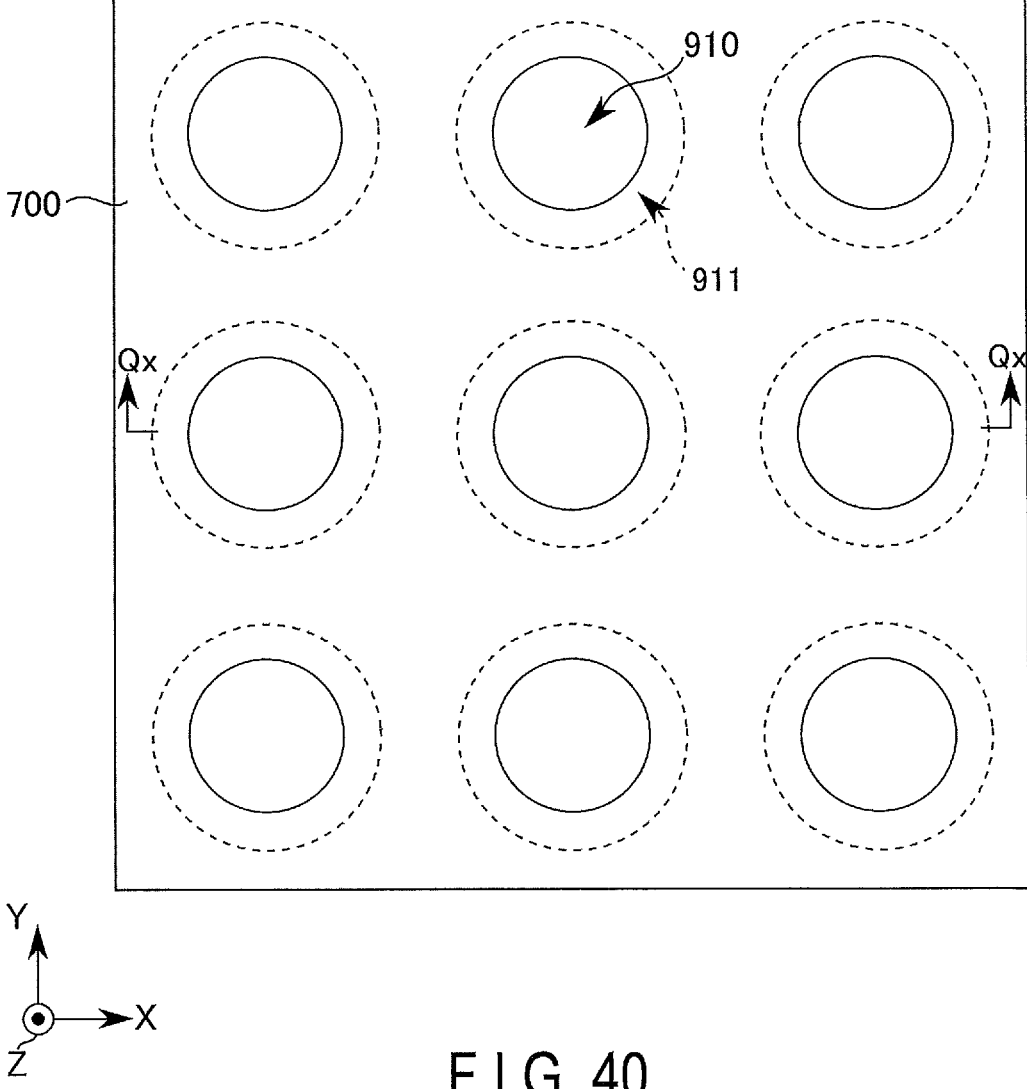
F I G. 40

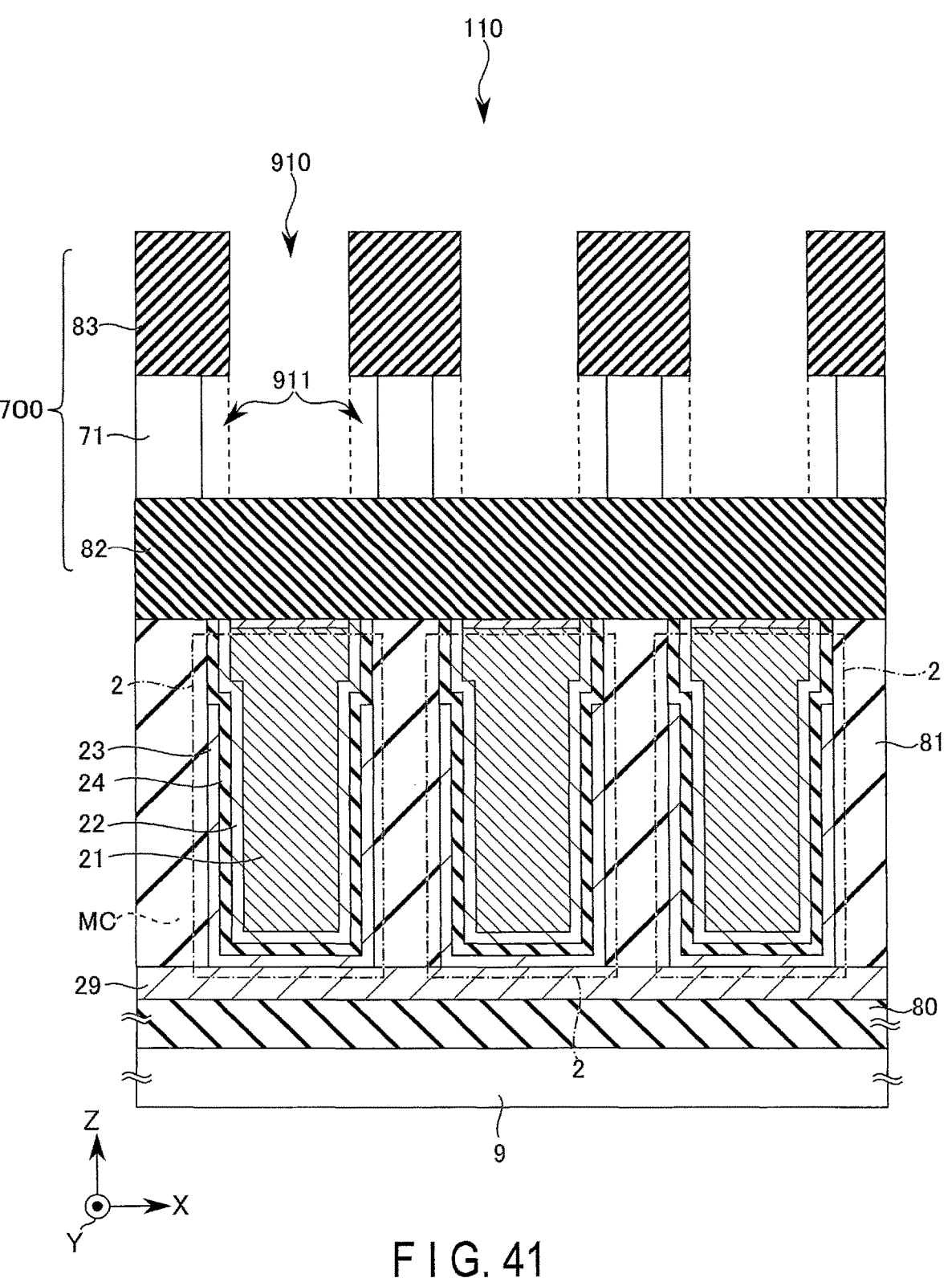
F I G. 41

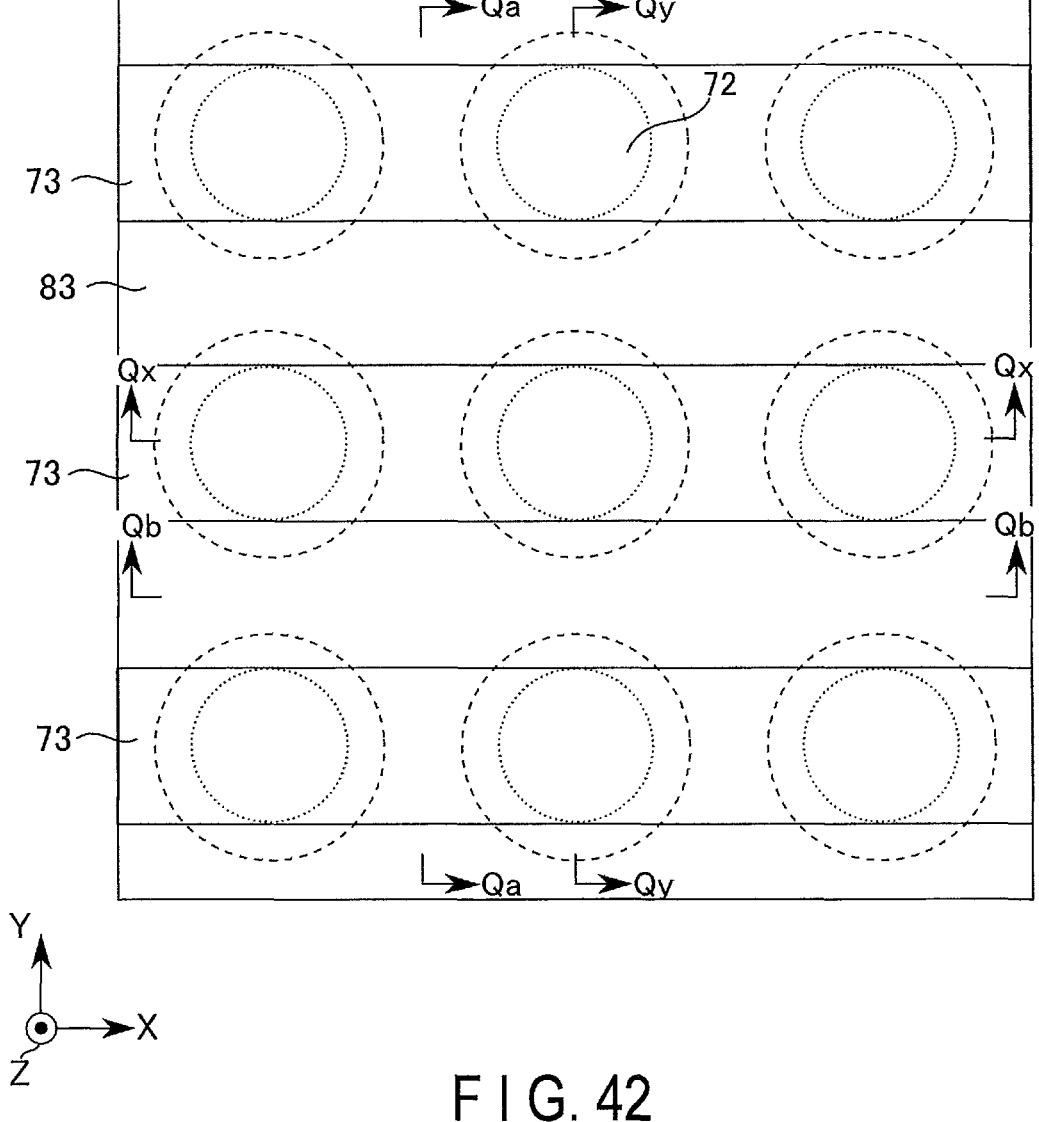
F I G. 42

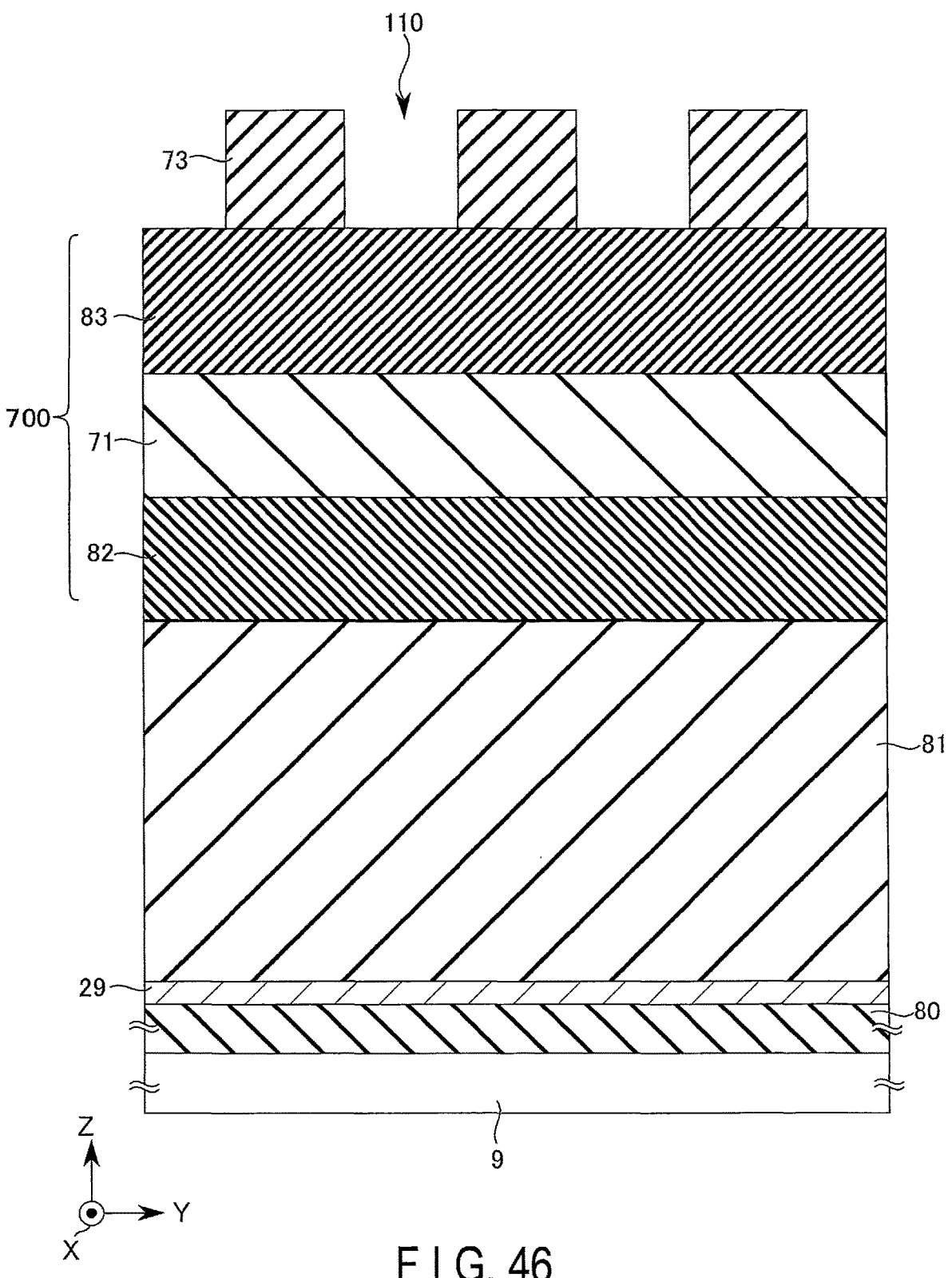
F I G. 46

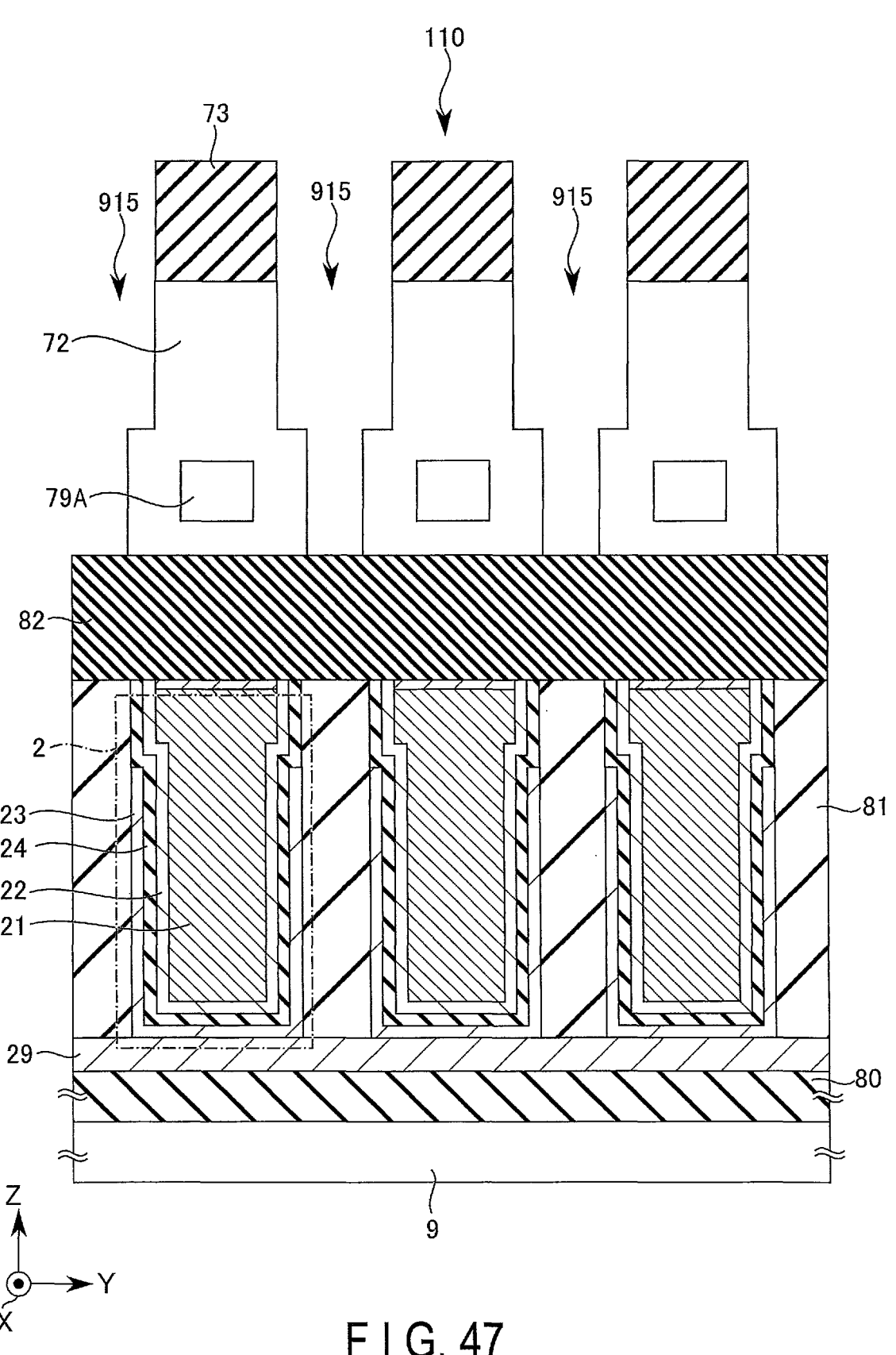
F I G. 47

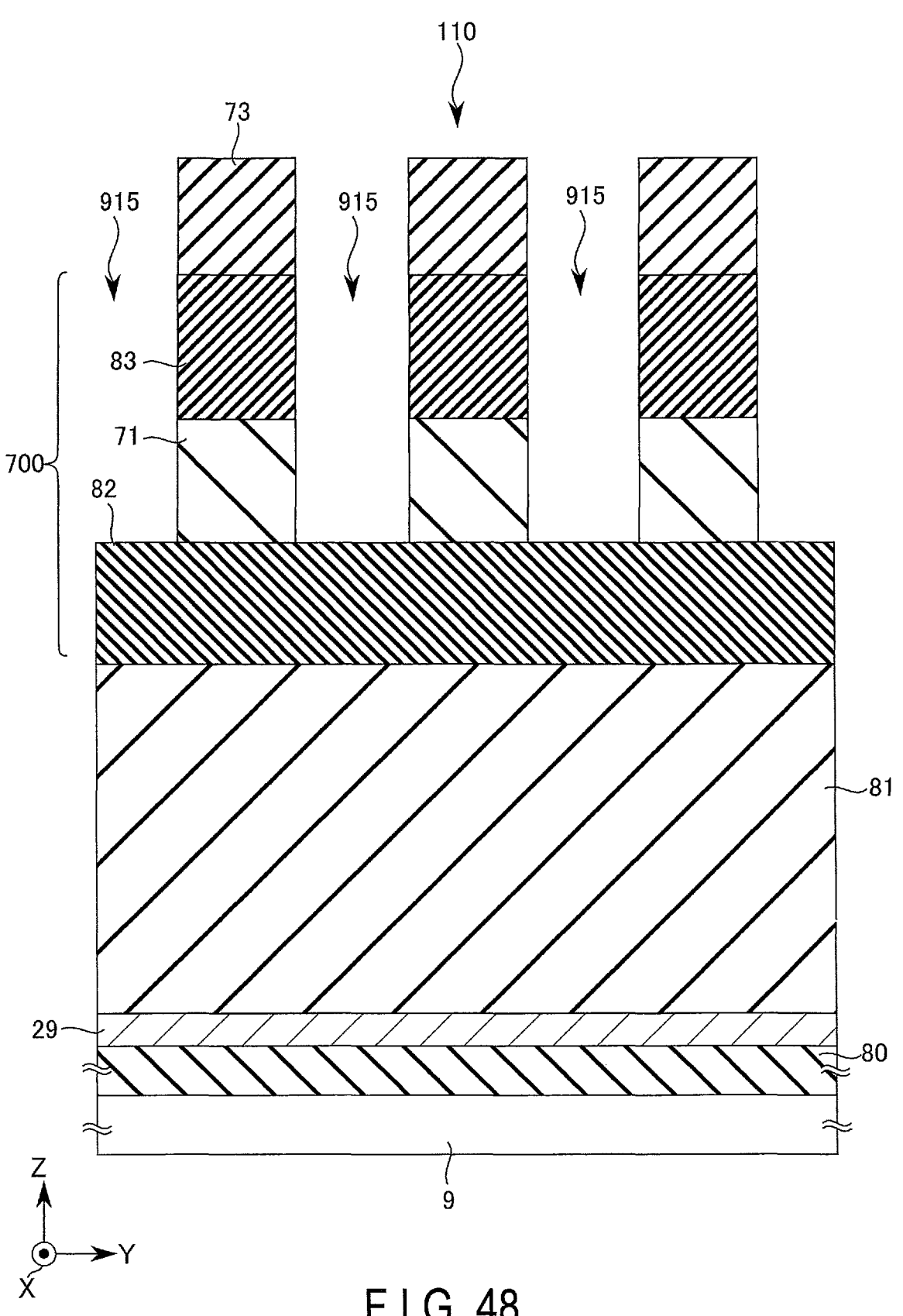
F I G. 48

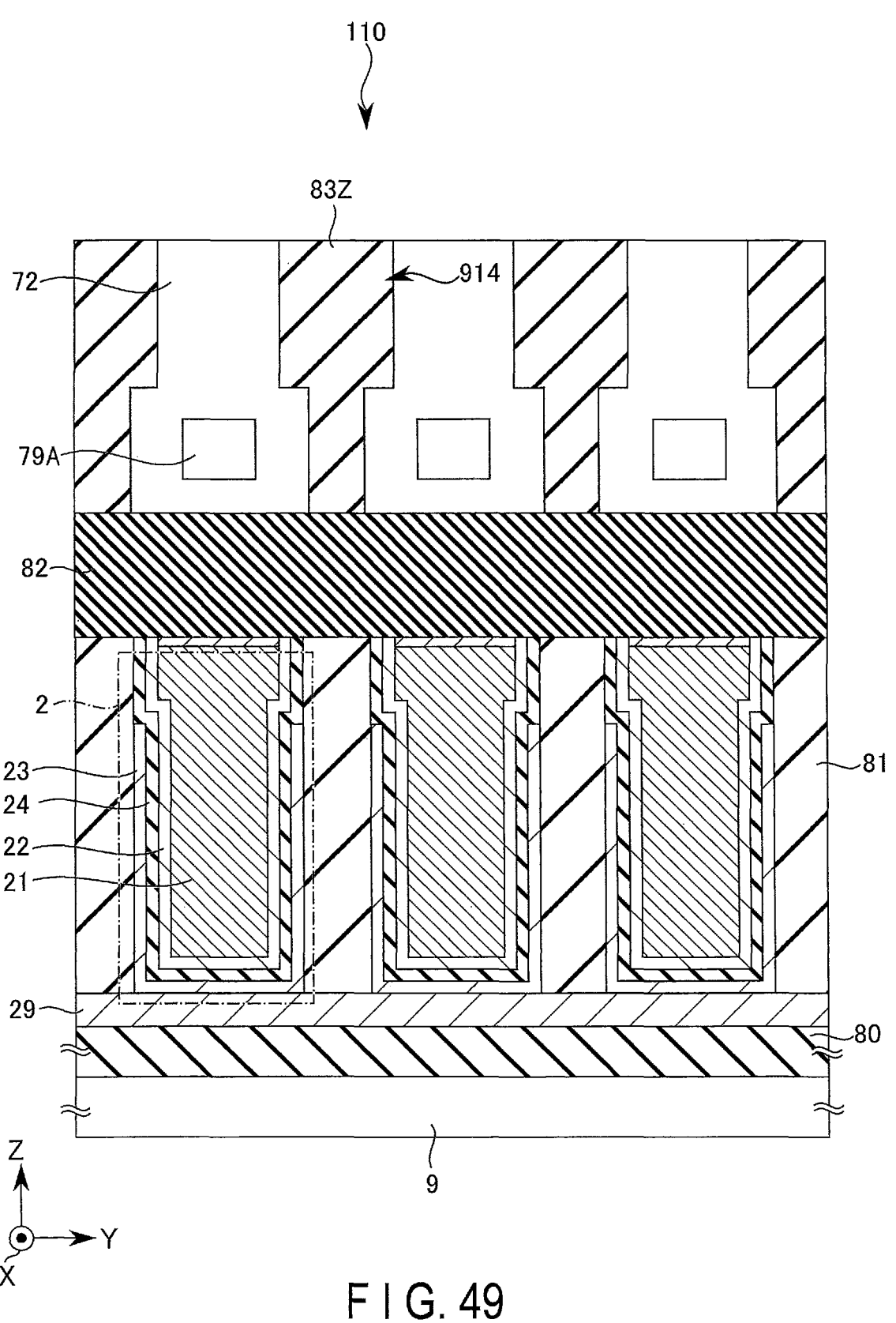
F I G. 49

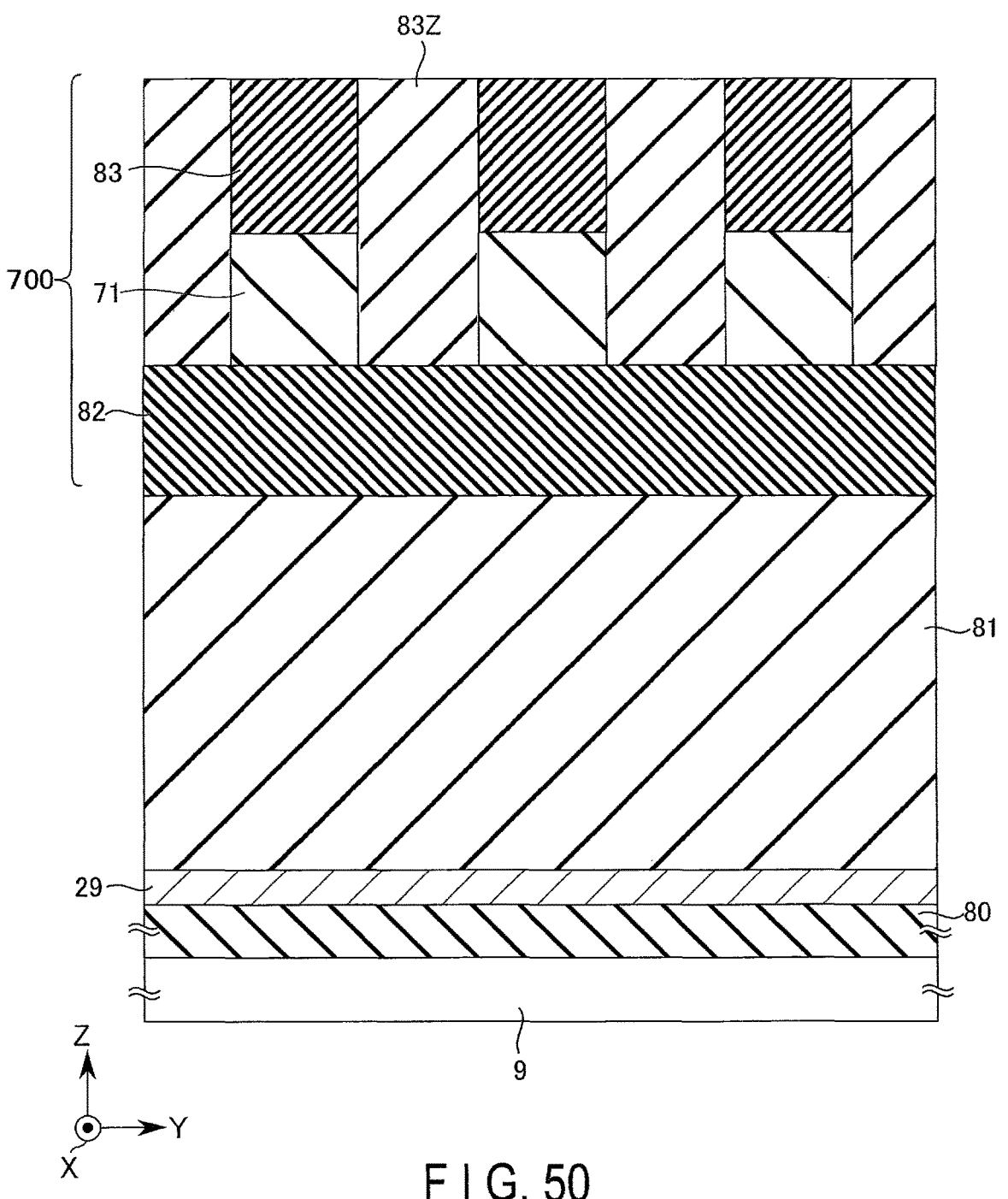
F I G. 50

F I G. 51

F I G. 52

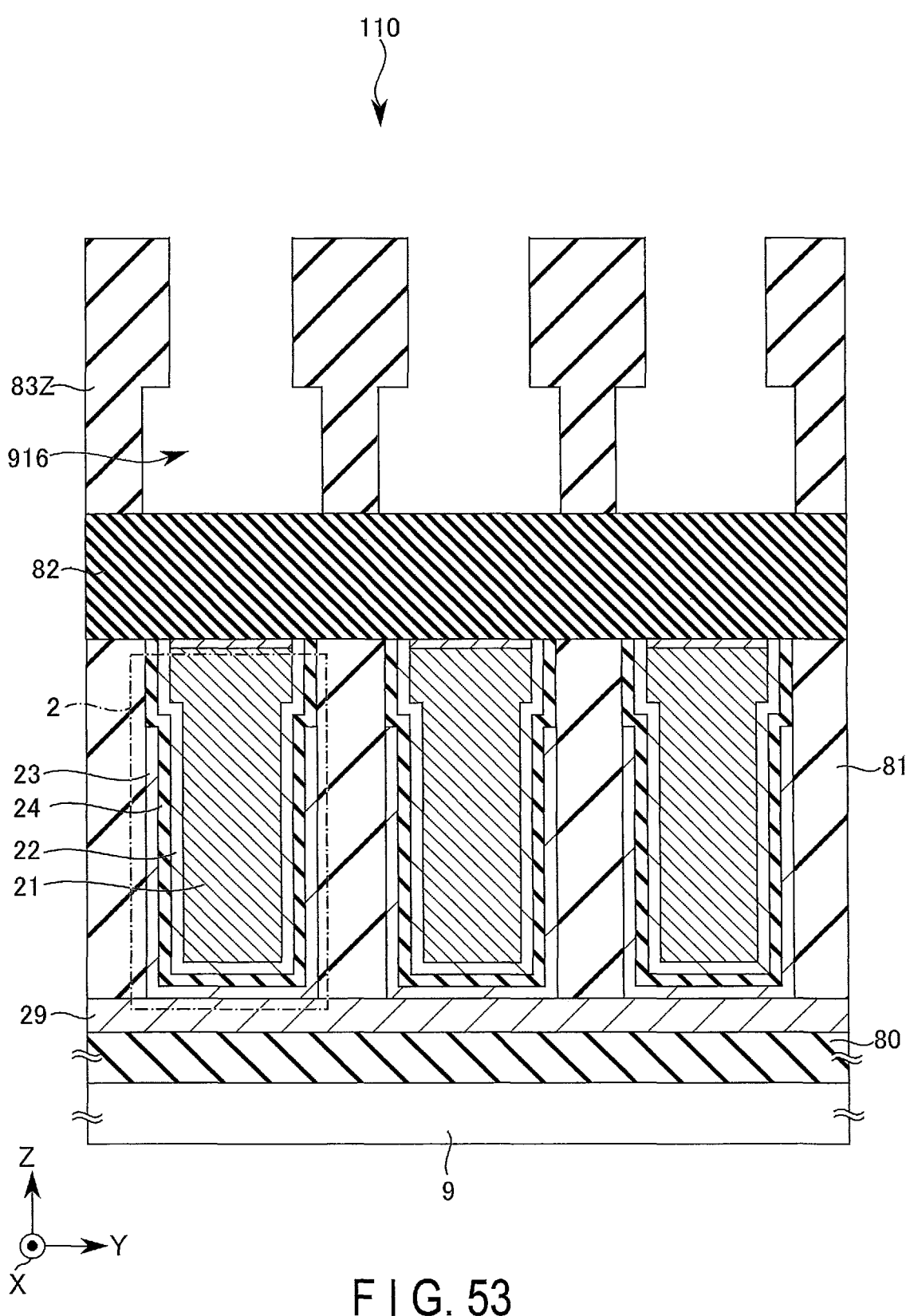
F I G. 53

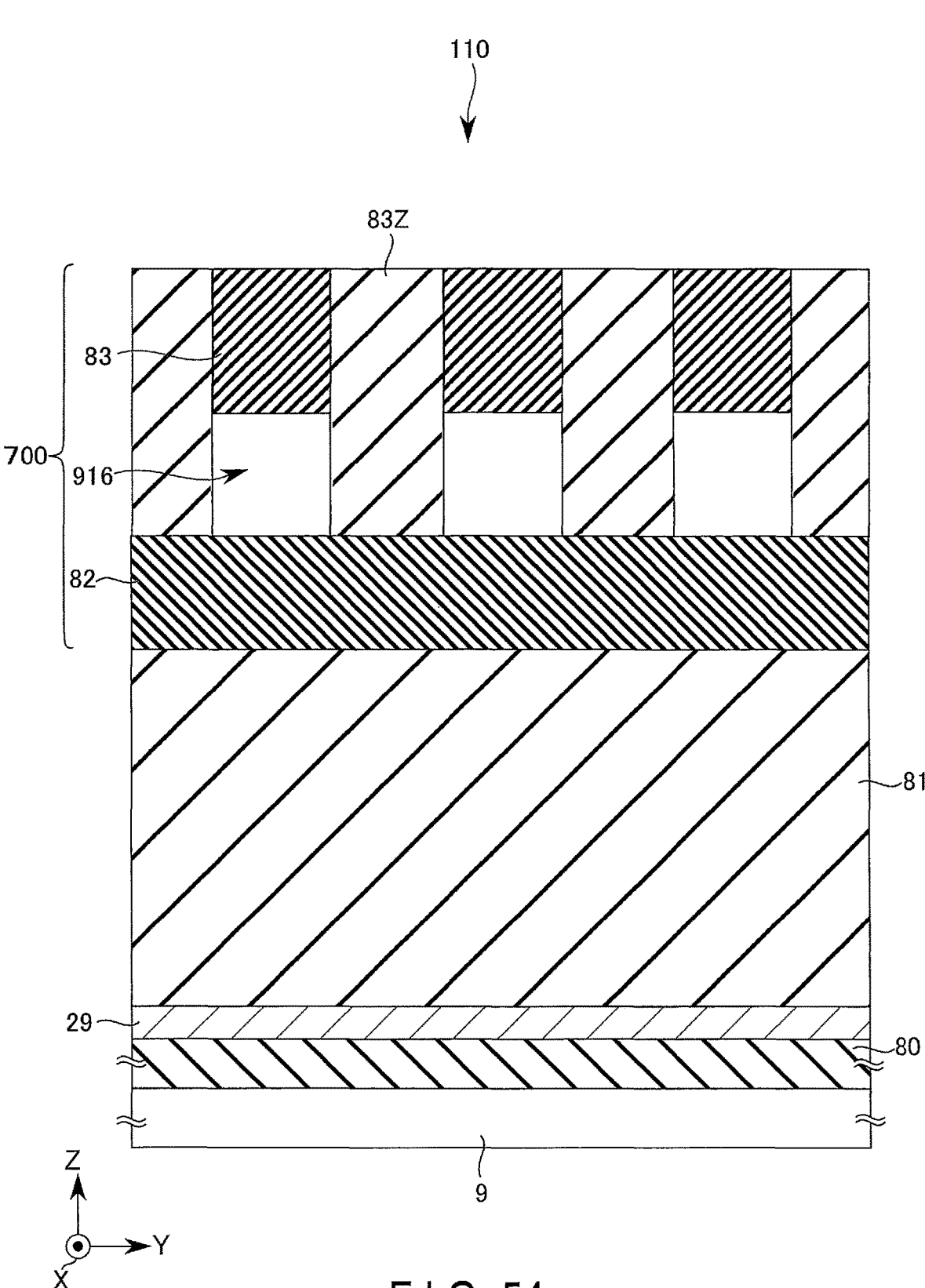
F I G. 54

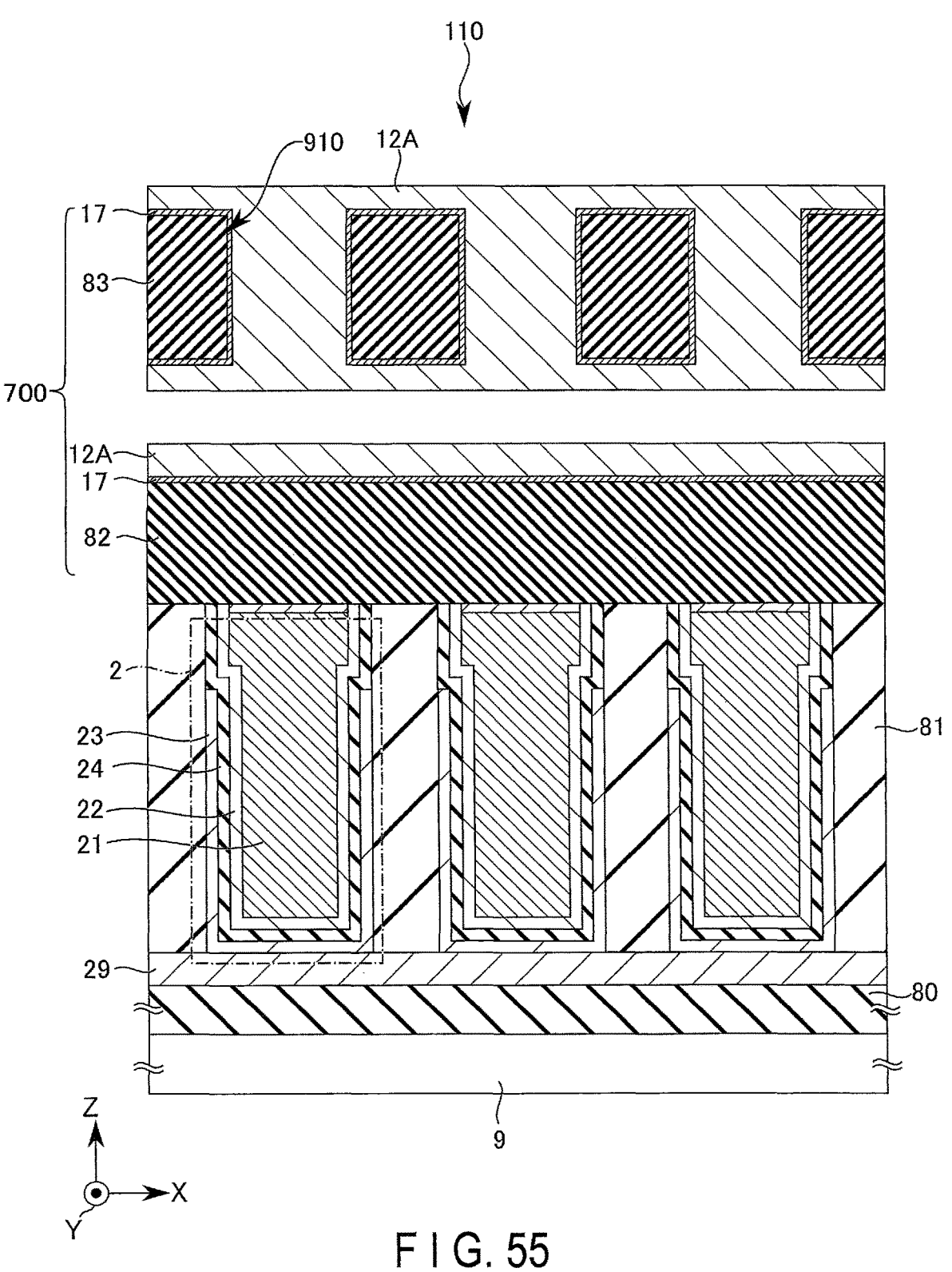
F I G. 55

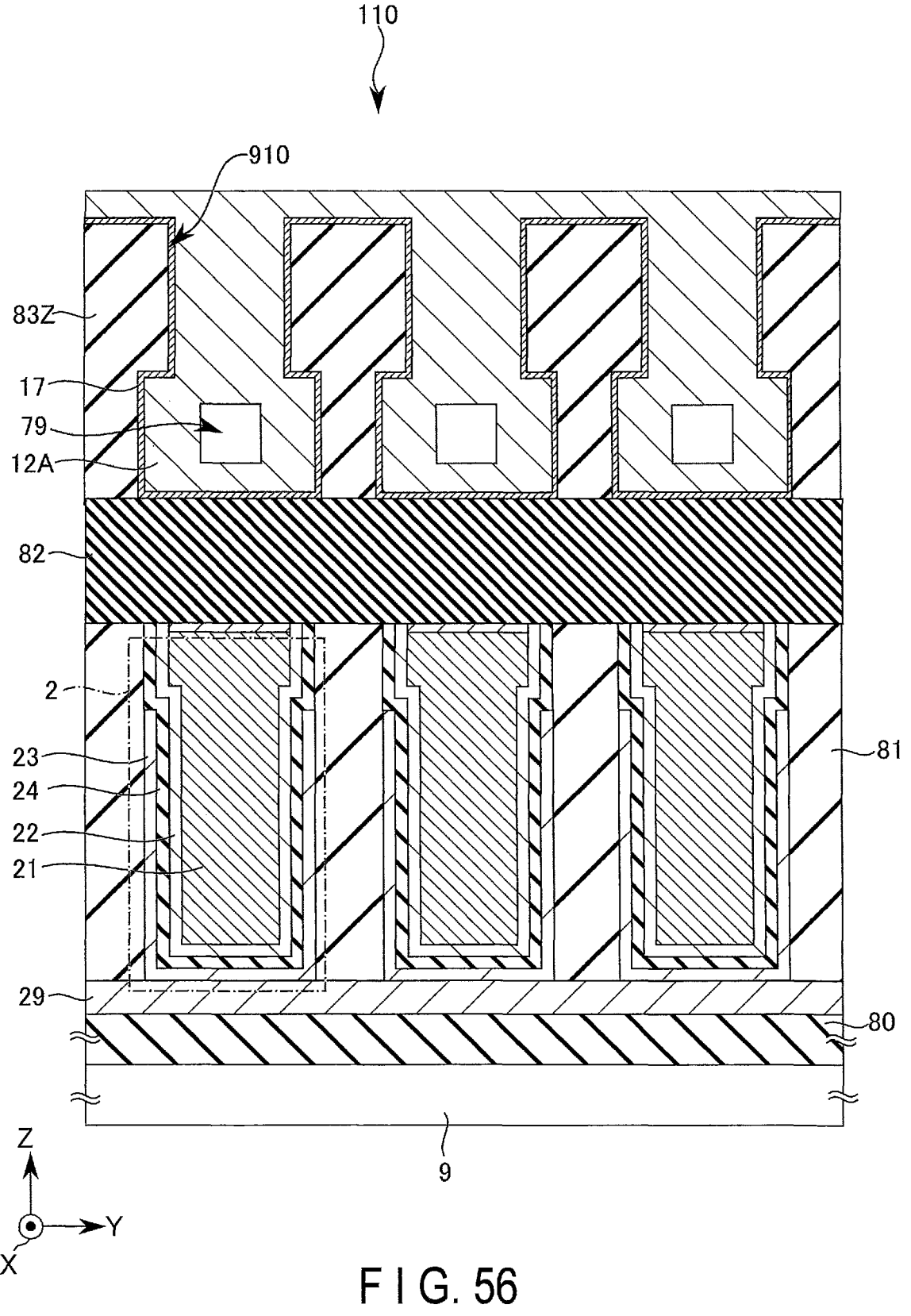
F I G. 56

110
83
83Z
17
79
12A
82
29
80
9
Z
Y
X
F I G. 57

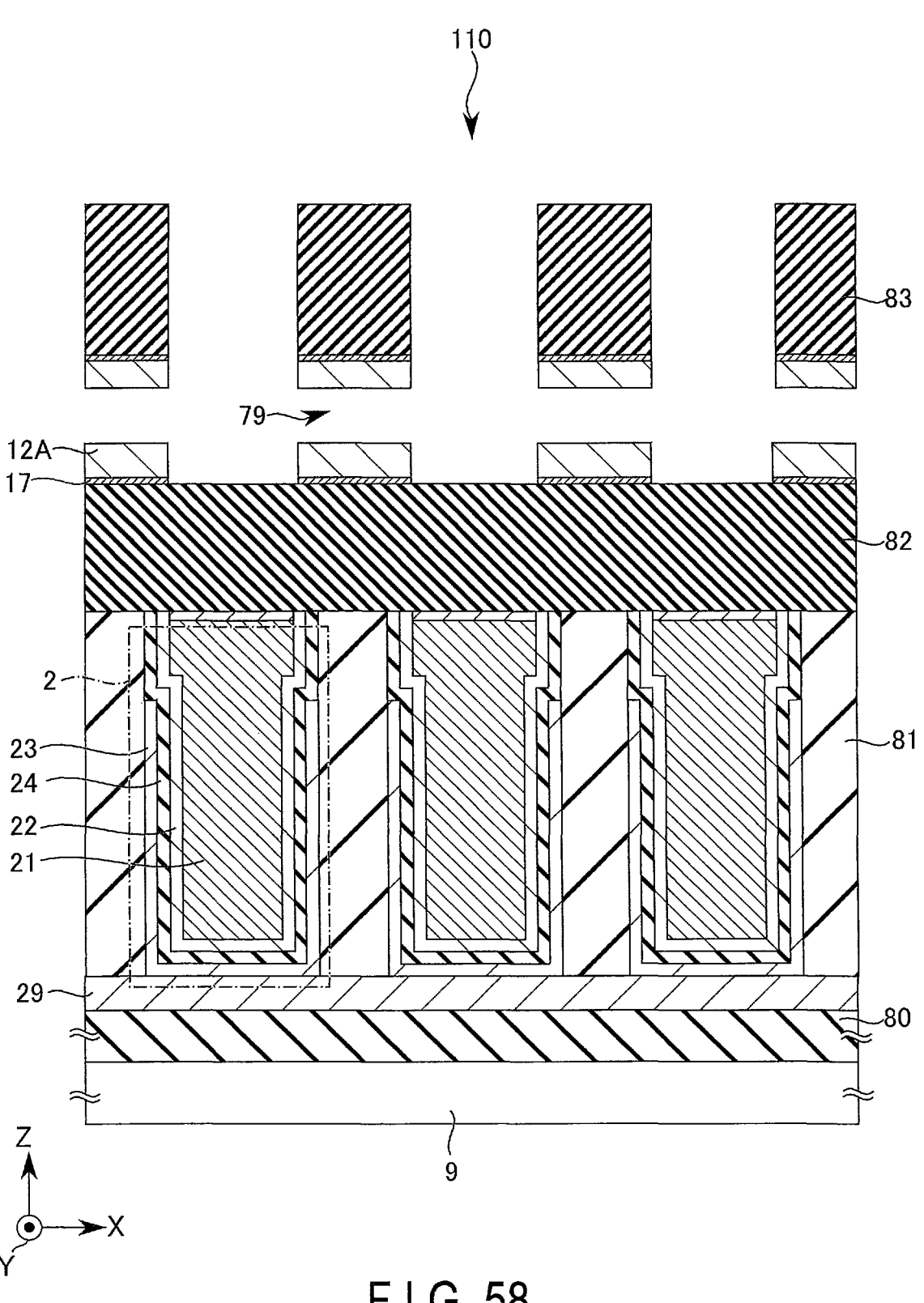
F I G. 58

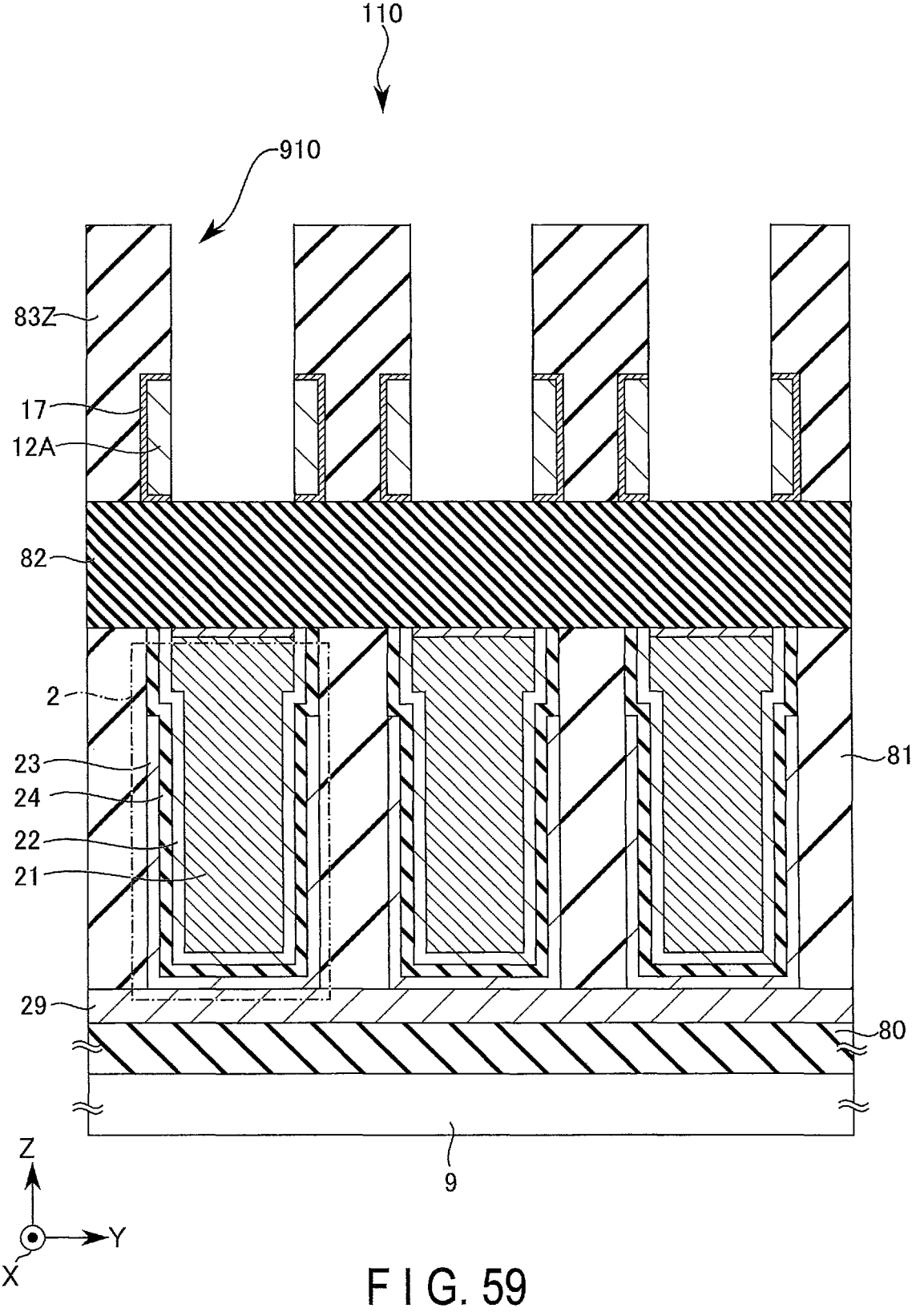
F I G. 59

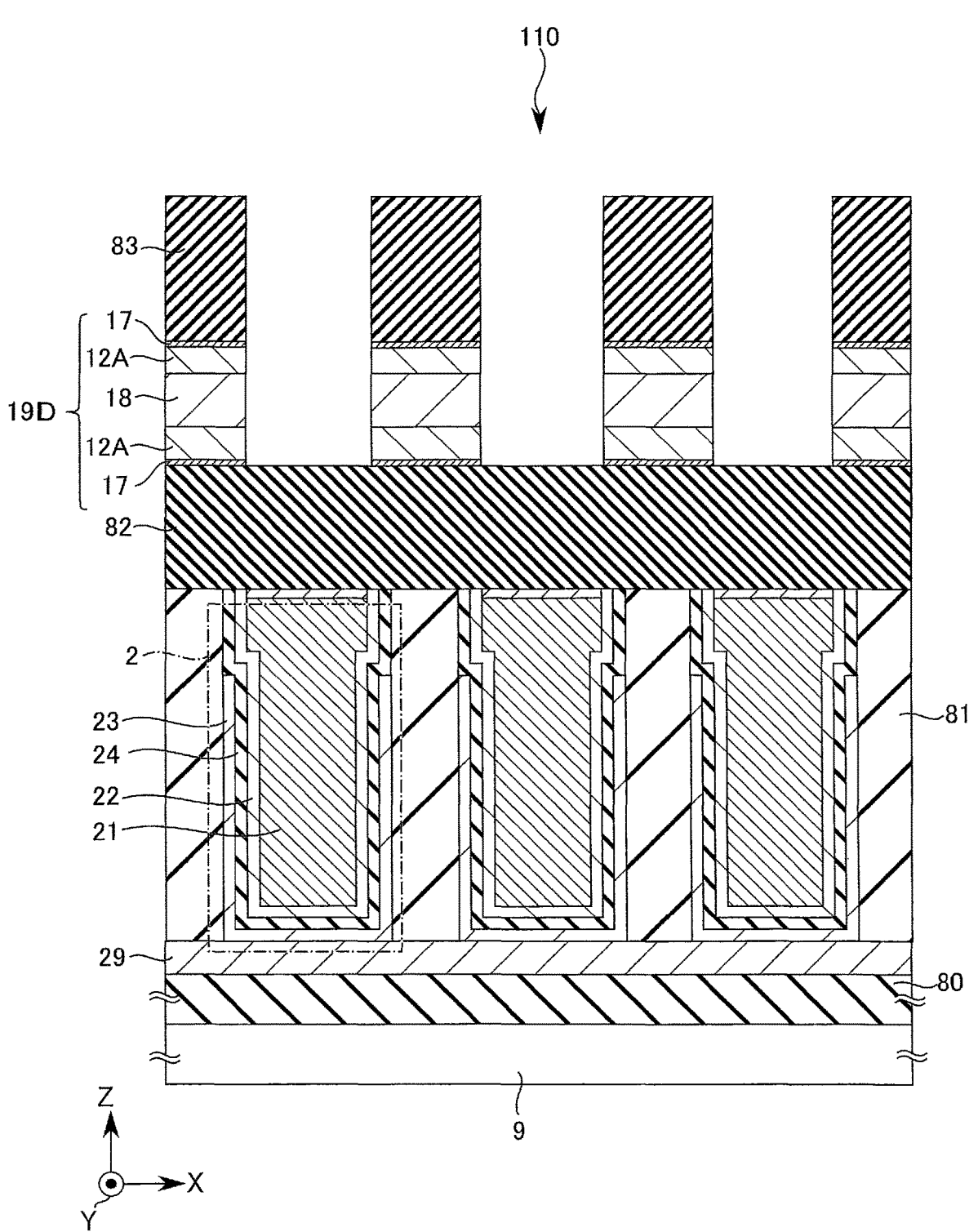
F I G. 60

110
83
75
17
18
12A
82
81
29
80
9
Z
X Y
F I G. 61

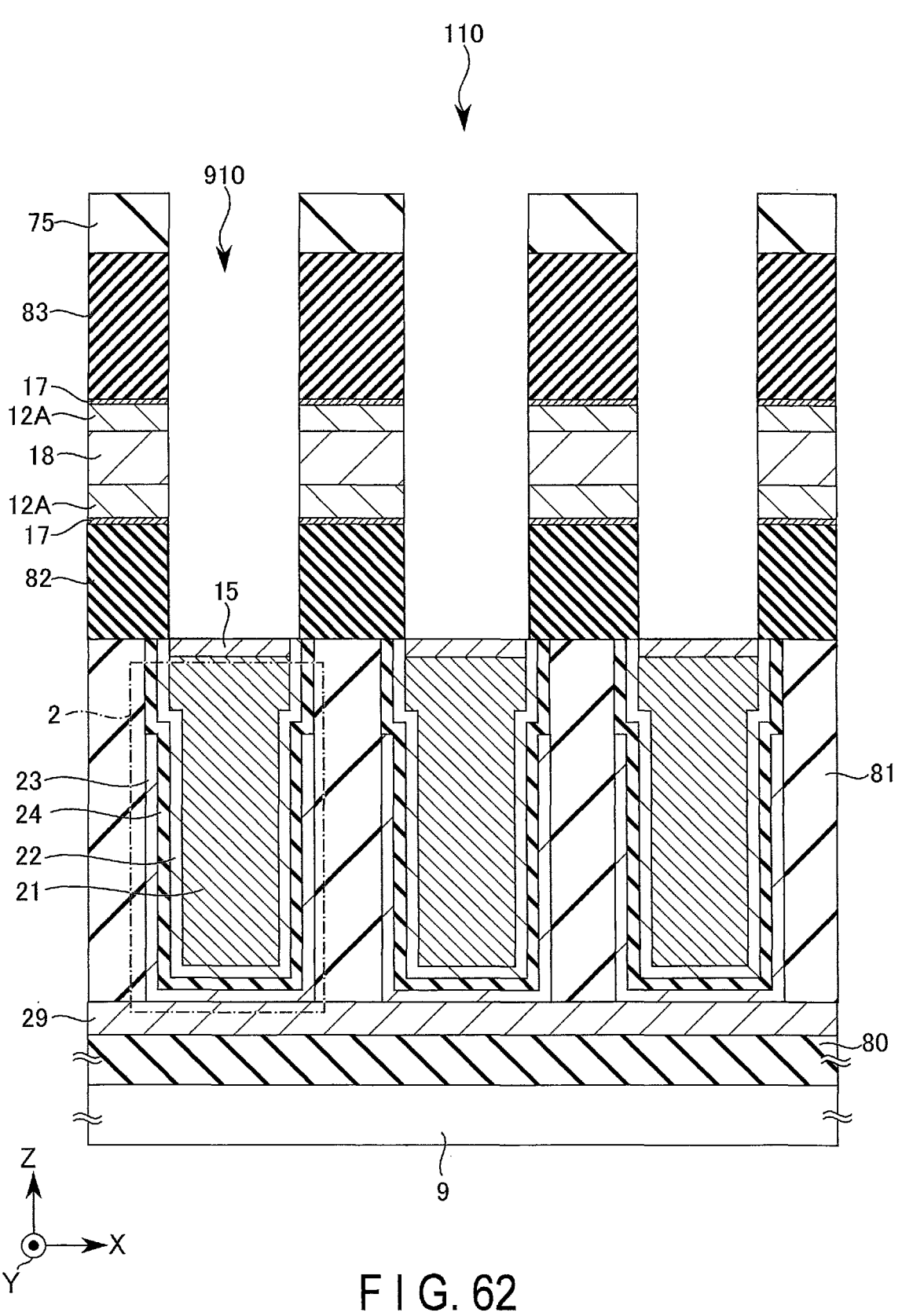
F I G. 62

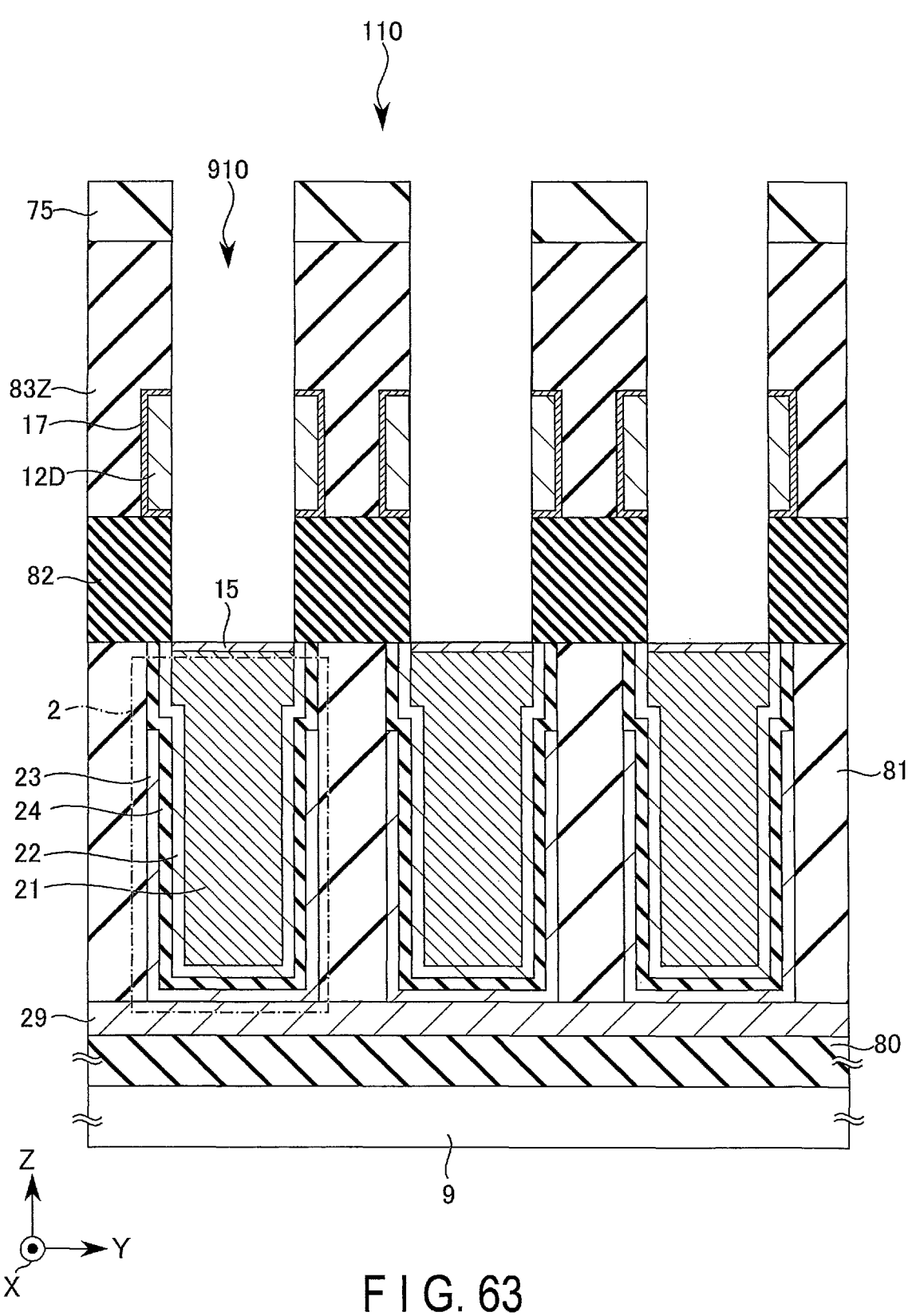
F I G. 63

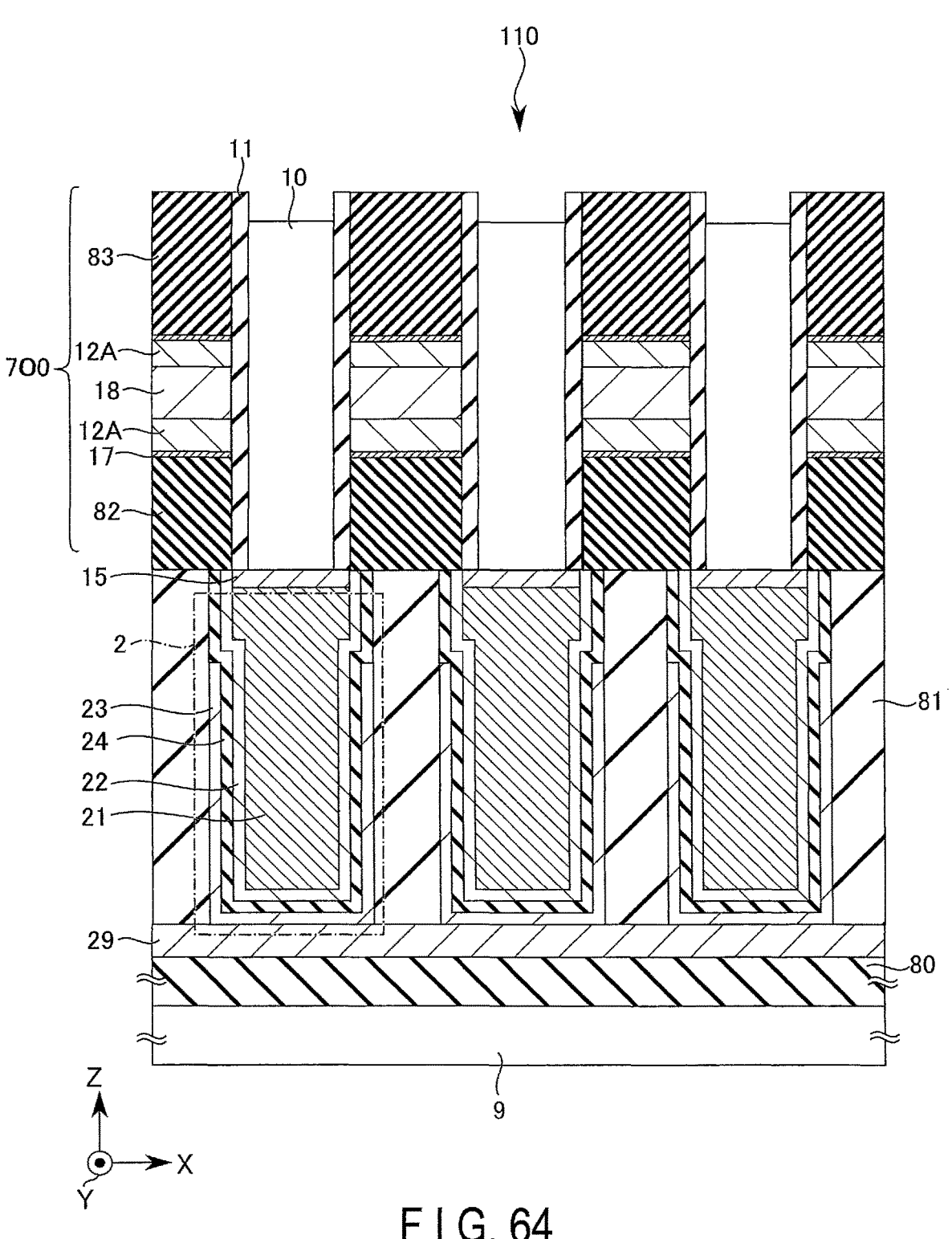
F I G. 64

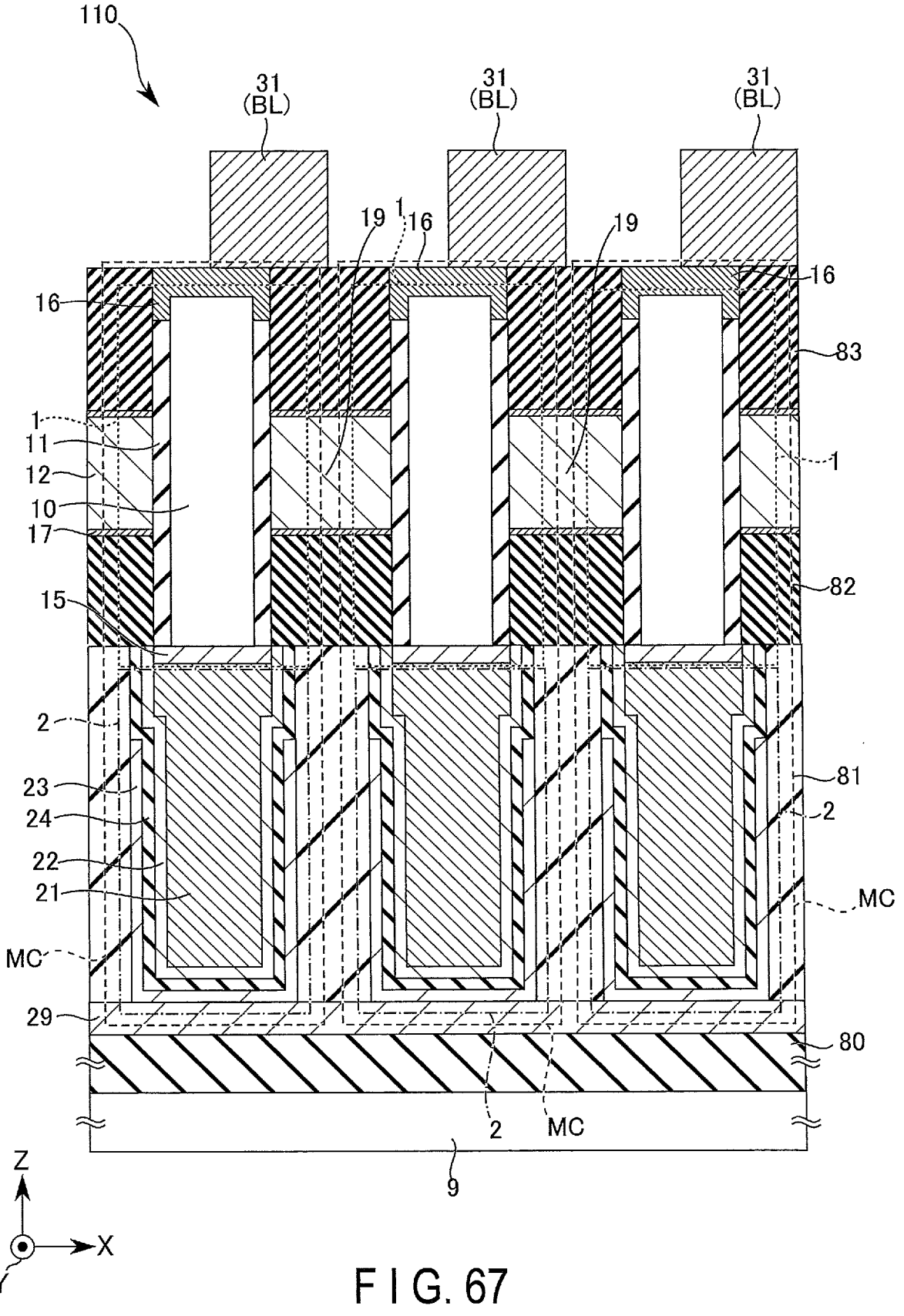
F I G. 67

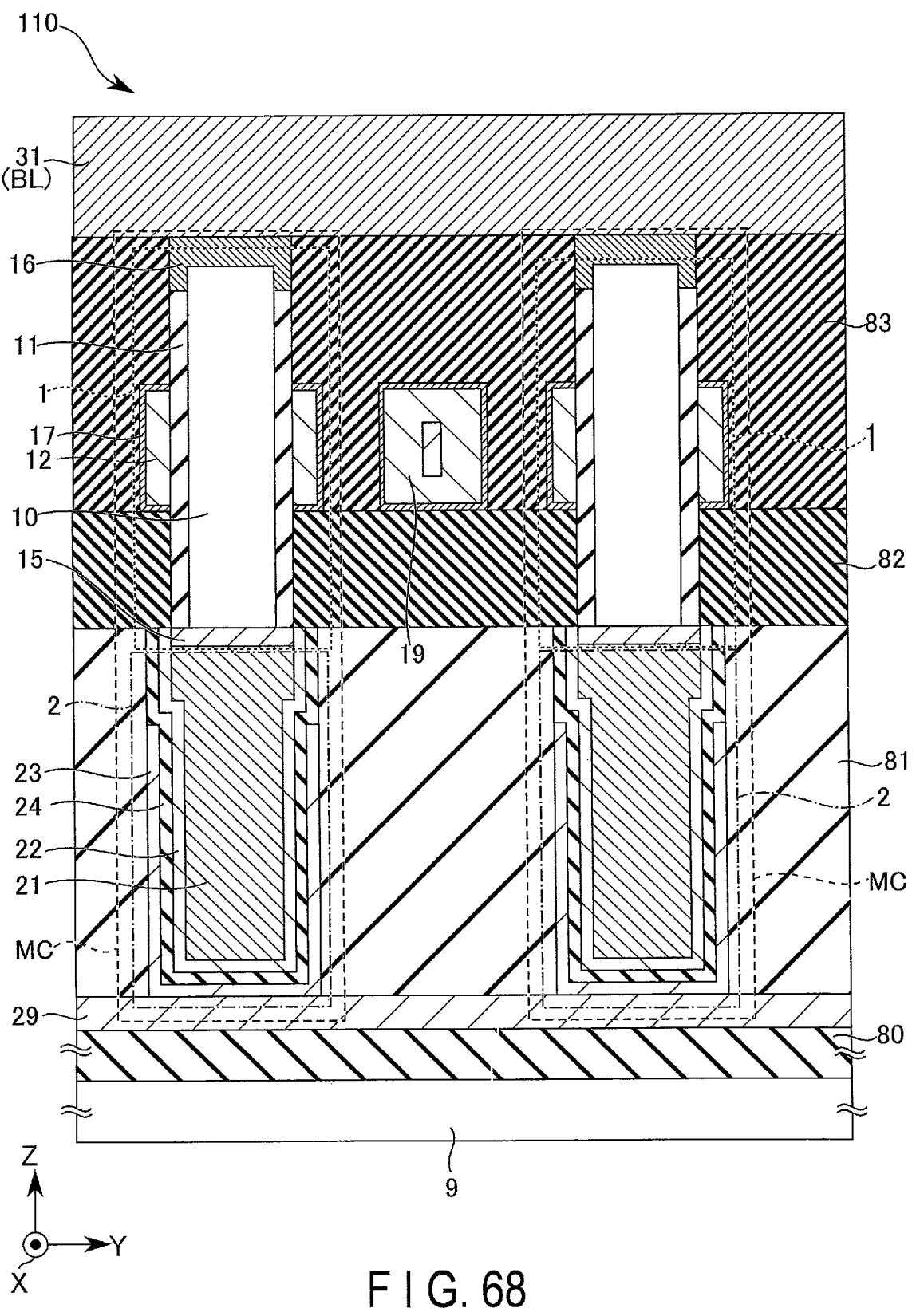
F I G. 68

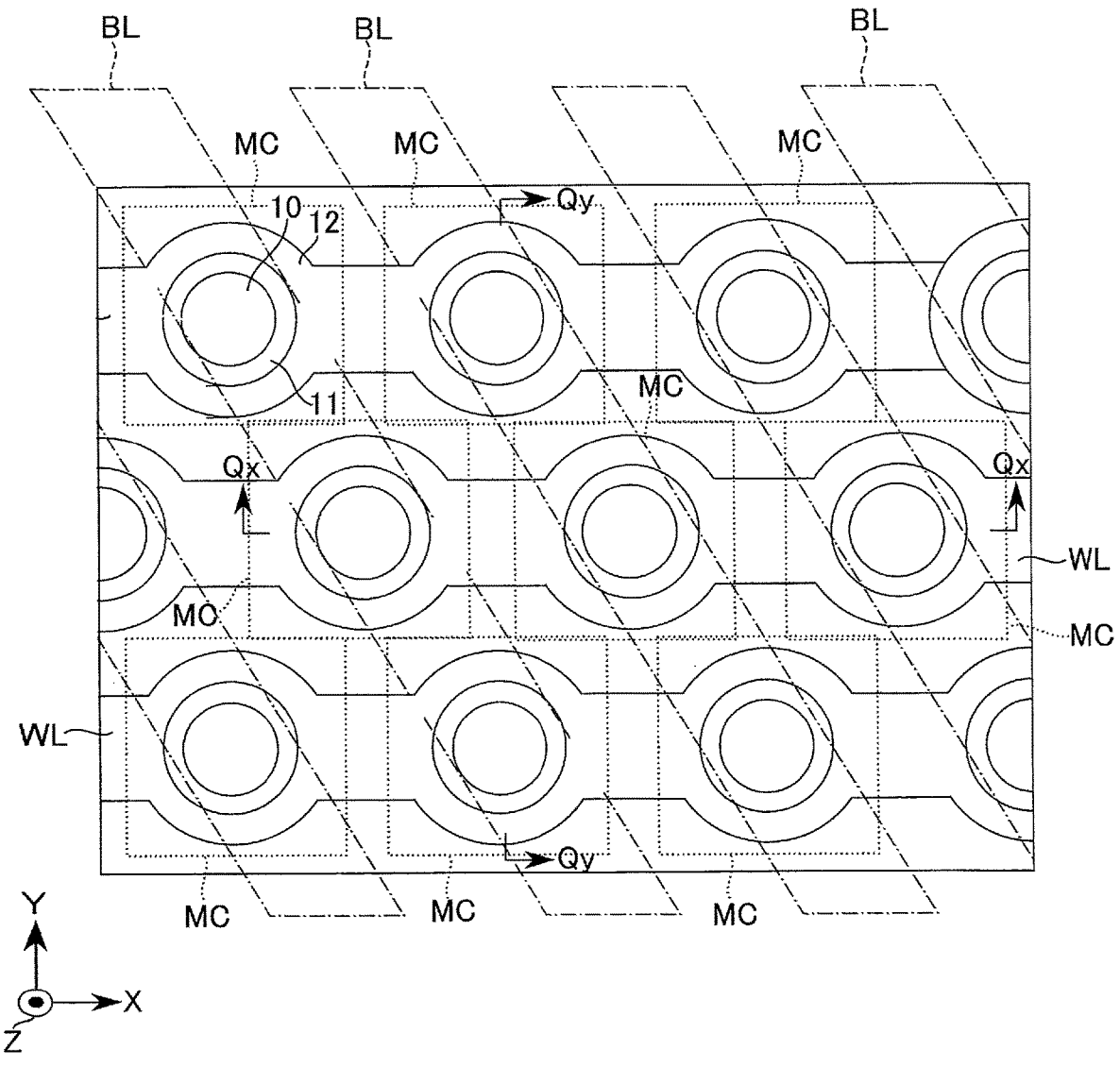
F I G. 69

110
F I G. 70

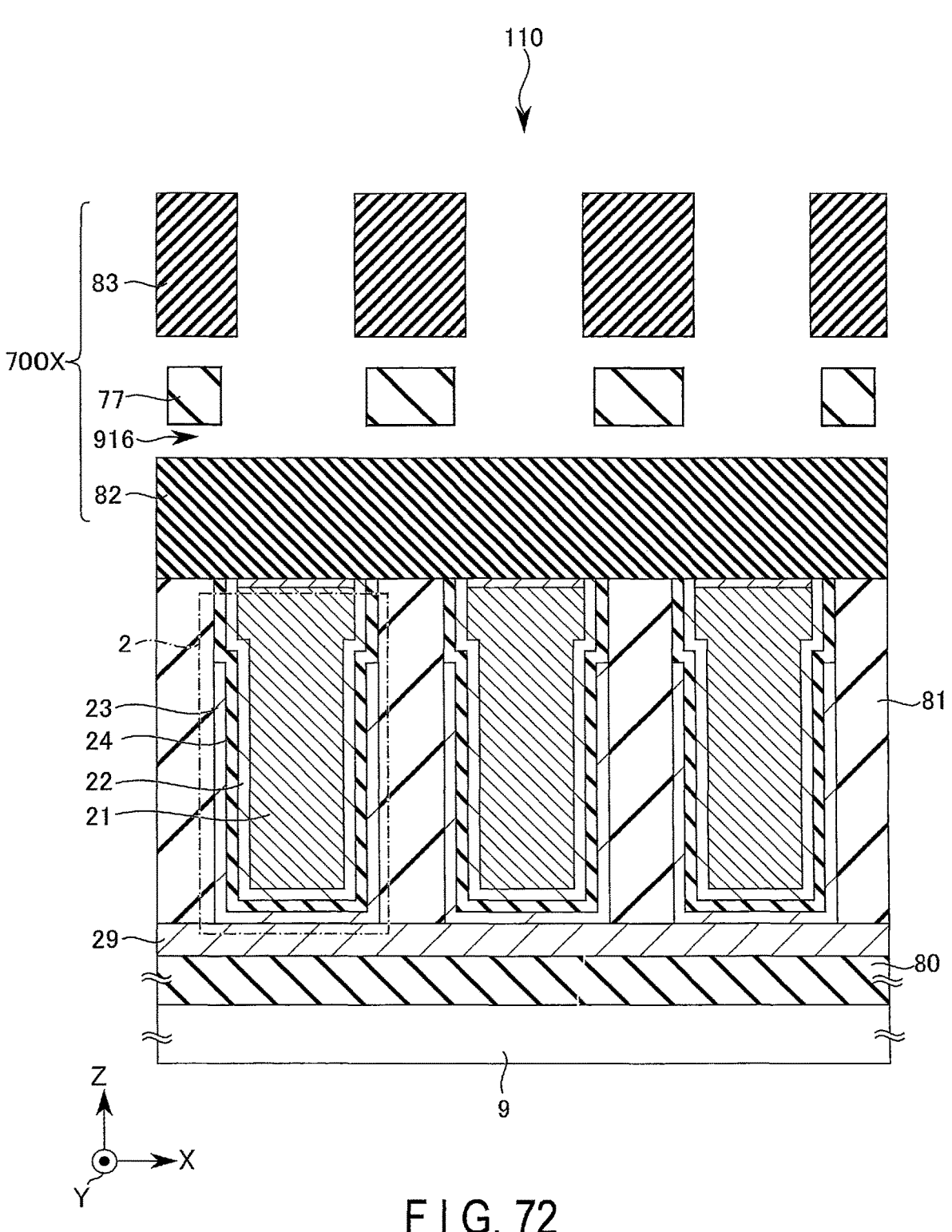
F I G. 72

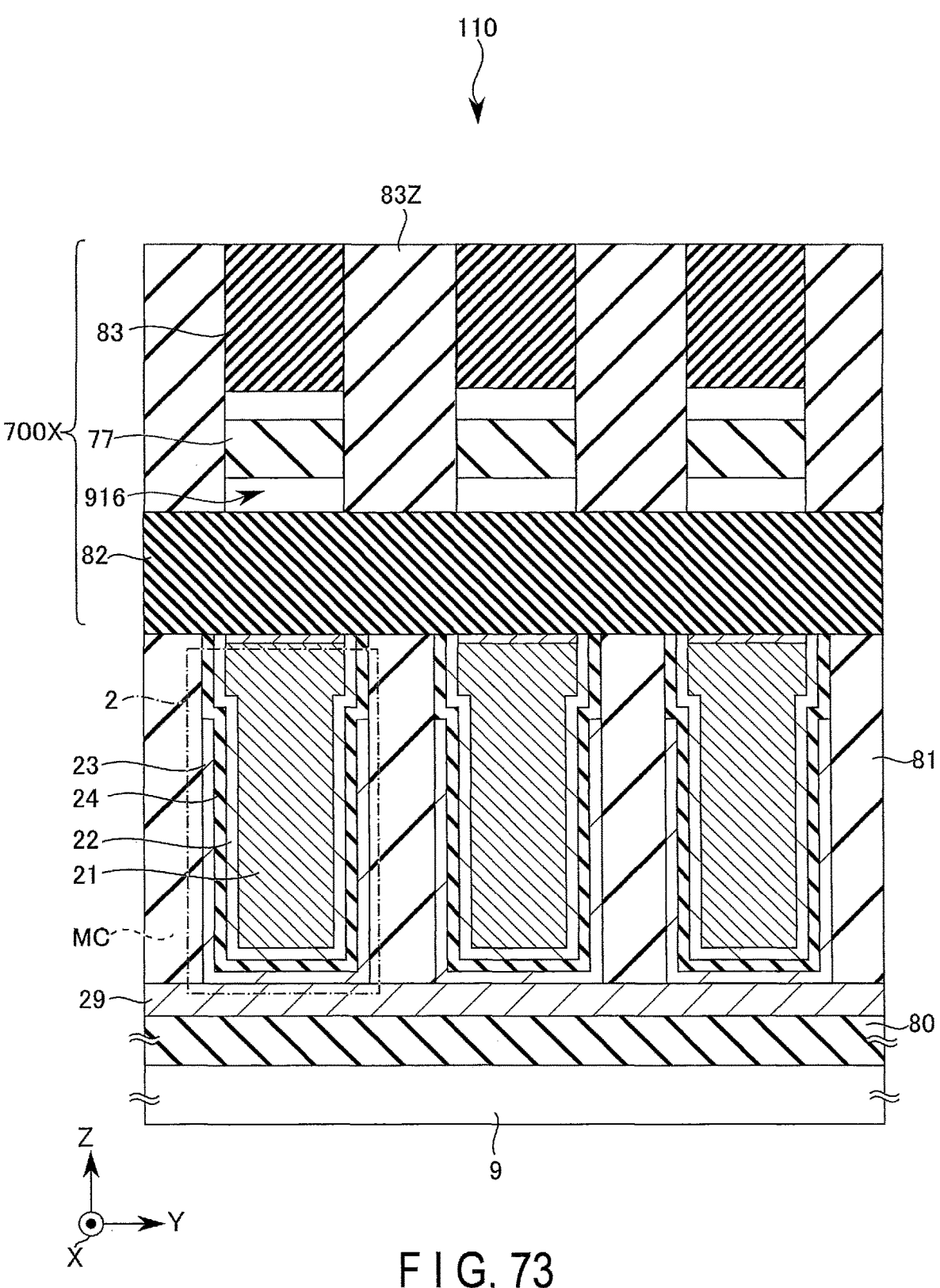
F I G. 73

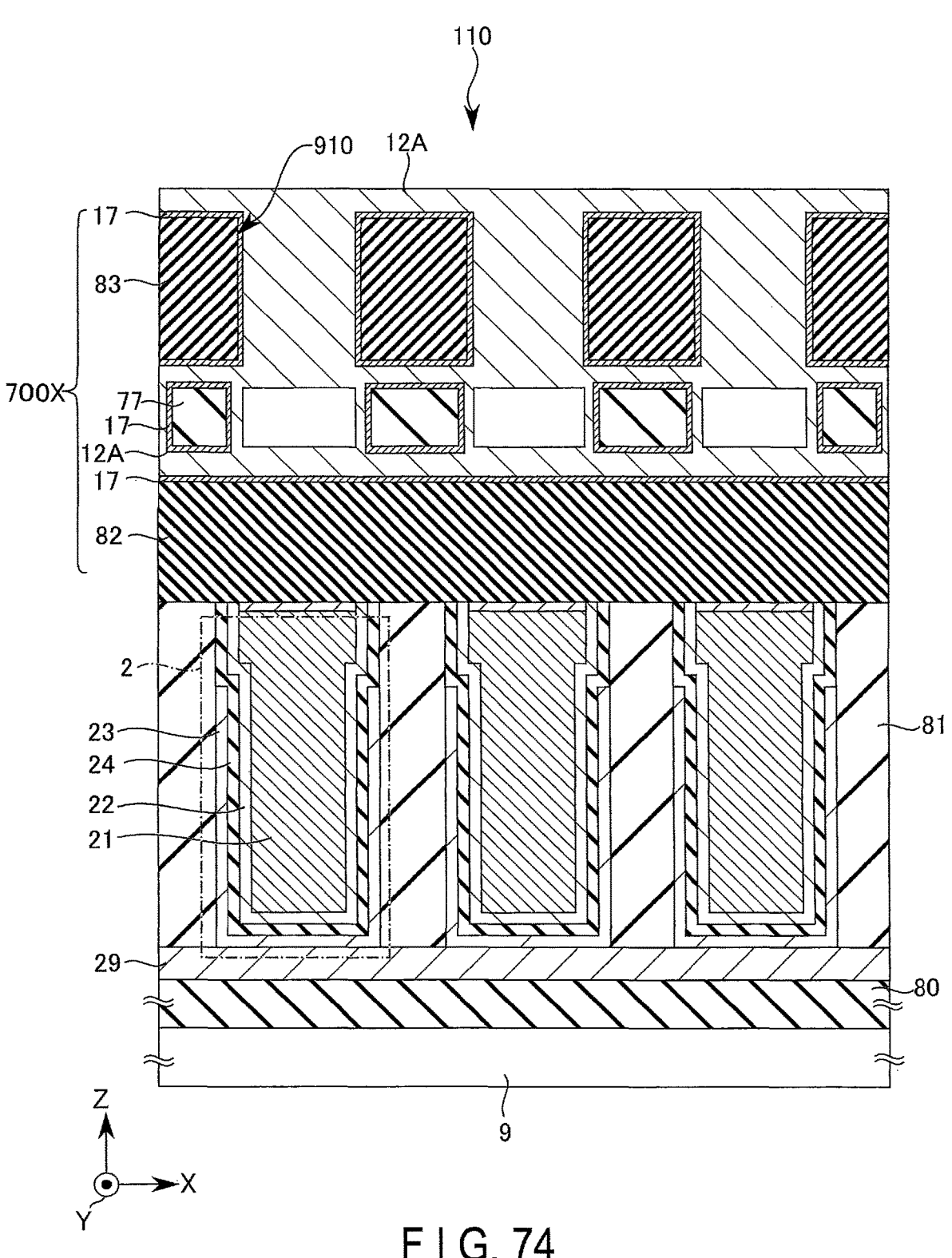
F I G. 74

110
83
83Z
17
12A
77
700X
82
2
23
24
22
21
29
81
80
9
Z
X
Y
F I G. 75

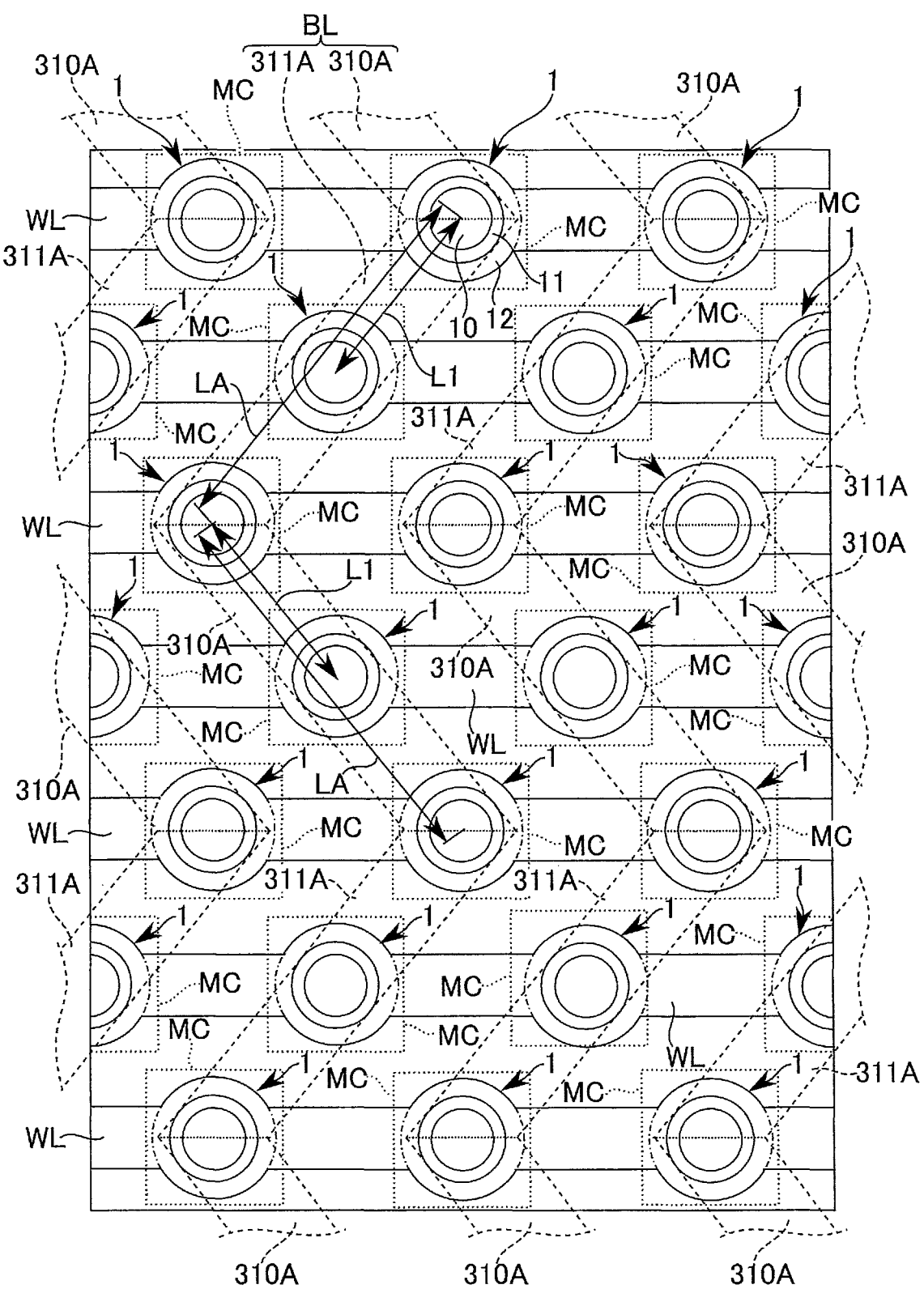
F I G. 77

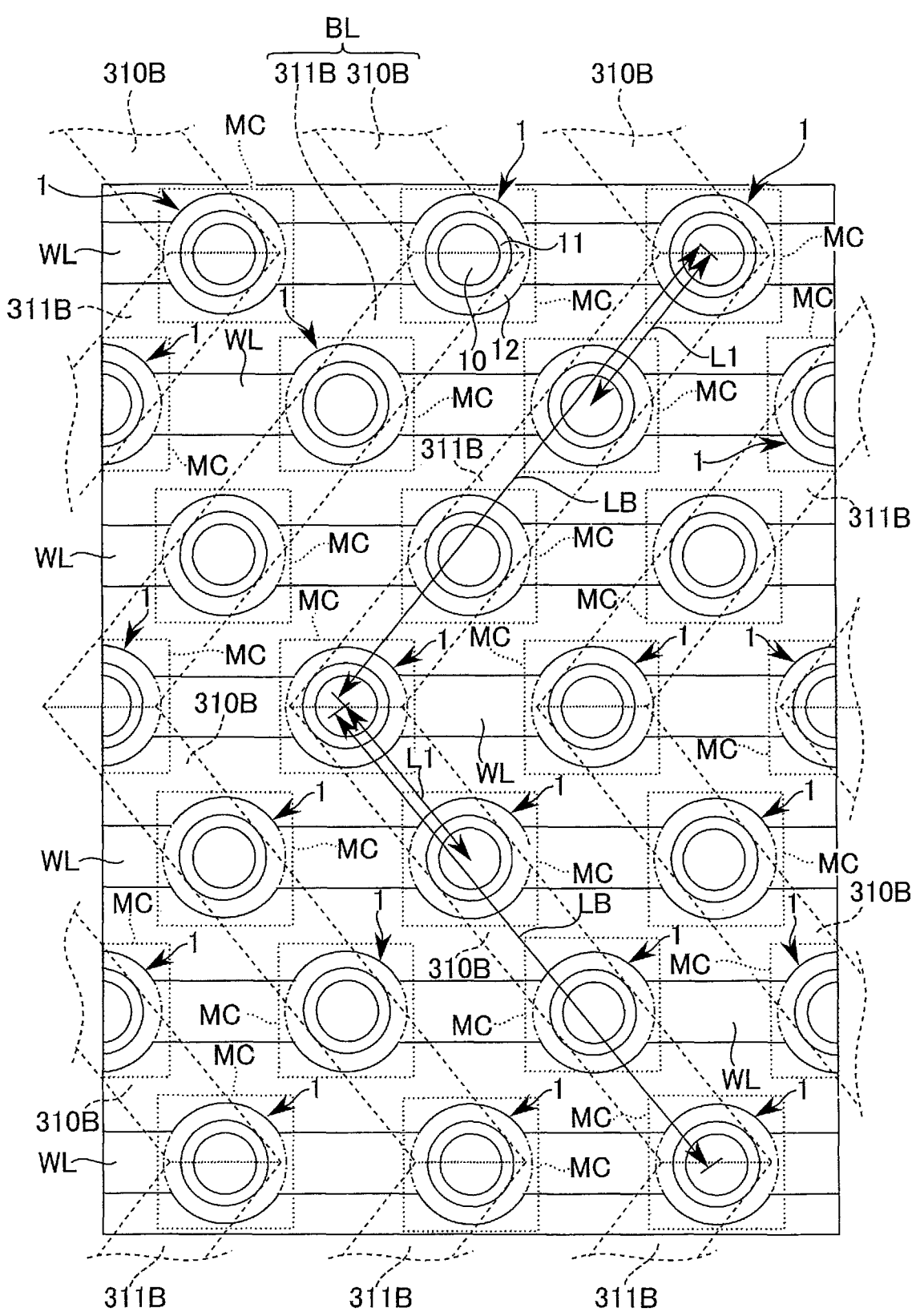
F I G. 78

MEMORY DEVICE AND METHOD OF MANUFACTURING MEMORY DEVICE

CROSS-REFERENCE TO RELATED APPLICATIONS

This application is a Continuation application of PCT Application No. PCT/JP2020/007831, filed Feb. 26, 2020 and based upon and claiming the benefit of priority from PCT Application No. PCT/JP2019/046242, filed Nov. 26, 2019, the entire contents of all of which are incorporated herein by reference.

FIELD

Embodiments described herein relate generally to a memory device and a method of manufacturing a semiconductor device.

BACKGROUND

Semiconductor memory devices are used for various electronic devices.

BRIEF DESCRIPTION OF THE DRAWINGS

FIG. 1 is a block diagram showing a configuration example of a memory device according to a first embodiment.

FIG. 2 is an equivalent circuit diagram of a memory cell array of the memory device according to the first embodiment.

FIG. 3 is a bird's-eye view showing a configuration example of a memory cell of the memory device according to the first embodiment.

FIG. 4 is a schematic cross-sectional view showing a configuration example of the memory device according to the first embodiment.

FIG. 5 is a schematic top view showing a configuration example of the memory device according to the first embodiment.

FIG. 6 is a schematic top view showing a configuration example of the memory device according to the first embodiment.

FIG. 7 is a schematic cross-sectional view showing a configuration example of the memory device according to the first embodiment.

FIG. 9 is a schematic cross-sectional view showing a step of a method of manufacturing the memory device according to the first embodiment.

FIG. 10 is a schematic cross-sectional view showing a step of the method of manufacturing the memory device according to the first embodiment.

FIG. 11 is a schematic cross-sectional view showing a step of the method of manufacturing the memory device according to the first embodiment.

FIG. 13 is a schematic cross-sectional view showing a step of the method of manufacturing the memory device according to the first embodiment.

FIG. 14 is a schematic cross-sectional view showing a step of the method of manufacturing the memory device according to the first embodiment.

FIG. 15 is a schematic cross-sectional view showing a step of the method of manufacturing the memory device according to the first embodiment.

FIG. 16 is a schematic cross-sectional view showing a step of the method of manufacturing the memory device according to the first embodiment.

FIG. 17 is a schematic cross-sectional view showing a step of the method of manufacturing the memory device according to the first embodiment.

FIG. 18 is a schematic cross-sectional view showing a step of the method of manufacturing the memory device according to the first embodiment.

FIG. 19 is a schematic top view showing a step of the method of manufacturing the memory device according to the first embodiment.

FIG. 20 is a schematic cross-sectional view showing a step of the method of manufacturing the memory device according to the first embodiment.

FIG. 21 is a schematic cross-sectional view showing a step of the method of manufacturing the memory device according to the first embodiment.

FIG. 22 is a schematic top view showing a step of the method of manufacturing the memory device according to the first embodiment.

FIG. 23 is a schematic cross-sectional view showing a step of the method of manufacturing the memory device according to the first embodiment.

FIG. 24 is a schematic cross-sectional view showing a step of the method of manufacturing the memory device according to the first embodiment.

FIG. 25 is a schematic cross-sectional view showing a step of the method of manufacturing the memory device according to the first embodiment.

FIG. 26 is a schematic cross-sectional view showing a step of the method of manufacturing the memory device according to the first embodiment.

FIG. 27 is a schematic top view showing a step of the method of manufacturing the memory device according to the first embodiment.

FIG. 28 is a schematic cross-sectional view showing a step of the method of manufacturing the memory device according to the first embodiment.

FIG. 29 is a schematic cross-sectional view showing a step of the method of manufacturing the memory device according to the first embodiment.

FIG. 30 is a schematic cross-sectional view showing a step of the method of manufacturing the memory device according to the first embodiment.

FIG. 31 is a schematic cross-sectional view showing a step of the method of manufacturing the memory device according to the first embodiment.

FIG. 32 is a schematic cross-sectional view showing a step of the method of manufacturing the memory device according to the first embodiment.

FIG. 33 is a schematic cross-sectional view showing a step of the method of manufacturing the memory device according to the first embodiment.

FIG. 34 is a schematic cross-sectional view showing a step of the method of manufacturing the memory device according to the first embodiment.

FIG. 35 is a schematic cross-sectional view showing a step of the method of manufacturing the memory device according to the first embodiment.

FIG. 36 is a schematic top view showing a configuration example of a memory device according to a second embodiment.

FIG. 37 is a schematic cross-sectional view showing a configuration example of the memory device according to the second embodiment.

FIG. 38 is a schematic cross-sectional view showing a configuration example of the memory device according to the second embodiment.

FIG. 39 is a schematic cross-sectional view showing a configuration example of the memory device according to the second embodiment.

FIG. 40 is a schematic top view showing a step of a method of manufacturing the memory device according to the second embodiment.

FIG. 41 is a schematic cross-sectional view showing a step of the method of manufacturing the memory device according to the second embodiment.

FIG. 42 is a schematic top view showing a step of the method of manufacturing the memory device according to the second embodiment.

FIG. 46 is a schematic cross-sectional view showing a step of the method of manufacturing the memory device according to the second embodiment.

FIG. 47 is a schematic cross-sectional view showing a step of the method of manufacturing the memory device according to the second embodiment.

FIG. 48 is a schematic cross-sectional view showing a step of the method of manufacturing the memory device according to the second embodiment.

FIG. 49 is a schematic cross-sectional view showing a step of the method of manufacturing the memory device according to the second embodiment.

FIG. 50 is a schematic cross-sectional view showing a step of the method of manufacturing the memory device according to the second embodiment.

FIG. 51 is a schematic cross-sectional view showing a step of the method of manufacturing the memory device according to the second embodiment.

FIG. 52 is a schematic cross-sectional view showing a step of the method of manufacturing the memory device according to the second embodiment.

FIG. 53 is a schematic cross-sectional view showing a step of the method of manufacturing the memory device according to the second embodiment.

FIG. 54 is a schematic cross-sectional view showing a step of the method of manufacturing the memory device according to the second embodiment.

FIG. 55 is a schematic cross-sectional view showing a step of the method of manufacturing the memory device according to the second embodiment.

FIG. 56 is a schematic cross-sectional view showing a step of the method of manufacturing the memory device according to the second embodiment.

FIG. 57 is a schematic cross-sectional view showing a step of the method of manufacturing the memory device according to the second embodiment.

FIG. 58 is a schematic cross-sectional view showing a step of the method of manufacturing the memory device according to the second embodiment.

FIG. 59 is a schematic cross-sectional view showing a step of the method of manufacturing the memory device according to the second embodiment.

FIG. 60 is a schematic cross-sectional view showing a step of the method of manufacturing the memory device according to the second embodiment.

FIG. 61 is a schematic cross-sectional view showing a step of the method of manufacturing the memory device according to the second embodiment.

FIG. 62 is a schematic cross-sectional view showing a step of the method of manufacturing the memory device according to the second embodiment.

FIG. 63 is a schematic cross-sectional view showing a step of the method of manufacturing the memory device according to the second embodiment.

FIG. 64 is a schematic cross-sectional view showing a step of the method of manufacturing the memory device according to the second embodiment.

FIG. 67 is a schematic cross-sectional view showing a configuration example of the memory device according to the third embodiment.

FIG. 68 is a schematic cross-sectional view showing a configuration example of the memory device according to the third embodiment.

FIG. 69 is a schematic top view showing a configuration example of the memory device according to the third embodiment.

FIG. 70 is a schematic cross-sectional view showing a step of a method of manufacturing a memory device according to a fourth embodiment.

FIG. 72 is a schematic cross-sectional view showing a step of the method of manufacturing the memory device according to the fourth embodiment.

FIG. 73 is a schematic cross-sectional view showing a step of the method of manufacturing the memory device according to the fourth embodiment.

FIG. 74 is a schematic cross-sectional view showing a step of the method of manufacturing the memory device according to the fourth embodiment.

FIG. 75 is a schematic cross-sectional view showing a step of the method of manufacturing the memory device according to the fourth embodiment.

FIG. 77 is a schematic top view showing a configuration example of a memory device according to a fifth embodiment.

FIG. 78 is a schematic top view showing a configuration example of the memory device according to the fifth embodiment.

DETAILED DESCRIPTION

Figure 8:
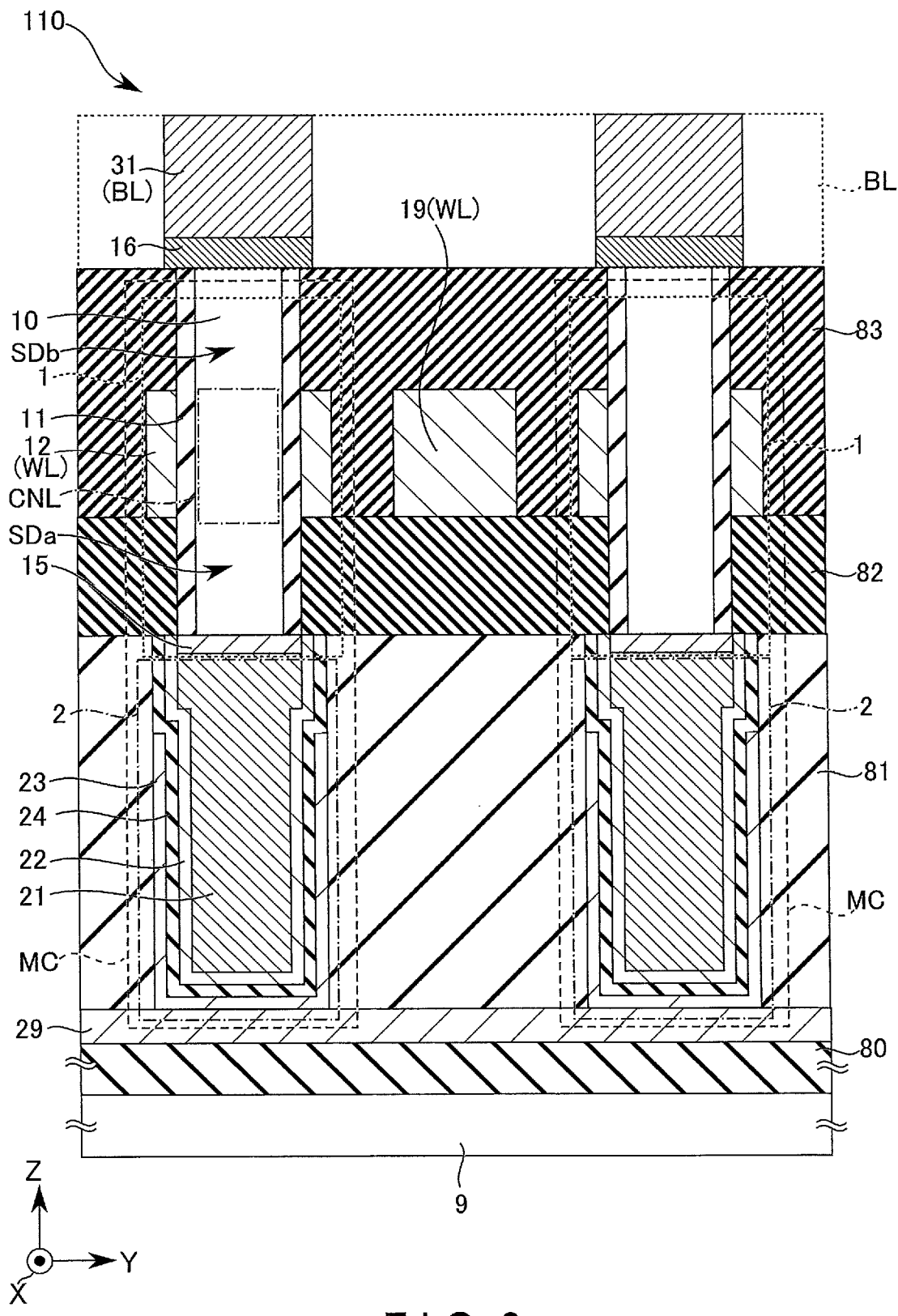
FIG. 8 is a schematic cross-sectional view showing a configuration example of the memory device according to the first embodiment.

Hereinafter, the embodiments will be described with reference to the drawings. In the description below, constituent elements having the same functions and configurations will be assigned a common reference symbol. If a plurality of constituent elements having a common reference symbol are distinguished from each other, an additional symbol is added after the common reference symbol. If there is no need to distinguish constituent elements from each other, the constituent elements are assigned only a common reference symbol without an additional symbol.

In general, according to one embodiment, a memory device includes: a substrate; a first bit line provided above the substrate; a first transistor including: a first semiconductor layer provided between the substrate and the first bit line; a first gate electrode facing a side surface of the first semiconductor layer; and a first gate insulating layer provided between the first semiconductor layer and the first gate electrode; a first memory element provided between the first transistor and the substrate; a first word line including a first conductive layer coupled to the first gate electrode; a second transistor including: a second semiconductor layer provided between the substrate and the first bit line; a second gate electrode facing a side surface of the second semiconductor layer; and a second gate insulating layer provided between the second semiconductor layer and the second gate electrode; a second memory element provided between the second transistor and the substrate; and a second word line that is adjacent to the first word line in a first direction in parallel to a surface of the substrate and that includes a second conductive layer coupled to the second gate electrode, wherein the second semiconductor layer is adjacent to the first semiconductor layer in a second direction that is in parallel to the surface of the substrate and intersects the first direction.

(1) First Embodiment

A memory device and a method of manufacturing the memory device according to the first embodiment will be described with reference to FIG. 1 to FIG. 35.

(1a) Configuration Example

A configuration example of the memory device according to the present embodiment will be described with reference to FIG. 1 to FIG. 8.

<Circuit Configuration>

FIG. 1 is a block diagram showing a configuration example of the memory device according to the present embodiment.

As shown in FIG. 1, a memory device 100 according to the present embodiment includes a memory cell array 110, a row control circuit 120, a column control circuit 130, a sense amplifier circuit 140, a control circuit 190, etc. Hereinafter, a set of these circuits 120, 130, 140, and 190 (a circuit group) for driving the memory cell array 110 will be referred to as a CMOS circuit (or a peripheral circuit).

The memory cell array 110 stores data. Data is written in the memory cell array 110. Data is read from the memory cell array 110. Hereinafter, data written into the memory cell array 110 will be referred to as write data. Data read from the memory cell array 110 will be referred to as read data.

The memory cell array 110 includes a plurality of memory cells MC, a plurality of word lines WL, and a plurality of bit lines BL. Each memory cell MC is coupled to at least one word line WL and to at least one bit line BL. The memory cell MC is capable of storing data of 1 bit or more.

For example, the memory device 100 according to the present embodiment is a dynamic random access memory (DRAM). Each memory cell MC in the DRAM 100 includes a field effect transistor (hereinafter also referred to as a cell transistor) and a capacitance element (hereinafter also referred to as a cell capacitor).

The row control circuit (also referred to as a row decoder) 120 controls rows (for example, word lines) of the memory cell array 110. The row control circuit 120 performs selection or non-selection (activation/deactivation) of a word line WL corresponding to an address ADR, supply of voltage to the word line WL, and so on. For example, the row control circuit 120 includes a driver circuit 121, an address decode circuit 122, and a switch circuit (a selector).

The column control circuit (also referred to as a column decoder) 130 controls columns (for example, bit lines) of the memory cell array 110. The column control circuit 130 selects or does not select (activates/deactivates) a bit line BL corresponding to an address ADR, supplies voltage to the bit line BL, and so on.

For example, the column control circuit 130 includes a driver circuit 131, an address decode circuit 132, a sense amplifier circuit 133, a switch circuit, etc.

A read/write circuit 140 writes data into the memory cell array 110 (write operation) and reads data from the memory cell array 110 (read operation). When writing data, the read/write circuit 140 transmits a signal (voltage or current) in accordance with data to be written into the memory cell array 110 (hereinafter referred to as write data) to the memory cell array 110 via the column control circuit 130. When reading data, the read/write circuit 140 receives a signal (voltage or current) in accordance with data read from the memory cell array 110 (hereinafter referred to as read data) from the memory cell array 110 via the column control circuit 130.

Meanwhile, a circuit for writing data and a circuit for reading data may be provided in such a manner as to be independent from each other in the memory device 100.

The input/output circuit (hereinafter also referred to as an I/O circuit) 150 functions as an interface circuit between the memory device 100 and another device 200. The I/O circuit 150 receives a command CMD, an address ADR, data (e.g., write data) DT, and a plurality of control signals CNT, etc., from the device 200. The I/O circuit 150 transmits the control signal CNT and data (e.g., read data) DT to an outside of the memory device 100.

The control circuit (also referred to as, e.g., an internal controller, a sequencer, etc.) 190 controls other circuits 120 to 150 in accordance with operations to be executed by the memory device 100 based on the command CMD and the control signal CNT. In the case of the memory device 100 being a DRAM, the control circuit 190 controls and executes refresh (refresh operation) of data in the memory cell array 110, in addition to writing of data and reading of data.

For example, the control circuit 190 controls the circuits 120 to 150 at a timing in synchronization with a clock signal CLK. As a result, writing of data and reading of data are executed at a timing in synchronization with the clock signal CLK. The clock signal CLK is generated inside the memory device 100 or is supplied by another device 200.

For example, the control circuit 190 includes a register circuit, a command decode circuit, etc.

The memory device 100 is electrically coupled to the processor (or a host device) 200.

The memory device 100 operates in accordance with an order from the processor 200. The memory device 100 receives the address ADR, the command CMD, the data (e.g., write data) DT, and the control signal from the processor 200. The memory device 100 transmits the control signal and the data (read data) DT to the processor 200.

Meanwhile, the memory device 100 may further include a refresh control circuit, a clock generation circuit, an internal voltage generation circuit, etc.

<Memory Cell Array>

An internal configuration of the memory cell array in the memory device according to the present embodiment will be described with reference to FIG. 2 and FIG. 3.

FIG. 2 is an equivalent circuit diagram for illustrating a configuration example of the memory cell array in the memory device according to the present embodiment.

The memory device 100 according to the present embodiment is a DRAM.

As described in the above, the memory cell array 110 includes the plurality of memory cells MC.

The plurality of memory cells MC are arranged in a matrix form in a plane including an X direction and a Y direction (hereinafter referred to as a plane X-Y) in the memory cell array 110.

One terminal (one end) of each memory cell MC is coupled to a bit line BL.

The other terminal (the other end) of the memory cell MC is coupled to a plate line (plate electrode) PL.

A control terminal of the memory cell MC is coupled to a word line WL.

The plurality of memory cells MC aligned in the X direction are coupled to the same word line WL. The plurality of memory cells MC aligned in the Y direction are coupled to the same bit line BL. The plurality of memory cells MC in a certain control unit are coupled to the same plate line PL.

As described in the above, each memory cell MC includes a cell transistor (hereinafter also simply referred to as a transistor) 1 and a cell capacitor (hereinafter also simply referred to as a capacitor) 2.

The cell transistor 1 switches connection between the memory cell MC and the bit line BL. The cell transistor 1 functions as a select element of the memory cell MC. The cell capacitor 2 retains the amount of charge associated with data of 1 bit or more. The cell capacitor 2 functions as a memory element of the memory cell MC.

One terminal (one of source/drain) of the cell transistor 1 is coupled as a terminal of the memory cell MC to the bit line BL.

The other terminal (the other of source/drain) of the cell transistor 1 is coupled to one terminal (one end) of the cell capacitor 2 via a node ND.

The other terminal (the other end) of the cell capacitor 2 is coupled as the terminal of the memory cell MC to the plate line PL.

A gate of the cell transistor 1 is coupled to the word line WL. The gate of the cell transistor 1 serves as a control terminal of the memory cell MC.

<Memory Cell>

FIG. 3 is a bird's-eye view showing a configuration example of a memory cell in the DRAM according to the present embodiment.

In the present embodiment, as shown in FIG. 3, each memory cell MC is configured in such a manner that the cell transistor 1 is provided above the cell capacitor 2 in a Z direction. The Z direction is perpendicular to the plane X-Y. The Z direction intersects the X direction and the Y direction.

The cell capacitor 2 is provided above a substrate 9. The cell capacitor 2 includes two electrodes 22 and 23 and an insulating layer 24. The insulating layer (hereinafter also referred to as a capacitor insulating layer) 24 is provided between the two electrodes (hereinafter also referred to as capacitor electrodes) 22 and 23.

One capacitor electrode 23 is electrically coupled to the plate line PL above the substrate 9. The other capacitor electrode 22 is coupled to the source/drain of the cell transistor 1. The capacitor insulating layer 24 and the capacitor electrode 23 are provided between a bottom portion of the capacitor electrode 22 and the plate line PL. Accordingly, the capacitor electrode 22 is not in direct contact with the plate line PL.

The cell transistor 1 includes at least a semiconductor layer 10, a gate insulating layer 11, and a gate electrode 12. The semiconductor layer (hereinafter also referred to as a channel layer or a body portion) 10 has a pillar structure extending in the Z direction. The gate electrode 12 faces a side surface of the pillar-shaped semiconductor layer 10 with the gate insulating layer 11 intervening therebetween. The gate insulating layer 11 is provided between the side surface of the semiconductor layer 10 and the gate electrode 12.

A channel region of the cell transistor 1 is provided inside the semiconductor layer 10. Two source/drain regions of the cell transistor 1 are provided inside the semiconductor layer 10. Hereinafter, the pillar-shaped semiconductor layer 10 is also referred to as a semiconductor pillar (or a channel pillar).

In the present embodiment, the cell transistor 1 is a vertical transistor.

One of the two source/drain regions is provided on the upper side of the semiconductor layer 10 in the Z direction and the other of the source/drain regions is provided on the lower side (bottom) of the semiconductor layer 10 in the Z direction. The two source/drain regions of the vertical transistor 1 are aligned in the Z direction. One of the two source/drain regions is arranged above the other of the two source/drain regions in the Z direction.

The source/drain region on the upper side of the cell transistor 1 is coupled to the bit line BL. The source/drain region on the lower side of the cell transistor 1 is coupled to the capacitor electrode 22.

As described in the above, the current path of the vertical transistor 1 extends in the Z direction. The cell transistor 1 allows current to flow therethrough in the Z direction.

In the present embodiment, a gate structure of the cell transistor 1 is a gate all around (GAA) structure. Regarding the cell transistor 1 having the GAA structure, the gate electrode 12 overlaps the entire side surface of the channel region in the semiconductor layer 10. The gate electrode 12 annularly covers the side surface (a surface extending in the Z direction) of the channel region with the gate insulating layer 11 intervening therebetween.

This provides the cell transistor 1 with a great gate electrostatic control capability.

As described in the above, in the DRAM according to the present embodiment, the memory cell array 110 has a three-dimensional configuration. In the present embodiment, the memory cell MC includes a layer stack including the cell transistor 1 and the cell capacitor 2.

By this, the DRAM according to the present embodiment allows the memory cell MC to have a cell size of about $4F^2$. In this manner, the integration degree of the memory cell MC in a given chip size (an area of the memory cell array) is improved.

Therefore, the DRAM according to the present embodiment can be improved in terms of memory density of the memory cell array.

(1b) Configuration Example

A configuration example of the DRAM according to the present embodiment will be described with reference to FIG. 4 to FIG. 8.

FIG. 4 is a schematic cross-sectional view showing a configuration example of the DRAM according to the present embodiment.

As shown in FIG. 4, the memory cell array 110 is provided above the substrate 9 in the Z direction.

CMOS circuits such as the row control circuit 120 and the column control circuit 130 are provided between the memory cell array 110 and the substrate 9 in the Z direction. In this case, the substrate 9 is a semiconductor substrate (a silicon substrate).

Each field effect transistor (hereinafter also referred to as a transistor) TR is provided in each active area AA in the semiconductor substrate 9. The active area AA is a semi-conductor region in the semiconductor substrate 9. The semiconductor region as the active area AA is surrounded by the insulating layer in the semiconductor substrate 9.

In the active area AA, a well region 30 is provided in the semiconductor substrate 9.

The transistor TR includes a gate electrode 31, a gate insulating layer 32, and two source/drain regions 33A and 33B.

The gate electrode 31 is provided above the well region 30 in the Z direction. The gate insulating layer 32 is provided between the upper surface of the well region 30 and the gate electrode 31.

Two source/drain regions 33A and 33B are provided in the well region 30. One of the two source/drain regions 33A and 33B serves as a source of the transistor TR and the other of them serves as a drain of the transistor TR. A portion between the two source/drain regions 33A and 33B in the well region 30 serves as a channel region of the transistor TR. The channel region is arranged below the gate electrode 31 with the gate insulating layer 32 intervening therebe-tween.

The transistor TR is covered with an interlayer insulating layer (not shown) on the upper surface of the semiconductor substrate 9.

The transistor TR is electrically coupled to an intercon-nect and an element in the memory cell array 110 via contact plugs CP0, CP1, and CP2 and metal layers (interconnects) M0 and M1 in the interlayer insulating layer.

The memory cell array 110 is provided on the upper surface of the interlayer insulating layer. The CMOS circuits (e.g., the row control circuit and the column control circuit) including the transistor TR are provided below the memory cell array 110 in the Z direction.

The memory cell array 110 includes a plurality of plate lines PL, a plurality of bit lines BL, and a plurality of word lines WL.

The plate lines PL are provided on the upper surface of the interlayer insulating layer. The plate lines (hereinafter also referred to as a plate electrode or a plate layer) PL corre-spond to a plate-shaped conductive layer (for example, a metal layer) 29.

The bit lines BL are provided above the plate lines PL in the Z direction. The word lines WL are provided in a region between the bit lines BL and the plate lines PL in the Z direction.

The plurality of cell transistors 1 and the plurality of cell capacitors 2 are provided above the semiconductor substrate 9 (CMOS circuit) in the Z direction.

Each cell transistor 1 is provided above each cell capaci-tor 2 in the Z direction. The cell capacitor 2 is provided between the cell transistor 1 and the plate electrode 29.

Hereinafter, a configuration of the cell transistor 1 and the cell capacitor 2 will be described in more detail.

Configuration Example of Memory Cell Array

A configuration of the memory cell array in the DRAM according to the present embodiment will be described with reference to FIG. 5 to FIG. 8.

FIG. 5 and FIG. 6 are each a top view schematically showing a planar configuration of the memory cell array in the DRAM according to the present embodiment. FIG. 5 shows a top view of a layer (level) provided with the cell transistors. FIG. 6 shows a top view of a layer (level) provided with the cell capacitors.

FIG. 7 and FIG. 8 are each a cross-sectional view sche-matically showing a cross-sectional configuration of the memory cell array in the DRAM according to the present embodiment. FIG. 7 is a cross-sectional view taken along the X direction of the memory cell array. The cross section shown in FIG. 7 is taken along line Qx-Qx in FIG. 5. FIG. 8 is a cross-sectional view taken along the Y direction of the memory cell array. The cross section shown in FIG. 8 is taken along line Qy-Qy in FIG. 5.

As shown in FIG. 5 and FIG. 6, the plurality of memory cells MC are aligned in a hexagonal lattice arrangement (also referred to a staggered arrangement) in a plane X-Y of the memory cell array 110. In a layout of seven memory cells MC included in one unit of the hexagonal lattice arrange-ment, six of the memory cells MC are respectively arranged in the vertexes of a hexagon and the remaining one is arranged in the center of the hexagon.

The plurality of memory cells MC are coupled to each of the two word lines WL adjacent to each other in the Y direction in such a manner that the memory cells MC coupled to one word line WL are aligned obliquely in relation to the Y direction (and the X direction) with the memory cells MC coupled to the other word line WL.

One word line having one end side and the other end side in the Y direction is adjacent to another word line on one end side and is adjacent to yet another word line on the other end side, and a memory cell coupled to another word line adjacent on one end side and a memory cell coupled to yet another word line on the other end side are coupled to the same bit line and are arranged on the same straight line in the Y direction.

For example, an interval (shortest distance) between the center of the semiconductor layer 10 and the center of a gate interconnect 19 aligned in the Y direction is smaller than an interval (shortest distance) between the centers of the two semiconductor layers 10 aligned obliquely in relation to the plane X-Y.

The plurality of cell capacitors 2 are provided above the substrate 9 and below the plurality of cell transistors 1 in the Z direction. The plurality of cell capacitors 2 are arranged in a hexagonal lattice arrangement in the plane X-Y.

The plurality of cell capacitors 2 are provided on the plate electrode 29 on an interlayer insulating layer 80. Each cell capacitor 2 is provided inside a groove (a hole or a trench) within the interlayer insulating layer 81.

The cell capacitor 2 includes two capacitor electrodes 22 and 23, a capacitor insulating layer 24, and a storage node electrode 21.

The storage node electrode 21 has a circular-columnar (or elliptic-columnar) structure. The storage node electrode 21 has a circular (or elliptic) plane shape as viewed in the Z direction.

The capacitor electrode 22 covers the side surface and the bottom surface of the storage node electrode 21. The capacitor electrode 22 has a box-like (or cylindrical) structure. For example, the capacitor electrode 22 has a configuration in which a cylindrical portion extending in the Z direction is coupled to the bottom surface having a circular (or elliptic) plane shape. For example, a position of the upper end in the Z direction of the capacitor electrode 22 (a height from the upper surface of the substrate) is closer to the cell transistor 1 (the bit line BL) as compared to a position of the upper end in the Z direction of the storage node electrode 21.

The capacitor electrode 22 and the storage node electrode 21 may be one structure made from one material.

The capacitor electrode 23 faces the side surface and the bottom surface of the capacitor electrode 22 with the capacitor insulating layer 24 intervening therebetween. The capacitor electrode 23 has a box-like structure. For example, the capacitor electrode 23 has a configuration in which a cylindrical portion extending in the Z direction is coupled to the bottom surface having a circular (or elliptic) plane shape. The bottom surface of the capacitor electrode 23 is provided between the bottom portion of the storage node electrode 21 and the plate electrode 29. For example, a position of the upper end in the Z direction of the capacitor electrode 23 (a height from the upper surface of the substrate) is closer to the substrate as compared to a position of the upper ends in the Z direction of the capacitor electrode 22 and the storage node electrode 21.

The capacitor insulating layer 24 is provided between the capacitor electrode 22 and the capacitor electrode 23. The capacitor insulating layer 24 faces the side surface and the bottom surface of the capacitor electrode 22. The capacitor insulating layer 24 has a cylindrical structure. For example, the capacitor insulating layer 24 has a configuration in which a cylindrical portion extending in the Z direction is coupled to the bottom surface having a circular (or elliptic) plane shape. For example, a position of the upper end in the Z direction of the capacitor insulating layer 24 (a height from the upper surface of the substrate) is substantially the same as a position of the upper end in the Z direction of the capacitor electrode 22.

The capacitor electrode 23 and the capacitor insulating layer 24 are provided between the bottom portion (bottom surface) of the capacitor electrode 22 and the plate electrode 29. The capacitor electrode 22 is separated from the plate electrode 29. The capacitor electrode 23 is directly coupled to the plate electrode 29.

The capacitor electrodes 22 and 23 each include a conductive compound layer (for example, a titanium nitride layer). The capacitor insulating layer 24 includes a single-layered or multi-layered high-dielectric layer (for example, a stacked film of zircon oxide and aluminum oxide). The storage node electrode 21 includes a metal layer (for example, a tungsten layer) or a conductive semiconductor layer (for example, a polysilicon layer). The plate electrode 29 includes a metal layer (for example, a tungsten layer).

Materials for the members 21, 22, 23, 24, and 29 are not limited to those described in the above.

The plurality of cell transistor 1 are arranged in a hexagonal lattice arrangement in the plane X-Y. In each of the memory cells MC, a position of the cell transistor 1 overlaps a position of the capacitor 2 in the Z direction.

The cell transistors 1 are provided inside the insulating layers 82 and 83. Each of the cell transistors 1 is a vertical field effect transistor having a GAA structure.

The cell transistor 1 has the semiconductor layer 10, the gate insulating layer 11, and the gate electrode 12. Source/drain regions SDa and SDb and a channel region CNL of the cell transistor 1 are provided inside the semiconductor layer 10.

The semiconductor layer 10 has a circular-columnar structure. The semiconductor layer 10 has a circular plane shape. The semiconductor layer 10 extends in the Z direction. The semiconductor layer 10 includes at least one layer selected from a silicon layer, a germanium layer, a compound semiconductor layer, and an oxide semiconductor layer. For example, in the case where an oxide semiconductor layer such as InGaZnO is used for the semiconductor layer 10, the cell transistors 1 are improved in terms of off-leakage characteristics.

The gate insulating layer 11 has a cylindrical structure. The gate insulating layer 11 covers the side surface of the semiconductor layer 10. The gate insulating layer 11 having a cylindrical shape has a concentric relationship with the cylindrical semiconductor layer 10 having a circular-columnar shape. The gate insulating layer 11 extends in the Z direction. The gate insulating layer 11 is provided on the side surface of the semiconductor layer 10 (the surface extending in the Z direction of the semiconductor layer 10). The gate insulating layer 11 covers the side surface of the semiconductor layer 10. The gate insulating layer 11 is provided between the semiconductor layer 10 and the gate electrode 12. The gate insulating layer 11 includes, for example, at least one of a silicon oxide layer and a high dielectric insulating film. The gate insulating layer 11 may have a single-layer structure or a stacked structure.

The gate electrode 12 has a cylindrical structure. The semiconductor layer 10 penetrates the gate electrode 12. The gate electrode 12 faces the side surface of the semiconductor layer 10 with the gate insulating layer 11 intervening therebetween. In the semiconductor layer 10, a portion facing the gate electrode 12 serves as the effective channel region CNL of the cell transistor 1.

Each of the gate electrodes 12 is coupled to, for example, the conductive layer (hereinafter, the gate interconnects) 19. For example, the gate electrode 12 is continuous to the conductive layer 19. The gate electrode 12 and the conductive layer 19 form a single continuous conductive layer.

The gate electrodes 12 of the plurality of cell transistors 1 adjacent to each other in the X direction are coupled together via the gate interconnect 19. The gate electrodes 12 and the gate interconnects 19 function as the word line WL.

Each of the gate electrodes 12 and the gate interconnects 19 is, for example, a metal layer such as a tungsten layer, a conductive semiconductor layer, or a conductive compound layer.

The plurality of bit lines BL are provided above the cell transistors 1 in the Z direction.

Each of the bit lines includes a plurality of first portions 310 and a plurality of second portions 311. The first portions 310 extend in a first direction in parallel to the plane X-Y. The first direction (hereinafter referred to as a first oblique direction) intersects the X direction and the Y direction. The second portions 311 extend in the second direction in parallel to the plane X-Y. The second direction (hereinafter referred to as a second oblique direction) intersects the X direction, the Y direction, and the first oblique direction.

In each of the bit lines BL, the first portions 310 and the second portions are alternately arranged in the Y direction.

Each of the first portions 310 extends across two semiconductor layers 10 aligned in the oblique direction (first direction) in relation to the X direction in the plane X-Y. Each of the second portions 311 extends across two semiconductor layers 10 aligned in the oblique direction (second direction) in relation to the X direction in the plane X-Y.

In this manner, the plurality of memory cells meandering (arranged in a zigzag) in the Y direction are coupled to one bit line BL.

Hereinafter, the bit line BL pattern as in the present embodiment will be referred to as a zigzag pattern.

Each lower electrode 15 is provided between the lower portion of the semiconductor layer 10 and the upper surface of the cell capacitor 2 in the Z direction. The lower electrode 15 is coupled to one of the electrodes of the cell capacitor 2. For example, the lower electrode 15 is coupled to the storage node electrode 21.

The lower electrode 15 is a conductive layer selected from, for example, a metal layer, a silicon layer, a germanium layer, a compound semiconductor layer, an oxide semiconductor layer, etc. For example, the oxide semiconductor layer used for the lower electrode 15 is an indium-tin oxide layer (ITO layer). A material of the lower electrode 15 is selected according to the material of the semiconductor layer 10.

Each upper electrode 16 is provided between the upper portion of the semiconductor layer 10 and the bit line BL in the Z direction. The upper electrode 16 is coupled to the semiconductor layer 10 and the bit line BL. The upper electrode 16 is identical in the plane shape to the bit line BL. For example, the upper electrode 16 has a zigzag pattern.

The upper electrode 16 is a conductive layer selected from, for example, a metal layer, a silicon layer, a germanium layer, a compound semiconductor layer, an oxide semiconductor layer, etc. For example, the oxide semiconductor layer used for the upper electrode 16 is an ITO layer. For example, a material of the upper electrode 16 is selected according to the material of the semiconductor layer 10.

In the present embodiment, a plurality of memory cells MC are arranged in a hexagonal lattice arrangement layout in the memory cell array 110. The gate electrode 12 of the cell transistor 1 is adjacent to the gate interconnect 19 in the Y direction.

This enables the DRAM according to the present embodiment to reduce an interval between the memory cells.

In the present embodiment, the cell transistor 1 is a vertical field effect transistor having a GAA structure. This can improve characteristics of the cell transistor 1 in the DRAM according to the present embodiment.

In the present embodiment, as will be described later, the cell transistors 1 are formed in a step after the formation of the cell capacitors 2. This can suppress a thermal step during the formation of the cell capacitors 2 from adversely affecting the cell transistors 1 in the present embodiment.

(1c) Manufacturing Method

With reference to FIG. 9 to FIG. 35, the method of manufacturing the DRAM according to the present embodiment will be described.

FIG. 12, FIG. 19, FIG. 22, and FIG. 27 are each a top view in a step of the method of manufacturing the DRAM according to the present embodiment.

FIG. 9, FIG. 11, FIG. 13, FIG. 15, FIG. 17, FIG. 20, FIG. 25, FIG. 28, FIG. 30, FIG. 32, and FIG. 34 are schematic cross-sectional views each showing the memory cell array in the X direction in steps of the method of manufacturing the DRAM according to the present embodiment. Each of these figures shows a cross-sectional structure in the X direction of the memory cells (for example, a cross-sectional structure along the line Qx-Qx in the top views).

FIG. 10, FIG. 14, FIG. 16, FIG. 18, FIG. 21, FIG. 23, FIG. 24, FIG. 26, FIG. 29, FIG. 31, FIG. 33, and FIG. 35 are schematic cross-sectional views each showing the memory cell array in the Y direction in steps of the method of manufacturing the DRAM according to the present embodiment. Each of these figures shows a cross-sectional structure in the Y direction of the memory cells (for example, a cross-sectional structure along the line Qy-Qy in the top views).

As shown in FIG. 9 and FIG. 10, after CMOS circuits (not shown) of the DRAM are formed on the semiconductor substrate 9 by a well-known method, in a region in which the memory cell array 110 is formed, the plate electrode 29 is formed on the interlayer insulating layer (for example, the silicon oxide layer) 80 on the semiconductor substrate 9 by using a well-known film forming technique such as a physical vapor deposition (PVD) method and a chemical vapor deposition (CVD) method.

The interlayer insulating layer 81 is formed on the plate electrode 29 by a well-known film forming technique. A plurality of holes (trenches) are formed in the interlayer insulating layer 81 by well-known lithography and etching. At the position of each hole, the insulating layer is removed from the top surface of the plate electrode 29. By this, the upper surface of the plate electrode 29 is exposed in the hole.

In the present embodiment, a plurality of holes are formed in such a manner as to form a hexagonal lattice arrangement layout.

The conductive layer (capacitor electrode) 23 is formed on the insulating layer 81 and on the plate electrode 29 by a well-known film forming technique. A dummy layer (not shown) is formed on the conductive layer 23. Etch-back is performed on the conductive layer 23.

After the dummy layer is selectively removed, the insulating layer (capacitor insulating layer) 24 is formed on the conductive layer 23 by a well-known film forming technique. The conductive layer (capacitor electrode) 22 is formed on the insulating layer 24 by a well-known film forming technique.

These layers 22, 23, and 24 are formed by controlling the film thickness of the respective layers 22, 23, and 24 so as not to fill each groove of the interlayer insulating layer 81.

The conductive layer (storage node electrode) 21 is formed on the conductive layer 22 by a well-known film forming technique.

Each of the layers 21, 22, 23, and 24 is removed from the upper surface of the insulating layer 81 by using the upper surface of the insulating layer 81 as a stopper. Each of the layers 21, 22, 23, and 24 is divided into a plurality of portions respectively corresponding to holes in the insulating layer 81. By this, the capacitor electrodes 22 and 23, the capacitor insulating layer 24, and the storage node electrode 21 are formed in each hole.

In this way, the plurality of cell capacitors 2 are formed in the holes (trenches) of the interlayer insulating layer 81 so as to form a hexagonal lattice arrangement layout (see FIG. 6).

Thereafter, etch-back using dry etching or wet etching is performed on the storage node electrode 21. The upper surface of the storage node electrode 21 recedes toward the semiconductor substrate 9 in the Z direction. This results in the formation of a recess in the upper portion of each cell capacitor 2.

As shown in FIG. 11, the conductive layer 15 is formed in a self-aligned manner in the recess on the upper portion of the cell capacitor 2 by a well-known film forming technique, etching, or chemical mechanical polishing (CMP) method. The conductive layer 15 is a metal layer, a silicon (Si) layer, a germanium (Ge) layer, a compound semiconductor layer, or an oxide semiconductor layer (for example, an ITO layer).

The insulating layer (for example, the silicon oxide layer) 82 is formed on the upper portion (the upper surface) of the cell capacitor 2 and on the upper surface of the insulating layer 81 by a well-known film forming technique (for example, a CVD method).

A conductive layer (for example, a metal layer such as a tungsten layer) 12X is formed on the insulating layer 82 by a well-known film forming technique (for example, a PVD method).

The insulating layer (for example, the oxide silicon layer) 83 is formed on the conductive layer 12X by, for example, the CVD method.

This results in the formation of a layer stack 800 including the plurality of layers 82, 12X, and 83 on the cell capacitor 2 (and the interlayer insulating layer 81).

Figure 12:
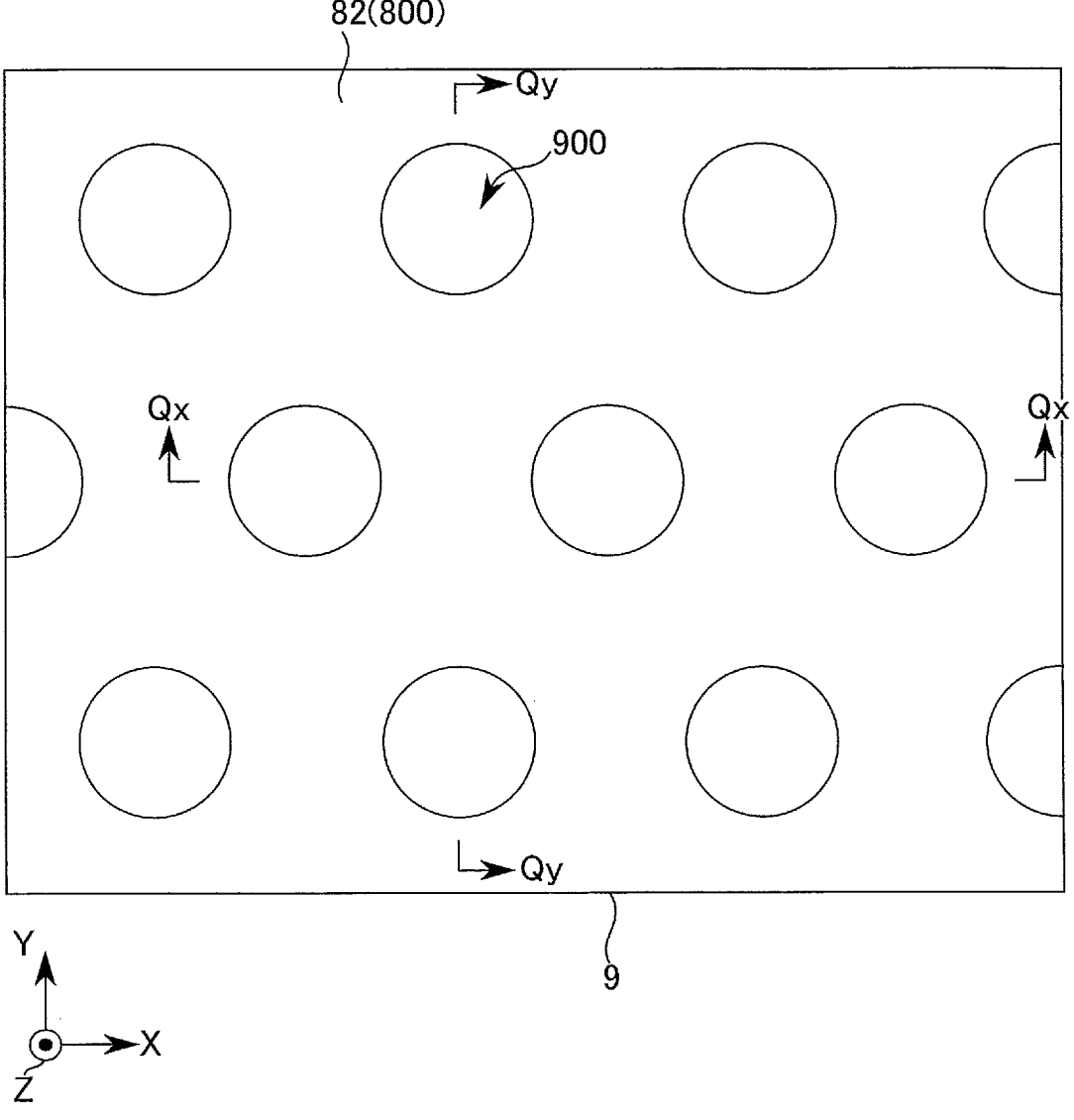
FIG. 12 is a schematic top view showing a step of the method of manufacturing the memory device according to the first embodiment.
Figure 43:
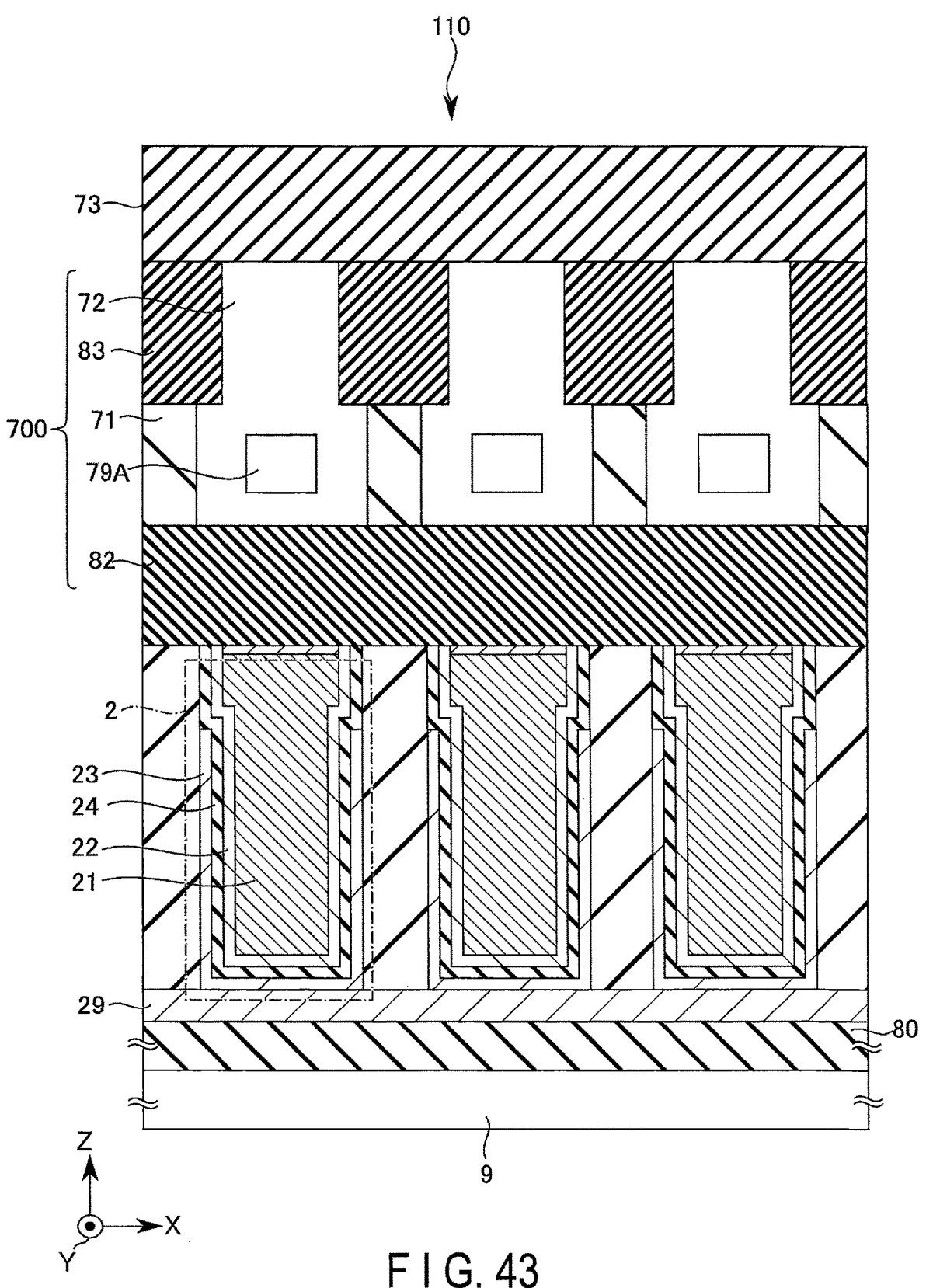
FIG. 43 is a schematic cross-sectional view showing a step of the method of manufacturing the memory device according to the second embodiment.
Figure 44:
FIG. 44 is a schematic cross-sectional view showing a step of the method of manufacturing the memory device according to the second embodiment.
Figure 45:
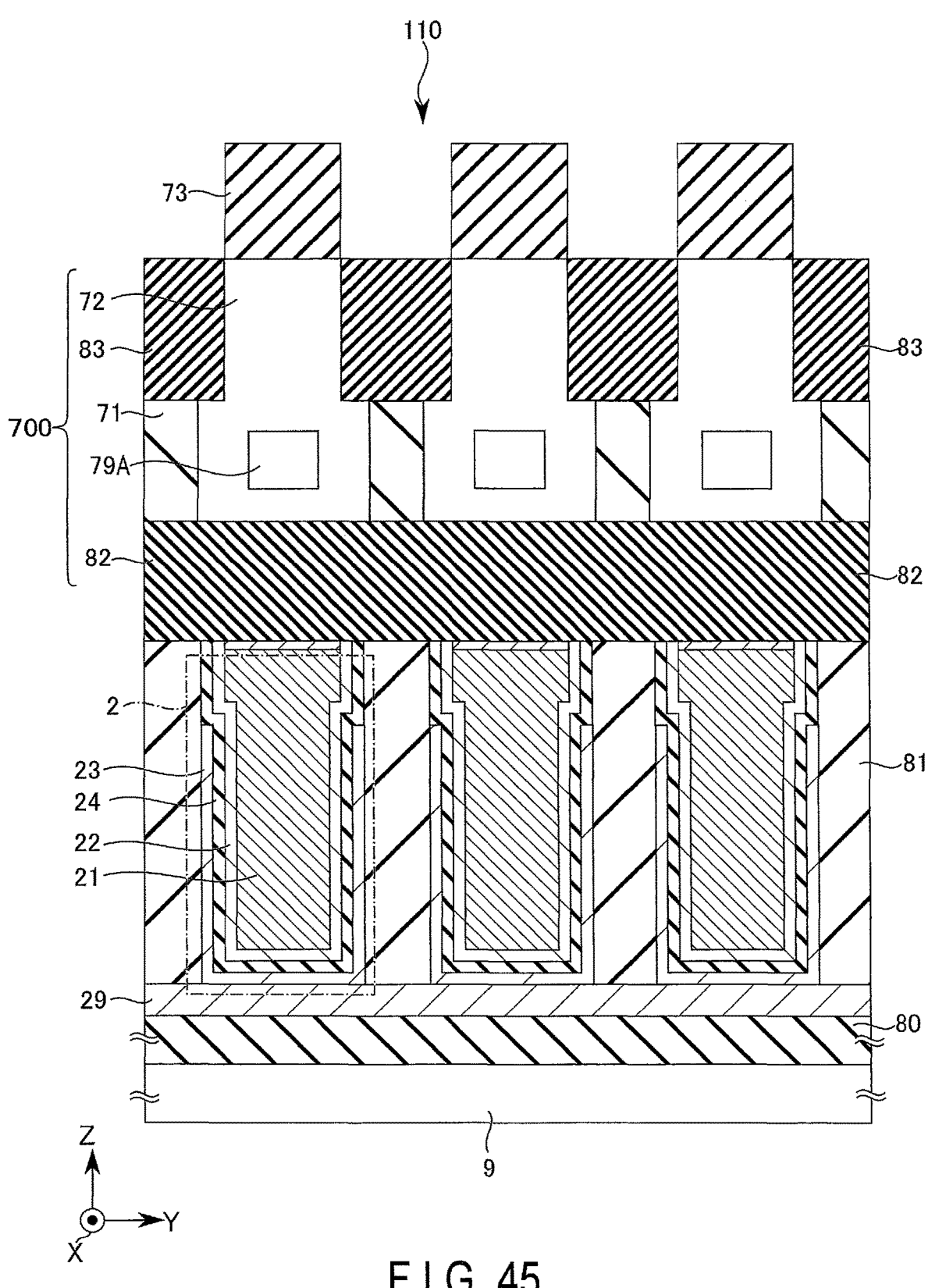
FIG. 45 is a schematic cross-sectional view showing a step of the method of manufacturing the memory device according to the second embodiment.

As shown in FIG. 12, FIG. 13, and FIG. 14, a plurality of holes 900 are formed in the layer stack 800 by photolithography and dry etching (for example, reactive-ion etching). Each of the holes 900 is formed in such a manner that a position of the hole 900 overlaps a position of the cell capacitor 2 in the Z direction.

As described in the above, the plurality of holes 900 are formed in the layer stack 800 in such a manner as to form a hexagonal lattice arrangement layout in the plane X-Y.

At each position in which the hole is formed, the insulating layers 82 and 83 and the conductive layer 12X are removed from the upper surface of the conductive layer 15. In each hole, the upper surface of the conductive layer 15 is exposed. In this manner, the holes 900 reach the conductive layer 15.

As shown in FIG. 15 and FIG. 16, a sacrifice layer (for example, an amorphous silicon layer) 90 is formed on the upper surface of the layer stack 800 and in the holes 900 by, for example, a CVD method. The sacrifice layer is removed from the upper surface of the layer stack 800 by the etch-back or the CMP method.

In this manner, the sacrifice layer 90 having a pillar shape (for example, a circular-columnar shape or an elliptic-columnar shape) is formed in each hole 900. In the sacrifice layer 90, a void (a cavity) may be formed.

The sacrifice layer 90 is not limited to a layer made from a single material and may be a layer including a plurality of materials. The sacrifice layer 90 may be a stacked film including a plurality of films.

As shown in FIG. 17 and FIG. 18, the insulating layer is removed from the upper surface of the conductive layer 12X by, for example, dry etching or wet etching. By this, a portion of the sacrifice layer 90 which is positioned above the conductive layer 12X is exposed.

Thereafter, a spacer layer 91 is formed on the sacrifice layer 90 and on the conductive layer 12X by using a CVD method or an atomic layer deposition (ALD) method. The spacer layer 91 is, for example, a metal oxide layer or a metal nitride layer. For example, one or more of a silicon oxide layer, a silicon nitride layer, an aluminum oxide layer, and an aluminum nitride layer is used for the spacer layer 91.

It is preferable that a film thickness t1 of the spacer layer 91 be set to substantially the same size as the dimension in parallel to the upper surface of the substrate 9 of the gate electrode to be formed in a later step. For example, the film thickness t1 is a dimension in parallel to the upper surface of the substrate 9.

As shown in FIG. 19, FIG. 20, and FIG. 21, the mask layer 93 is formed on the spacer layer 91. A mask layer 94 is formed on the mask layer 93. The mask layers 93 and 94 are formed using, e.g., a CVD method or an application method. For example, a material of the mask layer 93 is different from that of the mask layer 94. With respect to the etching conditions of the mask layer 94, it is preferable that the etching selectivity of a material of the mask layer 93 be greater than the etching selectivity of a material of the mask layer 94. For example, a layer including carbon is used for the mask layer 93. For example, a silicon oxide layer is used for the mask layer 94.

A resist mask 96 having a predetermined pattern is formed using lithography. The resist mask 96 is formed above the conductive layer 12X in such a manner as to overlap in the Z direction a region in which gate interconnects (word lines) are formed.

The resist mask 96 includes at least a pattern extending in the X direction. The resist mask 96 extends in the X direction in such a manner as to cross the plurality of sacrifice layers 90 aligned in the X direction.

As shown in FIG. 22 and FIG. 23, a mask layer 94A is etched based on the pattern of the resist mask. As a result, a pattern of the resist mask is transferred to the mask layer 94A.

A mask layer 93A is etched using the etched mask layer 94 as a mask. As a result, a pattern of the etched mask layer 94 is transferred to the mask layer 93A. The mask layer 93A has a pattern extending in the X direction. The resist mask on the mask layer 94 is removed.

At the time of etching the mask layer 93A, it is preferable that the mask layer 93A be etched using the condition that the etching selectivity of the mask layer 93A with respect to the spacer layer 91 is high.

As a result, after etching the mask layer 93A, the spacer layer 91 remains in the periphery of the sacrifice layer 90 (on the side surface of the sacrifice layer 90) in a state in which the dimension of the spacer layer 91 in the Z direction is sufficiently secured. In this case, the spacer layer 91 covers the entire side surface of the sacrifice layer 90. The spacer layer 91 prevents the side surface of the sacrifice layer 90 from being exposed.

After etching the mask layer 93A and 94A, the mask layers 93A and 94 have a pattern extending in the X direction. Accordingly, the configuration of the mask layers 93A and 94A in FIG. 20 is maintained with respect to the plurality of sacrifice layers 90 aligned in the X direction.

As shown in FIG. 24, the spacer layer 91A is etched by dry etching while the mask layers 93A and 94A in a line pattern remain on the spacer layer 91A.

As a result, the upper surface of the conductive layer 12X is exposed between the mask layers 93A adjacent to each other in the Y direction.

A plurality of spacer layers 91A are respectively formed on the conductive layers 12X and the sacrifice layers 90. Each spacer layer 91A remains below the mask layer 94A and on the side surface of the sacrifice layer 90.

For example, in accordance with the amount of etching, a portion 91Aa of the spacer layer 91A covering the side surface of the sacrifice layer 90 may be separated from the spacer layer 91A located between the sacrifice layer 90 and the mask layer 93A.

For example, the mask layer 94A is removed through etching on the spacer layer 91A.

The spacer layer 91A may be etched in a step before the formation step of the mask layers 93A and 94A. For example, etch-back is performed immediately after the formation of the spacer layer (see FIG. 17 and FIG. 18). By this, the spacer layer 91A remains on the sacrifice layer 90 in a self-aligned manner.

In this case, the etching selectivity of the conductive layer 12X with respect to the etching conditions of the spacer layer 91A (91) is made sufficiently high. It is preferable that this suppress the reduction in dimensions of the conductive layer 12X in the gate interconnect region (word line formation region) (for example, dimension in the Z direction of the conductive layer 12, the film thickness of the conductive layer 12) due to over-etching on the spacer layer 91A when the spacer layer 91A (91) is etched.

As shown in FIG. 25 and FIG. 26, the conductive layer 12A is etched through dry etching by using the mask layer 93 and the spacer layers 91A and 91Aa as a mask.

This causes the conductive layer 19 below the mask layer 93A to remain on the insulating layer 82. In addition, the conductive layer 12 below the spacer layers 91A and 91Aa remains on the insulating layer 82. For example, the mask layer (layer 94A in FIG. 24) on the mask layer 93A is removed through etching performed on the spacer layers 91A and 91Aa.

The conductive layer 12 is a gate electrode of a cell transistor having a GAA structure. The conductive layer 19 is a gate interconnect that couples the gate electrodes 12 aligned in the X direction.

This results in the formation of the word lines WL within the memory cell array 110.

As described in the above, in the present embodiment, a configuration (a word line) in which the gate electrode 12 and the gate interconnect 19 are continuous is formed from a single conductive layer by using a combination of the plurality of masks.

At the time of etching on the conductive layers 12 and 19 in this step, the sacrifice layer 90 may be partially exposed as long as the etching condition secures sufficient etching selectivity of the conductive layer with respect to the sacrifice layer 90.

As shown in FIG. 27, FIG. 28, and FIG. 29, the mask layer 93A is removed through, for example, etching or ashing. The spacer layer 91 is removed through wet etching or dry etching. In the case of the spacer layer 91 being an insulating layer (for example, the silicon oxide layer), the spacer layer 91 is not necessarily removed.

As shown in FIG. 30 and FIG. 31, the insulating layer 83A is formed on the sacrifice layer 90, the conductive layers 12 and 19, and the insulating layer 82 by a CVD method or a coating method. The insulating layer 83A is a silicon oxide layer or a low-dielectric insulating layer. The upper surface of the insulating layer 83A is planarized by a CMP method using the upper surface of the sacrifice layer 90 as a stopper. By this, the upper surface of the sacrifice layer 90 is exposed.

An air gap may be formed between the gate interconnects 19 adjacent to each other in the Y direction. In this case, after an insulating layer having low coverage is formed on the sacrifice layer 90, the conductive layers 12 and 19, and the insulating layer 82, an insulating layer having high coverage is formed on the formed insulating layer and the layers 12, 19 and 82. This reduces the interconnect capacitance between the gate interconnects (word lines) adjacent to each other in the Y direction.

As shown in FIG. 32 and FIG. 33, the sacrifice layer is removed on each of the insulating layers 82 and 83 through wet etching or dry etching. By this, holes 901 are formed in the insulating layers 82 and 83.

Insulating layers (gate insulating layers) 11 and 11Z are formed on the insulating layers 82 and 83 and on the conductive layer 12 by a CVD method or an ALD method. Etch-back is performed on the formed insulating layer 11 through dry etching. The etch-back removes the insulating layer 11Z from the upper surface of the insulating layer 83 and the bottom portion of each hole 901.

This causes the insulating layer 11 to remain on the side surfaces of the insulating layers 82 and 83 and on the side surface of the conductive layer 12 in the hole 901. The insulating layer 11 has a cylindrical structure.

In the bottom portion of the hole 901, the upper surface of the conductive layer 15 is exposed. At the time of etch-back, in order to prevent etching from causing damage on the surface of the gate insulating layer 11, a thin cover film may be formed on the surface of the gate insulating layer 11 before etch-back is performed on the layers 11 and 11Z. This cover film is removed after the etch-back.

As shown in FIG. 34 and FIG. 35, semiconductor layers 10 and 10X are formed on the cylindrical gate insulating layer 11 and the insulating layer 83 by using a CVD method or ALD method. The semiconductor layer 10 is in contact with the lower electrode 15. By this, the semiconductor layer 10 is electrically coupled to the cell capacitor 2 below the semiconductor layer 10.

The unnecessary semiconductor layer 10X is removed from the upper surface of insulating layer 83 through dry etching or wet etching. The semiconductor layer 10X on the upper surface of the insulating layer 83 may be removed by a CMP method. By this, the upper end of the semiconductor layer 10 and the upper surface of the insulating layer 83 are planarized.

The semiconductor layer 10 evolves into a channel layer (and a source/drain region) of a cell transistor.

As described in the above, in the present embodiment, the semiconductor layer 10 is formed in each of the insulating layers 82 and 83 in such a manner that the side surface of the semiconductor layer 10 extending in the Z direction faces the gate electrode 12 with the gate insulating layer 11 intervening therebetween.

For example, the semiconductor layer 10 includes at least one layer selected from a silicon layer, a germanium layer, a compound semiconductor layer, and an oxide semiconductor layer. For example, in the case where an oxide semiconductor layer such as InGaZnO is used for the semiconductor layer 10, even if a channel length of a transistor using the semiconductor layer 10 including InGaZnO is shorter than a channel length of a transistor using a silicon layer, the transistor using the semiconductor layer 10 including InGaZnO has excellent off-leakage characteristics.

For this reason, in the present embodiment, it is preferable that the semiconductor layer 10 be an oxide semiconductor layer. This enables the DRAM according to the present embodiment to achieve miniaturization of the memory cells.

As shown in FIG. 4 to FIG. 8, the conductive layer (upper electrode) 16 is formed on the insulating layer 83 and the semiconductor layer 10 by using a PVD method or a CVD method. The conductive layer 31 is formed on the conductive layer 16 by using, for example, a PVD method or a CVD method. The conductive layer 16 is selected from, for example, a metal layer, a silicon layer, a germanium layer, a compound semiconductor layer, an oxide semiconductor layer, etc. The conductive layer 31 is, for example, a metal layer (for example, a tungsten layer).

The conductive layers 16 and 31 are processed by lithography and etching in such a manner as to have a predetermined pattern. This results in the formation of the upper electrode 16 and the plurality of bit lines BL on the cell transistor 1. The upper electrode 16 and the bit lines BL extend in the Y direction.

For example, in the present embodiment, in the case where the plurality of memory cells MC are arranged in a hexagonal lattice arrangement in the plane X-Y, the bit lines BL and the upper electrode 16 extending in the Y direction are formed in such a manner as to have a zigzag plane shape.

In this manner, the memory cell array 110 is formed in the DRAM according to the present embodiment.

Thereafter, the contact plugs and the interconnects are formed in a region above the interlayer insulating layers 81, 82, and 83 and the bit lines BL in such a manner that the word lines WL, the bit lines BL and the plate electrode 29 are coupled to the CMOS circuit below the memory cell array 110. In the step before the formation of the bit lines BL (for example, during the formation step of the cell transistor 1), the contact plug and the interconnects (for example, the contact plug CP2 in FIG. 4) may be formed.

Patterning of the holes, the word lines, and the bit lines may be performed using a well-known double patterning technique in order to miniaturize each pattern.

By the manufacturing method described in the above, the DRAM according to the present embodiment is formed.

(1d) Conclusion

In the memory device according to the present embodiment (for example, the DRAM), the plurality of memory cells are arranged in a hexagonal lattice arrangement layout in the memory cell array.

This enables the DRAM according to the present embodiment to increase the capacitance of the cell capacitors in the case of having a fixed pitch (interval) between the cell capacitors.

In the present embodiment, the semiconductor layers (channel layers) of the vertical cell transistors are laid out in a hexagonal lattice arrangement as with the cell capacitors. This eliminates the need to form a new pad layer in the DRAM according to the present embodiment in order to couple the storage node electrode of each cell capacitor to the lower electrode of each cell transistor.

In the present embodiment, the bit lines having a plane shape in a zigzag pattern are formed with respect to the plurality of memory cells in a hexagonal lattice arrangement. By this, in the DRAM according to the present embodiment, each of the semiconductor layers of the vertical cell transistors can be coupled to one bit line via the upper electrode without an addition of a new pad layer.

In the present embodiment, the bit lines are provided above the vertical cell transistors. By this, in the DRAM of the present embodiment, the bit lines can be formed through a process with a relatively low manufacturing difficulty without using a complicated manufacturing process such as forming bit lines of an embedded structure.

Furthermore, forming the bit lines on the upper side of the vertical transistors eliminates the need for a complicated step such as a step for embedded bit lines and thus simplifies the step.

In the present embodiment, the lower electrode of each cell transistor 1 is arranged in a self-aligned manner with respect to the storage node electrode of each cell capacitor. This enables the DRAM according to the present embodiment to couple the semiconductor layer of the cell transistor 1 to the lower electrode without using a complicated manufacturing step.

As described in the above, the DRAM according to the present embodiment can provide a device having a miniature size at a low cost.

In the present embodiment, an oxide semiconductor can be used for the channel layer of each cell transistor without using a semiconductor substrate (for example, a silicon substrate) for the channel layer.

This enables the DRAM according to the present embodiment to secure good off-leakage characteristics of the cell transistors even if the memory cells are further miniaturized.

In the present embodiment, the cell capacitors are provided below the vertical cell transistors, and the bit lines are provided above the vertical cell transistors. This enables the DRAM according to the present embodiment to prevent the characteristic deterioration of the oxide semiconductor used for the cell transistors due to a thermal step during the formation step of the cell capacitors.

In the present embodiment, the cell transistor has a GAA structure. A transistor having a GAA structure has a high gate electrostatic control capability. In the present embodiment, the cell transistors can realize the suppression of the short channel effect, the reduction of the leakage current, and the improvement of the driving ability. The DRAM according to the present embodiment can improve the data retention characteristics of the memory cells.

In the DRAM according to the present embodiment, the sense amplifier circuit and the driver circuit in the DRAM are formed and arranged on the semiconductor substrate below the memory cell array 110. This enables the DRAM according to the present embodiment to improve the occupancy rate of the memory cells or to reduce the chip size.

As described above, the memory device according to the present embodiment can have its characteristics improved. The memory device according to the present embodiment can reduce the manufacturing costs.

(2) Second Embodiment

A memory device and a method of manufacturing the memory device according to a second embodiment will be described with reference to FIG. 36 to FIG. 65.

(2a) Configuration Example

A configuration example of the memory device (for example, the DRAM) according to the present embodiment will be described with reference to FIG. 36.

FIG. 36 is a top view schematically showing a planar configuration of the memory cell array in the DRAM according to the present embodiment. FIG. 36 shows a top view of a layer provided with the cell transistors.

FIG. 37, FIG. 38, and FIG. 39 are each a cross-sectional view schematically showing a cross-sectional configuration of the memory cell array in the DRAM according to the present embodiment.

FIG. 37 is a cross-sectional view taken along the X direction of the memory cell array. The cross section shown in FIG. 37 is taken along line Qx-Qx in FIG. 36.

FIG. 38 and FIG. 39 are each a cross-sectional view taken along the Y direction of the memory cell array. The cross section shown in FIG. 38 is taken along line Qy-Qy in FIG. 36. The cross section shown in FIG. 39 is taken along line Qa-Qa in FIG. 36.

As shown in FIG. 36, in the present embodiment, the plurality of memory cells MC are aligned in a tetragonal lattice array in the plane X-Y of the memory cell array 110.

In a layout of four memory cells MC included in one unit of the tetragonal lattice array, the four memory cells MC are respectively arranged at the vertexes of a quadrangle (for example, a square).

In the present embodiment, the plurality of memory cells MC are coupled to each of the two word lines WL adjacent to each other in the Y direction in such a manner that the memory cells MC coupled to one word line WL are aligned to the memory cells MC coupled to the other word line WL in the Y direction. For example, the bit lines BL extend in the Y direction. The bit lines BL have a linear pattern. The plurality of memory cells MC coupled to the same bit line BL are aligned on the same straight line in the Y direction.

A plurality of gate electrodes 12D are aligned on the same straight line in the Y direction. A plurality of gate interconnects 19D are aligned on the same straight line in the Y direction.

In the present embodiment, the cell capacitor 2 is arranged below the cell transistor 1 in the Z direction as with the first embodiment. The cell capacitor 2 is arranged in a tetragonal lattice arrangement layout in the memory cell array 110 as with the cell transistor 1.

As shown in FIG. 37, FIG. 38, and FIG. 39, the conductive layer 17 is provided, for example, between the gate electrode 12D and the interlayer insulating layers 82 and 83 and between the gate interconnect 19D and the interlayer insulating layers 82 and 83. The conductive layer 17 is a barrier metal layer. The conductive layer 17 is, for example, a titanium nitride layer or a tungsten nitride layer.

For example, the conductive layer 18 is provided inside the gate interconnect 19D.

For example, the upper electrode 16 covers the side surface of the upper portion of the semiconductor layer 10.

In the present embodiment, the gate electrodes 12D and the gate interconnects 19D of the cell transistor 1 are formed in a self-aligned manner inside cavities (grooves) within the interlayer insulating layers 82 and 83.

(2b) Manufacturing Method

With reference to FIG. 40 to FIG. 65, the method of manufacturing the DRAM according to the present embodiment will be described.

FIG. 40 and FIG. 42 are each a top view in a step of the method of manufacturing the DRAM according to the present embodiment.

FIG. 43, FIG. 44, FIG. 51, FIG. 52, FIG. 55, FIG. 58, FIG. 60, FIG. 62, and FIG. 64 are schematic cross-sectional views showing the memory cell array in the X direction in steps of the method of manufacturing the DRAM according to the present embodiment. Each of these figures shows a cross-sectional structure in the X direction of the memory cells (for example, a cross-sectional structure along the line Qx-Qx or the line Qb-Qb in the top views).

FIG. 41, FIG. 45, FIG. 46, FIG. 47, FIG. 48, FIG. 49, FIG. 50, FIG. 53, FIG. 54, FIG. 56, FIG. 57, FIG. 59, FIG. 61, FIG. 63, and FIG. 65 are schematic cross-sectional views showing the memory cell array in the Y direction in steps of the method of manufacturing the DRAM according to the present embodiment. Each of these figures shows a cross-sectional structure in the Y direction of the memory cells (for example, a cross-sectional structure along the line Qy-Qy or the line Qa-Qa in the top views).

As shown in FIG. 40 and FIG. 41, the CMOS circuits are formed on the semiconductor substrate 9 and thereafter the plurality of cell capacitors 2 are formed above the semiconductor substrate 9 in the Z direction as with the method of manufacturing the DRAM according to the first embodiment. The cell capacitors 2 are arranged in a square lattice arrangement layout in the plane X-Y.

After the lower electrode 15 is formed on the upper surface of each cell capacitor 2, the insulating layer 82, the sacrifice layer 71, and the insulating layer 83 are sequentially formed from the semiconductor substrate 9 side by, for example, a CVD method. A layer stack 700 including the insulating layer 82, the sacrifice layer 71, and the insulating layer 83 is formed above the plurality of cell capacitors 2.

Holes 910 are formed within the insulating layer 83 and the sacrifice layer 71 by photolithography and dry etching. The holes 910 are formed above the capacitors 2.

In the bottom portion of each hole 910, the upper surface of the insulating layer 82 is exposed. In the internal portion of each hole 910, the side surface of the sacrifice layer 71 is exposed. The storage node electrode and the lower electrode may be one structure made from one material.

The sacrifice layer 71 exposed in each hole 910 is isotropically etched by wet etching or dry etching. By this, in the layer stack 700, a recess 911 is formed in a position corresponding to the sacrifice layer 71 in each hole 910. A space having a circular plane shape is formed in a position corresponding to the sacrifice layer 71 of the layer stack 700.

A region corresponding to the recess 911 evolves into a region in which a gate electrode is formed in a later step. A dimension of each recess 911 (a depth of each recess 911) in the parallel direction to the upper surface of the substrate 9 ranges from several nm to several tens of nm.

As shown in FIG. 42, FIG. 43, FIG. 44, FIG. 45, and FIG. 46, after the formation of recesses, a sacrifice layer 72 is formed by a CVD in each hole and on the layer stack 700. The sacrifice layer 72 formed on the upper surface of the layer stack 700 is planarized by etch-back through dry etching or a CMP method by using the insulating layer 83 as a stopper. This removes the sacrifice layer 72 from the upper surface of the layer stack 700. The sacrifice layer 72 is, for example, an amorphous silicon layer. For example, a cavity 79A is generated inside the sacrifice layer 72.

The plurality of mask layers 73 are formed on the upper surface of the layer stack 700 by photolithography. A plurality of mask layers 73 have a linear pattern extending in the X direction. A space having a predetermined dimension is provided between the mask layers 73 aligned in the Y direction.

As shown in FIG. 47 and FIG. 48, the insulating layer 83 and the sacrifice layer 71 are processed through dry etching by using the formed mask layers 73 as a mask.

This results in the formation of grooves 915 extending in the X direction in the layer stack 700. In the bottom portion of each groove 915, the upper surface of the insulating layer 82 is exposed.

The region covered with the mask layers 73 (for example, FIG. 43) maintains a configuration before etching.

The etching condition for forming a groove preferably secures a high etching selectivity with respect to the sacrifice layer 72. This prevents further progress of etching on exposed portions of the sacrifice layer 72 during etching of the insulating layer 83 and the sacrifice layer 71.

As shown in FIG. 49 and FIG. 50, after the mask layer for the formation of the grooves is removed through aching, an insulating layer 83Z is formed on the sacrifice layer 72 and the upper surface of the insulating layers 82 and in each groove 915 by a CVD method or a coating method. The upper surface of the insulating layer 83Z is planarized by a CMP method. By this, the insulating layer 83Z is embedded in each groove between the sacrifice layers 72.

When the CMP method is performed on the insulating layer 83Z, the upper end of the sacrifice layer 72 may be used as a stopper for the CMP.

As shown in FIG. 51, FIG. 52, FIG. 53, and FIG. 54, selective removal of the plurality of sacrifice layers through wet etching or dry etching results in the formation of a space (a cavity or a region with no layer) 916 in the layer stack 700.

As shown in FIG. 55, FIG. 56, and FIG. 57, the conductive layers 12A and 17 are formed in the space (cavity) within the layer stack 700 by, for example, a CVD method. The conductive layer 17 is, for example, a barrier metal layer. The conductive layer 12A is a metal layer. The barrier metal layer 17 improves adhesion of the conductive layer (metal layer) 12A with respect to the insulating layer. The barrier metal layer 17 is, for example, a titanium nitride layer or a tungsten nitride layer. The conductive layer 12A is, for example, a tungsten layer.

When the conductive layers 12A and 17 are formed, a filling shape in a region in which gate interconnects are formed depends on the opening dimension (hole diameter) of each hole. In the case where the opening dimension of the hole 910 is smaller than both of the gate width and the gate length of the gate electrode to be formed, as shown in the examples shown in FIG. 55 to FIG. 57, the opening portion of the hole is blocked by the conductive layers 12A and 17 before the space in the gate interconnect region is filled with the conductive layers 12A and 17. This generates a cavity 79 inside the gate interconnect region.

In the case where the opening dimension of the hole 910 is greater than or equal to at least one of the gate width and the gate length, a space in the gate interconnect region is filled with the conductive layers 12A and 17 before the opening portion of the hole is blocked. In this case, no cavity is generated inside the gate interconnect region.

As shown in FIG. 58 and FIG. 59, etch-back with respect to the conductive layer 12A and the barrier metal layer 17 is performed through dry etching or a combination of dry etching and wet etching.

In the case of the inside of the gate interconnect region not being filled with the conductive layer 12A and the barrier metal layer 17, the cavity 79 is exposed after etch-back.

As shown in FIG. 60 and FIG. 61, the conductive layer 18 is formed in the exposed cavity by a CVD method. Thereafter, etch-back is performed on the conductive layer 18.

This results in the formation of the gate interconnect 19 in the memory cell array 110.

As shown in FIG. 62 and FIG. 63, the insulating layer 82 on the bottom portion of each hole 910 is etched through dry etching. In this manner, the holes 910 reach the lower electrode 15. The upper surface of the lower electrode 15 is exposed in each hole 910.

At this time, a mask layer 75 may be formed by a plasma CVD method, etc. Etching is performed on the insulating layer 81 by using the mask layer 75 as a mask.

In the case where etching is performed using the mask layer 75, a film thickness of the mask layer 75 and coverage thereof are adjusted. In this manner, the mask layer 75 is not formed on the insulating layer 82 on the bottom portion of each hole 910, and the opening portion of the hole 910 is not blocked by the mask layer 75. For example, the mask layer 75 is a layer including carbon, etc.

The insulating layer 82 on the lower electrode 15 may be selectively removed through etch-back on the insulating layer 82 without forming the mask layer 75. In this case, at the time of formation of the insulating layer 83, a film thickness of the insulating layer 83 is controlled.

Furthermore, etching on the insulating layer 82 may be performed substantially concurrently with etching on the conductive layer shown in FIG. 58 and FIG. 59.

Figure 65:
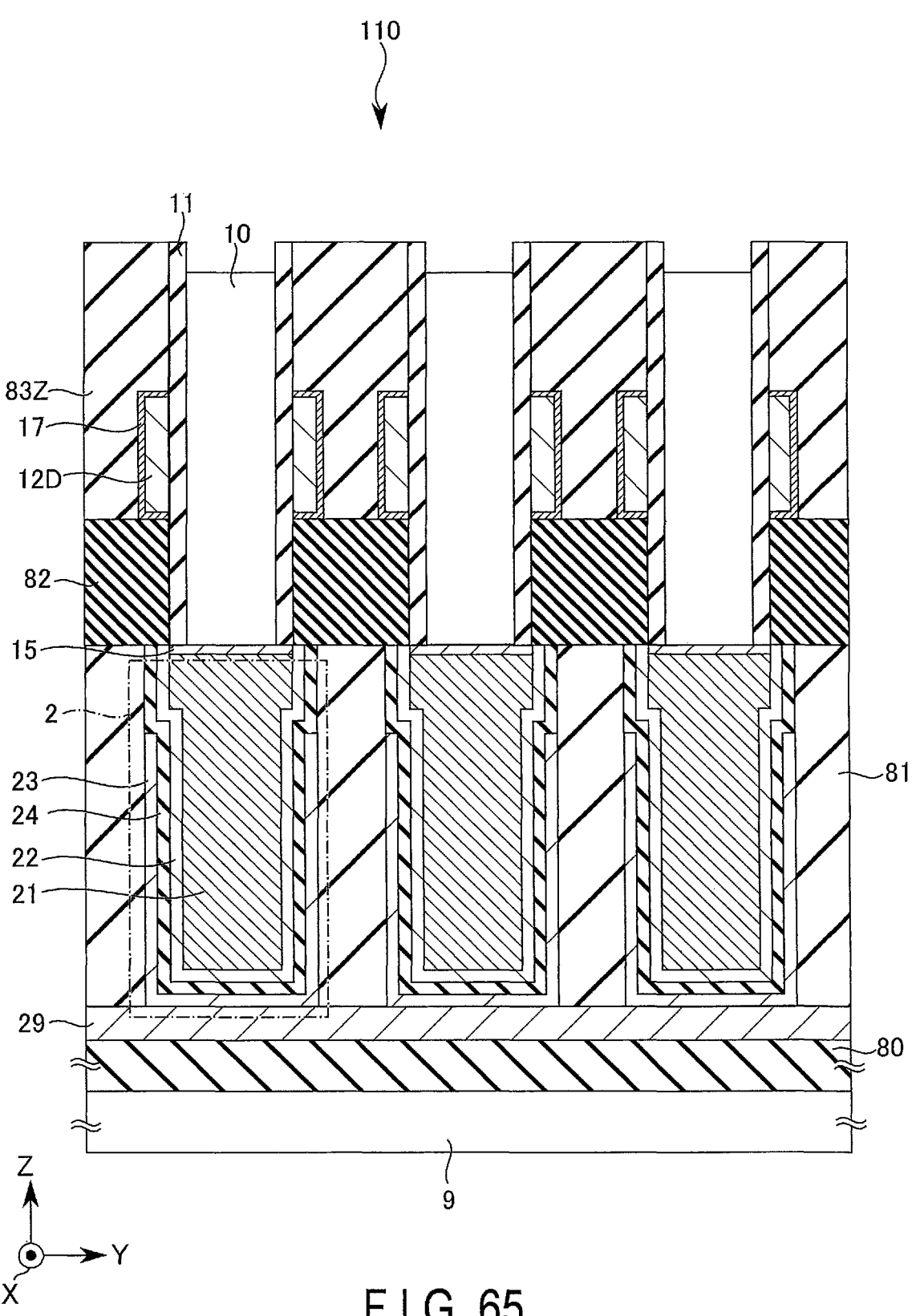
FIG. 65 is a schematic cross-sectional view showing a step of the method of manufacturing the memory device according to the second embodiment.

As shown in FIG. 64 and FIG. 65, the insulating layer 11 is formed on the layer stack 700 by a CVD method or an ALD method. The insulating layer on the upper surface of the layer stack 700 and on the electrode 15 is removed through etch-back on the insulating layer 11. This results in the formation of the gate insulating layer 11 of the cell transistor. The gate insulating layer 11 is, for example, a silicon oxide layer.

As with the embodiment described in the above, a thin cover layer may be formed on the insulating layer 11 at the time of etch-back in order to suppress damage on the gate insulating layer 11 at the time of the etch-back. The cover layer is selectively removed after the etch-back.

The semiconductor layer 10 is formed on the lower electrode 15, the gate insulating layer 11, and the layer stack 700 by using a CVD method or an ALD method. The semiconductor layer 10 on the upper surface of the layer stack 700 is removed through etch-back on the semiconductor layer 10.

In this manner, the semiconductor layer 10 is formed in each hole of the layer stack 700. For example, the semiconductor layer 10 is in direct contact with the lower electrode 15.

In the DRAM according to the present embodiment, this results in the formation of the cell transistor 1 above the cell capacitors 2 in the Z direction.

For example, as with the first embodiment, the semiconductor layer 10 is selected from a silicon layer, a germanium layer, a compound semiconductor layer, and an oxide semiconductor layer.

In the present embodiment, when using the oxide semiconductor layer (for example, an InGaZnO layer) for the semiconductor layer 10, cell transistors exhibiting even better off-leakage characteristics can be provided.

As shown in FIG. 36 to FIG. 39, after isotropic etching (for example, wet etching or dry etching) on the insulating layer, the upper electrode 16 is formed using PVD or CVD. The formed upper electrode 16 is planarized through dry etching or planarization processing.

The upper electrode 16 is a conductive layer selected from, for example, a metal layer, a silicon layer, a germanium layer, a compound semiconductor layer, an oxide semiconductor layer (such as an ITO layer), etc.

Thereafter, as with the first embodiment, the plurality of bit lines BL having a predetermined pattern are formed on the semiconductor layer 10 and the insulating layers 83 and 83Z through lithography and etching with respect to the formed conductive layer (for example, a metal layer such as a tungsten layer). An interconnect and a contact plug are formed in such a manner as to be coupled to the CMOS circuit on the substrate.

By the manufacturing step described in the above, the DRAM according to the present embodiment is formed.

(2c) Conclusion

As described in the above, the DRAM according to the present embodiment is configured in such a manner that the plurality of memory cells are provided in a square lattice arrangement within the memory cell array.

In the present embodiment, the gate electrodes and the gate interconnects (word lines) of the cell transistor are formed through a self-aligned process. The gate electrodes and the gate interconnects of the cell transistor form a single continuous layer.

In the present embodiment, the dimension of the gate interconnects in the Y direction is smaller than that of the cell transistor in the Y direction.

This enables the DRAM according to the present embodiment to reduce an interval between the gate interconnects while suppressing an increase in interconnect resistance in the gate interconnects (word lines).

The DRAM according to the present embodiment can attain the same advantageous effects as those of the DRAM according to the first embodiment.

(3) Third Embodiment

A memory device and a method of manufacturing the memory device according to a third embodiment will be described with reference to FIG. 66 to FIG. 69.

Figure 66:
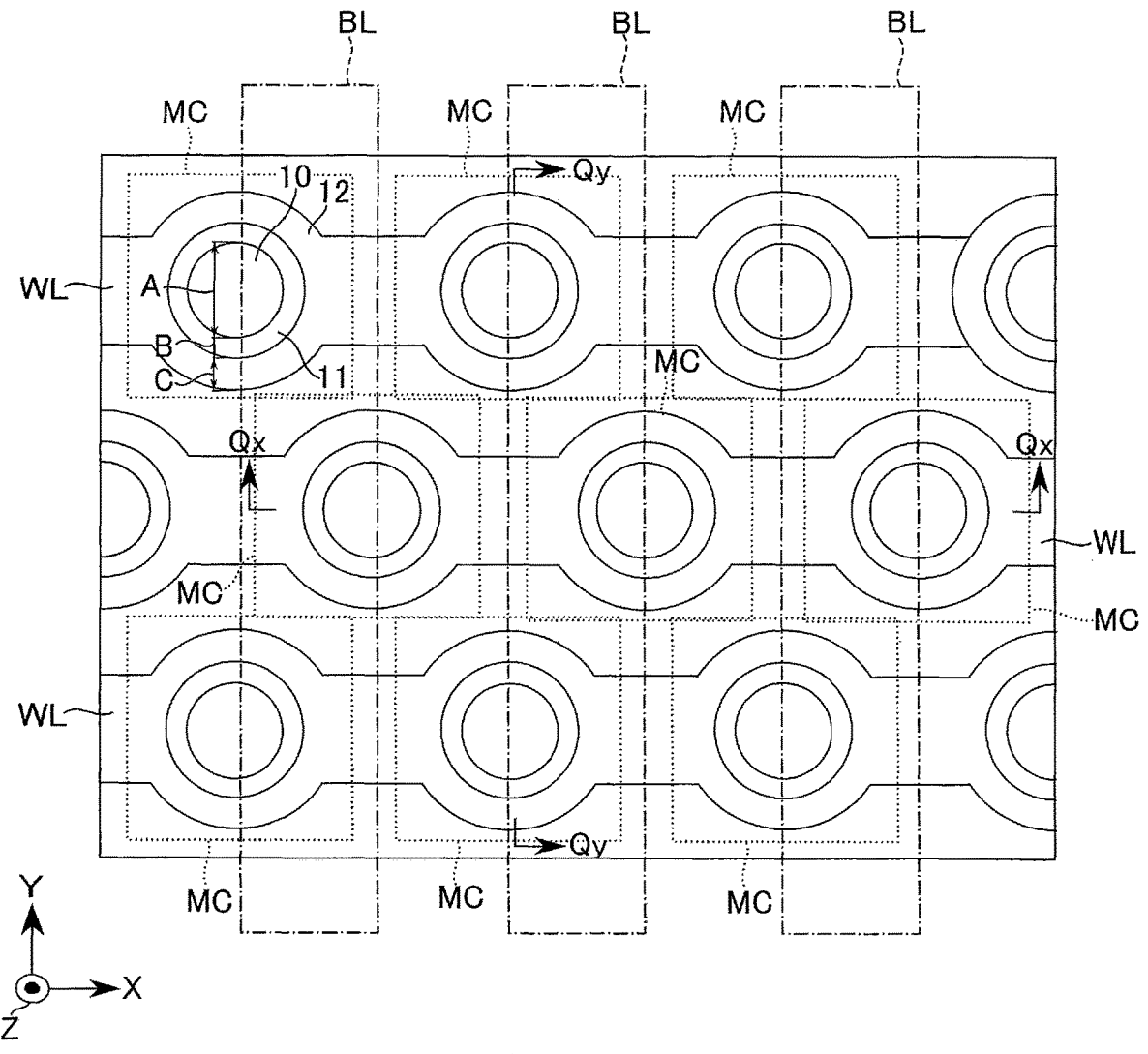
FIG. 66 is a schematic top view showing a configuration example of a memory device according to a third embodiment.

FIG. 66 is a top view showing a configuration example of the memory device according to the present embodiment. FIG. 67 and FIG. 68 are each a schematic cross-sectional view showing a configuration example of the memory device according to the present embodiment.

The plurality of memory cells each having the configuration described in the second embodiment may be arranged in a hexagonal lattice arrangement layout in the plane X-Y of the memory cell array.

As shown in FIG. 66 to FIG. 68, in the case where memory cell array 110 forms a hexagonal lattice arrangement layout, the bit lines BL having a linear shape extending in the Y direction are arranged above a region corresponding to two semiconductor layers that are adjacent to each other in the oblique direction.

The bit lines BL partially overlap the upper portion of the semiconductor layer 10 in the Z direction. The center position of each bit line BL extending in the Y direction is shifted from the center position of the upper surface of the semiconductor layer. Each bit line BL extends above each gate interconnect 19 in such a manner as to partially overlap the gate interconnect 19 in the Z direction.

In the case where the memory cell array 110 forms a hexagonal lattice arrangement layout, the gate electrode 12 of the cell transistor 1 is adjacent in the Y direction to the gate interconnect 19.

It is preferable that a dimension (an interconnect width) in the Y direction of the gate interconnects 19 be set in such a manner that the shortest distance (for example, an interval) between the gate electrode 12 (a region provided with the gate electrode 12) and the gate electrode 19 (a region provided with the gate interconnect 19) adjacent to each other in the Y direction is equal to or greater than the distance between the gate electrodes adjacent to each other in the X direction.

In this case, the interval between the adjacent gate electrodes (for example, the smallest interval between the gate electrodes) depends on the distance between the adjacent gate electrodes, not the interconnect width of the gate electrodes.

Herein, a pitch of the gate interconnects is indicated by "F", a dimension (a maximum dimension) of the semiconductor layer 10 in the parallel direction to the substrate surface is indicated by "A", a dimension (a maximum dimension) of the gate insulating layer in the parallel direction to the substrate surface is indicated by "B", a dimension (a maximum dimension) of the gate electrode in the parallel direction to the substrate surface is indicated by "C", and a space between the gate electrodes is indicated by "D".

In this case, "F" in the memory cell array in a square lattice arrangement is expressed by "A+2×B+2×C+D".

"F" in the memory cell array in a hexagonal lattice arrangement such as that in the present embodiment is expressed by "A+2×B+2×C+√3×D/2".

As described in the above, in the DRAM according to the present embodiment, the pitch ("F") between the gate interconnects can be made smaller than that of the first embodiment.

In the present embodiment, the pattern of the bit lines may be a pattern intersecting a pattern of the gate interconnects (word lines).

For example, as shown in FIG. 5 described in the above, the bit lines BL having a zigzag plane pattern may be coupled to the plurality of semiconductor layers 10 in such a manner as to couple together the memory cells coupled to the word lines WL adjacent to each other in the Y direction.

As shown in FIG. 69, the bit lines BLb may extend in the direction that is parallel to the plane X-Y and is oblique in relation to the X direction and the Y direction. The bit lines BLb extending in the oblique direction are coupled to the plurality of memory cells MC aligned in the oblique direction in relation to the X direction and the Y direction.

A pattern of the word lines and a pattern of the bit lines may be exchanged.

The word lines (the gate interconnects 19 and the gate electrodes 12) may have a zigzag pattern, and the bit lines may have a linear pattern. The word lines may have a pattern extending in the oblique direction, and the bit lines may have a linear pattern.

The bit lines having the linear pattern can be formed relatively easily. The bit lines having a zigzag pattern can reduce a line width of the bit lines while maintaining an overlapping area with respect to the semiconductor layers and the upper electrodes of the memory cells.

The memory cells of the DRAM according to the first embodiment may be arranged in a tetragonal lattice arrangement in the plane X-Y of the memory cell array.

The DRAM according to the present embodiment achieves further improvement of characteristics and further cost reduction than the second embodiment.

As described in the above, the memory device according to the present embodiment can attain similar advantageous effects to those of the above embodiments.

(4) Forth Embodiment

A memory device and a method of manufacturing the memory device according to a fourth embodiment will be described with reference to FIG. 70 to FIG. 76.

The present embodiment is a modification example of the method of manufacturing the memory device (for example, the DRAM) according to the second embodiment.

FIG. 70, FIG. 71, FIG. 72, FIG. 74, and FIG. 76 are schematic cross-sectional views in the X direction in the method of manufacturing the DRAM according to the present embodiment.

FIG. 73 and FIG. 75 are schematic cross-sectional views in the Y direction in the method of manufacturing the DRAM according to the present embodiment.

As shown in FIG. 70, after the insulating layer 82 is formed on the cell capacitor 2, a sacrifice layer 71A is formed on the insulating layer 82. In the present embodiment, a support layer 77 is formed on the sacrifice layer 71A. A sacrifice layer 71B is formed on the support layer 77. An insulating layer 83 is formed on the sacrifice layer 71B.

A layer stack 700X including the support layer 77 is formed above the plurality of capacitors 2. The support layer 77 increases the mechanical strength of the processed layer stack 700X at the time of processing the layer stack 700X.

As the support layer 77, any of an insulating layer (for example, a silicon oxide layer), a semiconductor layer (for example, a silicon layer), and a conductive layer (for example, a metal layer) may be used as long as the layer is made from a material that can secure the etching selectivity with respect to another layer (for example, the sacrifice layers 71A, 71B, and 72, and the insulating layers 82 and 83).

Figure 71:
FIG. 71 is a schematic cross-sectional view showing a step of the method of manufacturing the memory device according to the fourth embodiment.

As shown in FIG. 71, as with the steps shown in FIG. 40 to FIG. 46 according to the second embodiment, after a recess is formed in the layer stack 700X, the sacrifice layer 72 is formed in the hole and the recess of the layer stack 700X. Then, as with the steps shown in FIG. 47 to FIG. 50, after removal and filling-back of a member between portions of the sacrifice layer 72 aligned in the Y direction, as shown in FIG. 72 and FIG. 73, as with the steps of FIG. 51 to FIG. 54 according to the second embodiment, the sacrifice layer within the layer stack 700X is selectively removed through etching. This results in the formation of a cavity 916 in the layer stack 700X.

After the sacrifice layer is removed, the insulating layer 83 is supported by the insulating layer 83Z. The insulating layer 83Z is supported by the insulating layer 82 in contact with the bottom portion of the insulating layer 83Z.

At this time, in the present embodiment, the support layer 77 remains between the insulating layers 83 adjacent to each other in the Y direction below the insulating layer 83. By this, portions of the insulating layers 83 which are adjacent to each other with each hole intervening therebetween are coupled to each other via the support layer 77.

As shown in FIG. 74 and FIG. 75, as with the steps shown in FIG. 55 to FIG. 57 according to the second embodiment, the barrier metal layer 17 and the conductive layer 12A are formed on the insulating layers 82, 83, and 83Z. In the present embodiment, the barrier metal layer 17 and the conductive layer 12A are formed on the support layer 77.

Figure 76:
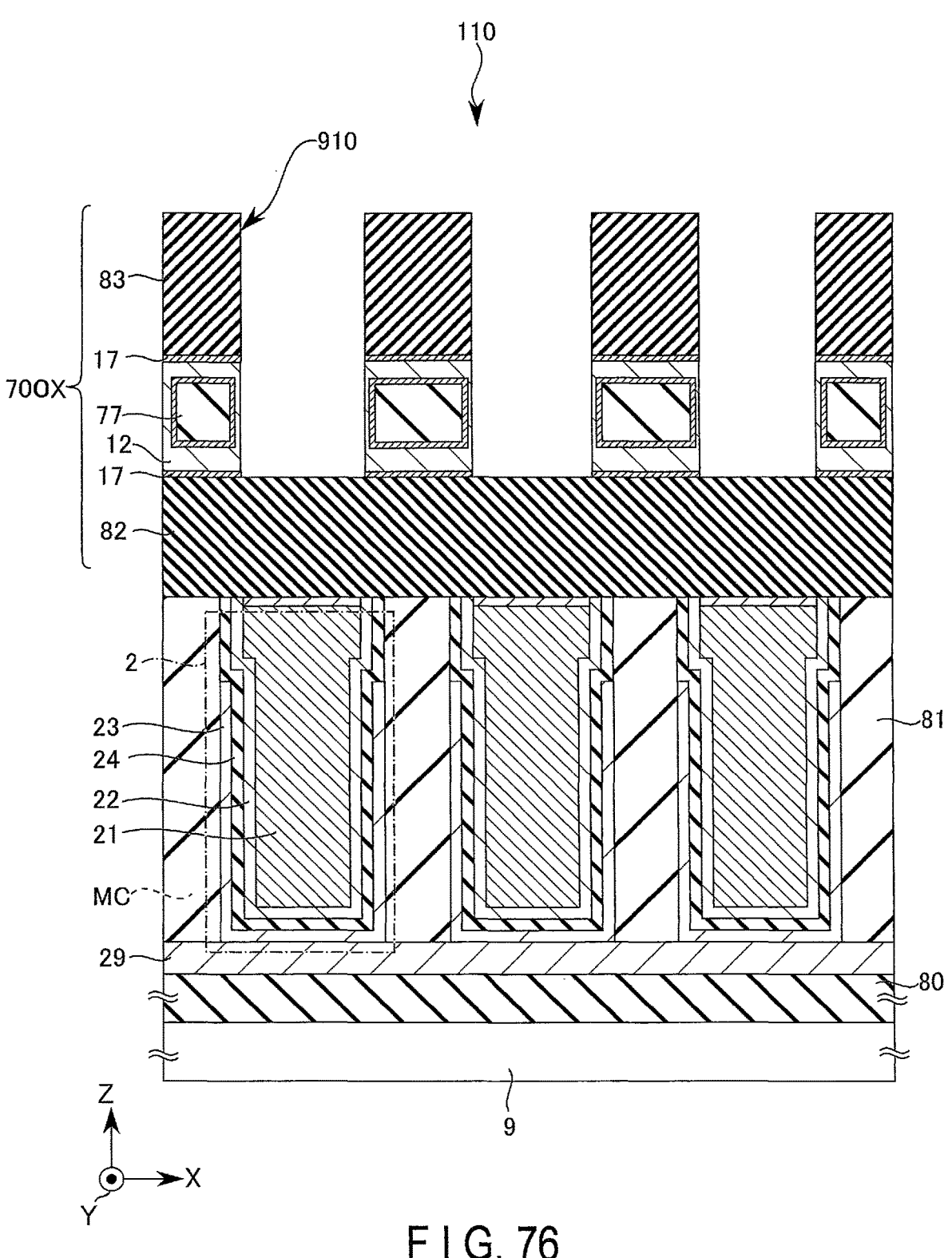
FIG. 76 is a schematic cross-sectional view showing a step of a method of manufacturing the memory device according to the fourth embodiment.

As shown in FIG. 76, as with the steps shown in FIG. 58 and FIG. 59 according to the second embodiment, the formed barrier metal layer 17 and conductive layer 12A are removed from the upper surface of the layer stack 700A and the side surface of the layer stack 700A within each hole through etching. The barrier metal layer 17 and the conductive layer 12A remain in a region in which the gate electrodes and the gate interconnects are formed.

As described in the above, a region between the support layer 77 and each of the insulating layers 82, 83, and 83Z is filled with the barrier metal layer 17 and the conductive layer 12A.

Thereafter, the cell transistors 1 of the DRAM are formed through substantially the same steps as those in FIG. 62 to FIG. 65 according to the second embodiment, without the steps for filling of cavities (for example, steps in FIG. 60 and FIG. 61).

After the sacrifice layer is removed from the region in which the gate electrodes and the gate interconnects are to be formed, a cavity is generated in the layer stack. Therefore, a member (for example, the insulating layer 83) above the cavity is supported by another member (for example, the insulating layer 83Z) adjacent to the member in the parallel direction to the substrate surface.

Therefore, in the case where the increased gate length of the cell transistors increases the thickness of the sacrifice layer within the layer stack, the aspect ratio of a member supporting a member above the cavity increases. In this case, the mechanical strength of the configuration of the layer stack decreases. This leads to a possibility that a pattern of the layer stack will be broken due to an influence of the stress of the member.

In order to reduce the interconnect capacitance between the gates, a low-dielectric film relatively low in mechanical strength may be used or an air gap may be formed within the insulating layer. In these cases, there is a possibility that a pattern of the layer stack will be broken due to the decrease in mechanical strength and the stress of a member.

In the present embodiment, the support layer 77 supports the members 83 and 83Z in the layer stack 700X after the removal of the sacrifice layer. This increases the mechanical strength of the layer stack 700X at the time of formation of the cell transistors in the present embodiment.

Therefore, the method of manufacturing the DRAM according to the present embodiment suppresses a pattern of a member from being broken at the time of formation of the memory cell array.

In the case where the opening dimension of a hole extending in the Z direction is smaller than the gate width and the gate length of the formed cell transistors, the opening of the hole may be blocked before the cavity in the layer stack is filled with the barrier metal layer and the conductive layer. In this case, the cavity may occur in the region in which the gate electrodes and the gate interconnects are formed in the layer stack. In order to fill this cavity with the conductive layer, another etching and another filling are performed.

In the present embodiment, as with the steps in FIG. 72 to FIG. 74, a cavity can be prevented from occurring after etch-back on the conductive layers 17 and 12A by controlling the film thickness of the sacrifice layers 71A and 71B and the film thickness of the support layer 77.

Therefore, in the present embodiment, filling of the conductive layer in the gate interconnect region can be performed by going through the steps one time.

Therefore, the method of manufacturing the DRAM according to the present embodiment can simplify the manufacturing steps of the DRAM.

The method of manufacturing the DRAM according to the present embodiment may be applied to the formation of the DRAM including the memory cell array in which the plurality of memory cells are arranged in a hexagonal lattice arrangement such as the DRAM in the third embodiment.

(5) Fifth Embodiment

A memory device according to a fifth embodiment will be described with reference to FIG. 77 and FIG. 78.

FIG. 77 and FIG. 78 are each a top view for describing a configuration example of the memory device (for example, the DRAM) according to the present embodiment. In the present embodiment, as a cross-sectional configuration of the memory device, any of the above embodiments is applicable. Therefore, the present embodiment omits a description for a cross-sectional configuration of the memory device.

In the DRAM shown as an example in FIG. 77, each of the bit lines BL having a zigzag pattern has portions 310A and 311A extending in the oblique direction in relation to the X direction and the Y direction.

The first portion 310A extends in the first direction in parallel to the plane X-Y. The first direction intersects the X direction and the Y direction. The second portion 311A extends in the second direction in parallel to the plane X-Y. The second direction intersects the X direction, the Y direction, and the first direction.

In each of the bit lines BL, the first portion 310A and the second portion 311A are alternately arranged in the Y direction.

For example, each of the portions 310A and 311A is provided in the memory cell array 110 in such a manner as to cross three memory cells MC.

A dimension LA of the portion 310A in the extending direction (oblique direction) of the portion 310A is longer than a dimension of a straight line coupling the centers of two semiconductor pillars 10 adjacent to each other in the oblique direction.

The dimension LA of the portion 311A in the extending direction of the portion 311A is longer than a dimension of a straight line coupling the centers of two semiconductor pillars 10 adjacent to each other in the oblique direction.

For example, the dimension LA of the portion 310A in the extending direction (oblique direction) of the portion 310A (or the dimension LA of the portion 311A in the oblique direction) is greater than a dimension of a straight line coupling the center of the semiconductor pillar 10 at one end of the three semiconductor pillars 10 aligned in the oblique direction to the center of the semiconductor pillar 10 at the other end (a length, a distance between the centers).

For example, a dimension of a straight line coupling two memory cells MC (semiconductor pillars 10) aligned in the oblique direction is set to "L1". In this case, the dimension LA has a size of "2×L1" or greater.

The dimension LA of the portion 310A may be different in size from the dimension LA of the portion 311A.

Each of the portions 310A and 311A may not be coupled to three memory cells MC depending on the position in the memory cell array 110 (for example, the end portion of the memory cell array 110).

As shown in FIG. 78, portions 310B and 311B of each bit line BL are provided in the memory cell array 110 in such a manner as to cross four memory cells MC.

A dimension LB of each of the portions 310B and 311B is greater than a dimension L1 of a straight line coupling the centers of two semiconductor pillars 10 adjacent to each other in the oblique direction.

For example, the dimension LB of the portion 310B in the extending direction (oblique direction) of the portion 310B (or the dimension LB of the portion 311B in the oblique direction) is greater than a dimension of a straight line coupling the center of the semiconductor pillar 10 at one end of the four semiconductor pillars 10 aligned in the oblique direction to the center of the semiconductor pillar 10 at the other end.

As one example, the dimension LB has a size of "3×L1" or greater.

The dimension LB of the portion 310B may be different in size from the dimension LB of the portion 311B.

Each of the portions included in the bit lines BL having a zigzag pattern may be provided in the memory cell array 110 in such a manner as to cross five or more memory cells.

In the examples shown in FIG. 77 and FIG. 78, regarding the interconnects (herein, the bit lines BL) having a zigzag pattern, a dimension in the extending direction of the portions 310A, 310B, 311A, and 311B extending in the oblique direction is set to be large.

By this, a margin of lithography of the interconnects may be improved in the present embodiment.

As a result, the memory device according to the present embodiment can be improved in terms of reliability and a manufacturing yield of a memory.

(6) Others

In the embodiments described in the above, a DRAM is used as an example of a memory device according to the present embodiment. However, the memory device according to the present embodiment may be applied to a memory device other than the DRAM (for example, a resistance change memory, a phase change memory, or a magnetoresistance memory).

For example, instead of a cell capacitor, a variable resistance element (for example, a transition-metal compound), a phase change element (for example, a chalcogenide system compound), or a magnetoresistive effect element (for example, a magnetic tunnel junction element) is provided as a memory element in a memory cell. In this case, instead of a plate-shaped plate line (plate electrode), a linear interconnect (for example, a source line, a complementary bit line) is used. The linear interconnect extends in the same direction as the extending direction of the bit lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
   a substrate;
   a first bit line provided above the substrate;
   a first transistor including:
      a first semiconductor layer provided between the substrate and the first bit line;
      a first gate electrode facing a side surface of the first semiconductor layer; and
      a first gate insulating layer provided between the first semiconductor layer and the first gate electrode;
   a first memory element provided between the first transistor and the substrate;
   a first word line including a first conductive layer coupled to the first gate electrode;
   a second transistor including:
      a second semiconductor layer provided between the substrate and the first bit line;
      a second gate electrode facing a side surface of the second semiconductor layer; and
      a second gate insulating layer provided between the second semiconductor layer and the second gate electrode;
   a second memory element provided between the second transistor and the substrate;
   a second word line that is adjacent to the first word line in a first direction in parallel to a surface of the substrate and that includes a second conductive layer coupled to the second gate electrode;

a second bit line provided above the substrate;

a third transistor including:

a third semiconductor layer provided between the substrate and the second bit line;

a third gate electrode facing a side surface of the third semiconductor layer; and a third gate insulating layer provided between the third semiconductor layer and the third gate electrode; and a third memory element provided between the third transistor and the substrate, wherein the second semiconductor layer is adjacent to the first semiconductor layer in a second direction that is in parallel to the surface of the substrate and intersects the first direction, and the second transistor is provided at a position different from a position of the first transistor and a position of the third transistor in the first direction and is provided between the first transistor and the third transistor in a third direction that is in parallel to the surface of the substrate, intersects the first and second directions, and the first word line extends in the third direction.

2. The memory device according to claim 1, wherein the second semiconductor layer is adjacent to the first conductive layer in the first direction.

3. The memory device according to claim 1, wherein the first semiconductor layer includes an oxide semiconductor layer.

4. The memory device according to claim 1, wherein the first conductive layer has a first dimension in the first direction, the first semiconductor layer has a second dimension in the first direction, the first gate electrode has a third dimension in the first direction, the first gate insulating layer has a fourth dimension in the first direction, and the first dimension is smaller than a sum of the second dimension, the third dimension, and the fourth dimension.

5. The memory device according to claim 1, wherein the third gate electrode is coupled to the first gate electrode with the first conductive layer intervening therebetween, the first conductive layer has a first dimension in the first direction, the first semiconductor layer has a second dimension in the first direction, the first gate electrode has a third dimension in the first direction, the first gate insulating layer has a fourth dimension in the first direction, and the first dimension is smaller than a sum of the second dimension, the third dimension, and the fourth dimension.

6. The memory device according to claim 1, wherein the first memory element includes:

a first electrode provided between the first semiconductor layer and the substrate;

a second electrode facing a side surface of the first electrode; and an insulating layer provided between the first electrode and the second electrode.

7. The memory device according to claim 1, wherein the first semiconductor layer includes:

a first source/drain region;

a second source/drain region provided above the first source/drain region; and a channel region provided between the first source/drain region and the second source/drain region, and the first gate electrode covers a first surface of the channel region with the first gate insulating layer intervening therebetween.

8. The memory device according to claim 1, further comprising a first circuit provided on the substrate below the first memory element.

9. The memory device according to claim 1, wherein the first bit line includes:

a first portion extending in the second direction; and a second portion extending in a third direction that is in parallel to the surface of the substrate and that intersects the second direction.

10. The memory device according to claim 9, wherein a fifth dimension of the first portion in the second direction is twice or more greater than a six dimension in the second direction that couples a center of the first semiconductor layer and a center of the second semiconductor layer.

11. The memory device according to claim 1, wherein the third transistor is adjacent to the first transistor in the third direction.

* * * * *